United States Patent
Sasaki

(10) Patent No.: US 9,513,309 B2
(45) Date of Patent: Dec. 6, 2016

(54) INERTIA SENSOR WITH SWITCHING ELEMENTS

(71) Applicant: Panasonic Intellectual Property Management Co., Ltd., Osaka (JP)

(72) Inventor: Takeshi Sasaki, Fukui (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 48 days.

(21) Appl. No.: 14/655,297

(22) PCT Filed: Jan. 17, 2014

(86) PCT No.: PCT/JP2014/000209
§ 371 (c)(1),
(2) Date: Jun. 24, 2015

(87) PCT Pub. No.: WO2014/122887
PCT Pub. Date: Aug. 14, 2014

(65) Prior Publication Data
US 2015/0338432 A1  Nov. 26, 2015

(30) Foreign Application Priority Data
Feb. 8, 2013 (JP) .................................. 2013-022884

(51) Int. Cl.
*G01C 19/00* (2013.01)
*G01P 15/097* (2006.01)
(Continued)

(52) U.S. Cl.
CPC ......... *G01P 15/097* (2013.01); *G01C 19/5776* (2013.01); *G01P 15/0802* (2013.01); *G01P 15/0888* (2013.01); *H01L 41/1132* (2013.01)

(58) Field of Classification Search
CPC ................ G01P 15/097; G01P 15/0888; G01C 19/5776; H01L 41/1132
See application file for complete search history.

(56) References Cited

U.S. PATENT DOCUMENTS 5,434,800 A * 7/1995 Davis .................... F02P 7/0675
324/172
5,986,497 A * 11/1999 Tsugai .................... G01D 5/24
327/554

(Continued)

FOREIGN PATENT DOCUMENTS

JP   2000-097761 A   4/2000
JP   2008-206134 A   9/2008
(Continued)

OTHER PUBLICATIONS

International Search Report issued in PCT/JP2014/000209, dated Feb. 10, 2014, with English translation.

*Primary Examiner* — Harshad R Patel
*Assistant Examiner* — Samir M Shah
(74) *Attorney, Agent, or Firm* — McDermott Will & Emery LLP

(57) ABSTRACT

An inertia sensor includes a sensor element including first and second sensing parts configured to output first and second sensing signals, an amplifier having an input port to which the first sensing signal or the second sensing signal is selectively input, a feedback circuit unit configured to be connected between the input port and the output port of the amplifier to be connected in parallel to the amplifier, a first switching element provided between the first sensing part and the amplifier, a second switching element provided between the first sensing part and the feedback circuit unit, a third switching element provided between the second sensing part and the amplifier, and a fourth switching element provided between the second sensing part and the feedback circuit unit. This inertia sensor, stabilizes output characteristics of the amplifier circuit, and suppresses generation of unwanted signals.

17 Claims, 31 Drawing Sheets

(51) Int. Cl.
*G01P 15/08* (2006.01)
*G01C 19/5776* (2012.01)
*H01L 41/113* (2006.01)

(56) References Cited

U.S. PATENT DOCUMENTS

| | | | | |
|---|---|---|---|---|
| 6,298,709 B1* | 10/2001 | Artzner | ............... | G01D 3/08 |
| | | | | 73/1.38 |
| 6,553,835 B1* | 4/2003 | Hobbs | ............... | G01C 19/5607 |
| | | | | 73/504.16 |
| 6,593,865 B2* | 7/2003 | Nestler | ............... | H03M 3/474 |
| | | | | 341/141 |
| 7,511,648 B2* | 3/2009 | Trifonov | ............... | H03M 1/145 |
| | | | | 341/118 |
| 7,576,670 B2* | 8/2009 | Clara | ............... | H03M 3/394 |
| | | | | 341/143 |
| 7,898,448 B2* | 3/2011 | Murakami | ............... | G01C 19/56 |
| | | | | 341/141 |
| 8,150,657 B2* | 4/2012 | Yamashita | ............... | G01D 3/028 |
| | | | | 702/187 |
| 8,347,715 B2* | 1/2013 | Prandi | ............... | G01C 19/5726 |
| | | | | 73/504.12 |
| 8,451,066 B2* | 5/2013 | Murakami | ............... | G01C 19/56 |
| | | | | 331/1 A |
| 8,599,054 B2* | 12/2013 | Carlsson | ............... | H03M 3/434 |
| | | | | 341/143 |
| 8,714,012 B2* | 5/2014 | Caminada | ............... | G01C 19/5762 |
| | | | | 73/504.12 |
| 9,148,158 B2* | 9/2015 | Sasaki | ............... | G01D 3/028 |
| 9,435,647 B2* | 9/2016 | Murakami | ............... | G01C 19/5776 |
| 2002/0170356 A1* | 11/2002 | Yamashita | ............... | G01P 15/097 |
| | | | | 73/514.34 |
| 2004/0196617 A1* | 10/2004 | Mori | ............... | G01C 19/5726 |
| | | | | 361/280 |
| 2005/0178202 A1* | 8/2005 | Uehara | ............... | G01C 19/5607 |
| | | | | 73/497 |
| 2005/0204815 A1* | 9/2005 | Mase | ............... | G01C 19/5719 |
| | | | | 73/504.12 |
| 2006/0032309 A1* | 2/2006 | Caminada | ............... | G01C 19/5726 |
| | | | | 73/514.18 |
| 2009/0271142 A1 | 10/2009 | Yamashita et al. | | |
| 2010/0013688 A1 | 1/2010 | Murakami et al. | | |
| 2010/0206069 A1* | 8/2010 | Murakami | ............... | G01C 19/56 |
| | | | | 73/488 |
| 2010/0307243 A1* | 12/2010 | Prandi | ............... | G01C 19/5726 |
| | | | | 73/504.12 |
| 2011/0197675 A1* | 8/2011 | Caminada | ............... | G01C 19/5762 |
| | | | | 73/504.12 |
| 2012/0191398 A1 | 7/2012 | Murakami et al. | | |
| 2014/0000364 A1* | 1/2014 | Choi | ............... | H03M 3/39 |
| | | | | 73/488 |

FOREIGN PATENT DOCUMENTS

| | | |
|---|---|---|
| JP | 2011-085417 A | 4/2011 |
| JP | 2012-042261 A | 3/2012 |
| WO | 2008-032741 A1 | 3/2008 |

* cited by examiner

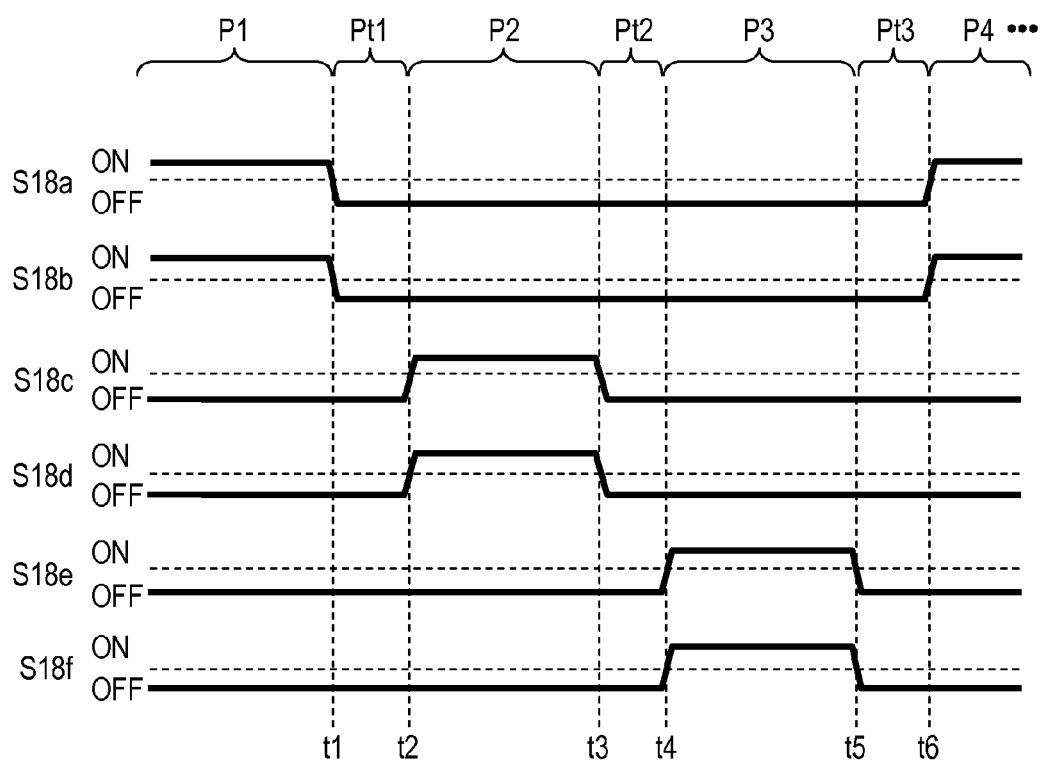

INERTIA SENSOR WITH SWITCHING ELEMENTS

RELATED APPLICATIONS

This application is the U.S. National Phase under 35 U.S.C. §371 of International Application No. PCT/JP2014/000209, filed on Jan. 17, 2014, which in turn claims the benefit of Japanese Application No. 2013-022884, filed on Feb. 8, 2013, the disclosures of which Applications are incorporated by reference herein.

TECHNICAL FIELD

The present disclosure relates to an inertia sensor to be used for automobiles, aircrafts, ships, robots, other electronic devices, and the like.

BACKGROUND ART

FIG. 36A is a block diagram of conventional inertia sensor 1. Inertia sensor 1 includes three piezoelectric elements 2 for detecting an inertial force, switching element 3 implemented by field-effect transistors, and amplifier circuit 4 implemented by an operational amplifier. In order to detect inertial forces in three directions perpendicular to each other, inertia sensor 1 extracts outputs from three piezoelectric elements 2 as a single output by switching the switching elements 3 between piezoelectric elements 2 and amplifier circuit 4. As described above, switching elements 3 are used to sequentially switch and extract the outputs from piezoelectric elements 2, and constitute a detection circuit in which multi-axial detection can be performed with single amplifier circuit 4.

In inertia sensor 1, currents output from piezoelectric element 2 become small as inertia sensor 1 has had a small size. In order to detect intended signals, based on such small output currents, amplifier circuit 4 has an amplification performance to amplify intended signals at a gain as large as possible while producing small noises.

FIG. 36B is a block diagram of amplifier circuit 4. In order to obtain the above-described amplification performance, amplifier circuit 4 converts a current to a voltage and has a frequency characteristic of a low-pass filter.

Amplifier circuit 4 has input terminal 5, input terminal 6 connected to a reference potential, and output terminal 4a which is connected to input terminal 5 via feedback capacitor 7 and feedback resistor 8 to constitute feedback loop 9.

A conventional inertia sensor similar to inertia sensor 1 is disclosed in PTL 1.

When the output from inertia sensor 1 which has a switching structure with switching element 3 is amplified, output characteristics or an S/N ratio may deteriorate in inertia sensor 1 shown in FIG. 36A.

CITATION LIST

Patent Literature

PTL 1: Japanese Patent Laid-Open Publication No. 2000-97761

SUMMARY

An inertia sensor includes a sensor element including first and second sensing parts configured to output first and second sensing signals, an amplifier having an input port to which the first sensing signal or the second sensing signal is selectively input, a feedback circuit unit configured to be connected between the input port and the output port of the amplifier to be connected in parallel to the amplifier, a first switching element provided between the first sensing part and the amplifier, a second switching element provided between the first sensing part and the feedback circuit unit, a third switching element provided between the second sensing part and the amplifier, and a fourth switching element provided between the second sensing part and the feedback circuit unit.

This inertia sensor stabilizes output characteristics of the amplifier circuit, and suppresses generation of unwanted signals.

BRIEF DESCRIPTION OF DRAWINGS

FIG. 15 shows signal waveforms of the amplifier circuit shown in FIG. 12.

DETAIL DESCRIPTION OF PREFERRED EMBODIMENTS

Exemplary Embodiment 1

Figure 1:
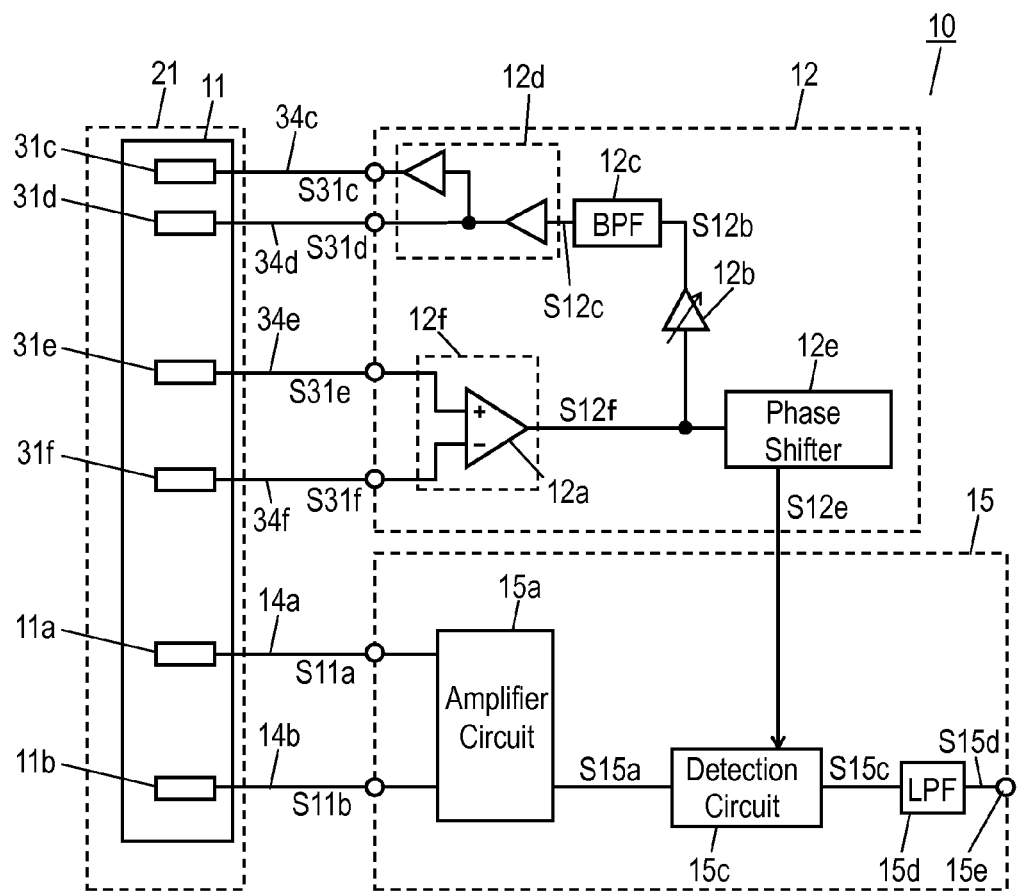
FIG. 1 is a schematic view of an inertia sensor in accordance with Exemplary Embodiment 1 of the present disclosure.

FIG. 1 is a schematic view of inertia sensor 10 in accordance with Exemplary Embodiment 1 of the present disclosure. Inertia sensor 10 in accordance with Embodiment 1 is an angular velocity sensor configured to detect an angular velocity, which is an inertial force. Inertia sensor 10 is includes sensor element 21, drive circuit 12 configured to drive sensor element 21, and detection circuit 15 configured to detect an angular velocity applied to sensor element 21.

Sensor element 21 includes vibrator 11, sensing parts 11a and 11b, drive parts 31c and 31d, and monitor parts 31e and 31f. Sensing parts 11a and 11b, drive parts 31c and 31d, and monitor parts 31e and 31f are disposed on vibrator 11. Drive signals S31c and S31d are input to drive parts 31c and 31d, respectively, from drive circuit 12 to cause vibrator 11 to vibrate to generate a driving vibration. Monitor parts 31e and 31f output, to drive circuit 12, monitor signals S31e and S31f generated in response to the driving vibration of vibrator 11. Sensing parts 11a and 11b output, to detection circuit 15, sensing signals S11a and S11b generated according to the angular velocity applied to vibrator 11. Signal wirings 14a and 14b, signal wirings 34c and 34d, and signal wirings 34e and 34f electrically connect sensing parts 11a and 11b, drive parts 31c and 31d, monitor parts 31e and 31f to drive circuit 12 and detection circuit 15.

Drive circuit 12 generates drive signals S31c and S31d based on monitor signals S31e and S31f input from monitor parts 31e and 31f via signal wirings 34e and 34f, and outputs drive signals S31c and S31d to drive parts 31c and 31d disposed on vibrator 11 via signal wirings 34c and 34d, respectively.

Detection circuit 15 includes amplifier circuit 15a, detection circuit 15c, low-pass filter (LPF) 15d, and output terminal 15e. Amplifier circuit 15a converts current values, which are sensing signals S11a and S11b from sensing parts 11a and 11b, into voltage values, and outputs the voltage values as sensing signal S15a. Detection circuit 15c synchronously detects sensing signal S15a from amplifier circuit 15a with using monitor signal S12e, thereby outputting detection signal S15c. Low-pass filter 15d smooths detection signal S15c output from detection circuit 15c.

Figure 2:
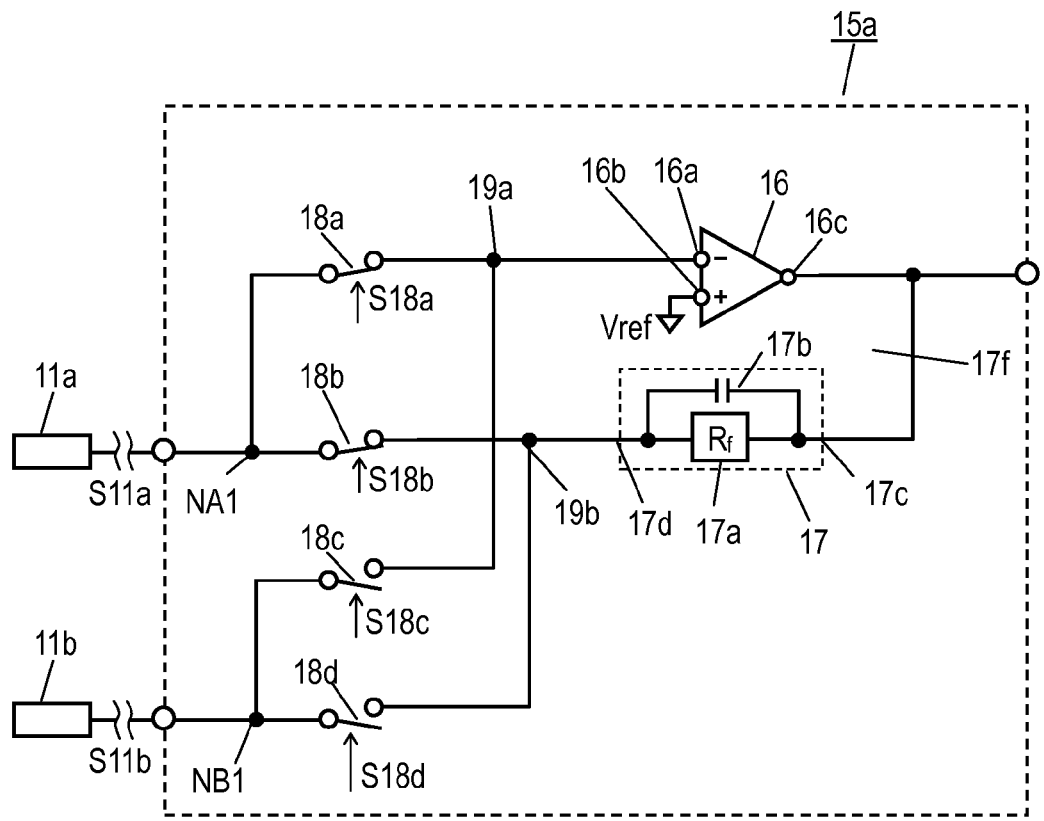
FIG. 2 is a circuit block diagram of an amplifier circuit of the inertia sensor in accordance with Embodiment 1.

FIG. 2 is a circuit block diagram of amplifier circuit 15a. Amplifier circuit 15a includes amplifier 16 configured to selectively amplify sensing signals S11a and S11b output from sensing parts 11a and 11b, feedback circuit unit 17 connected in parallel to amplifier 16, switching element 18a provided between sensing part 11a and amplifier 16, switching element 18b provided between sensing part 11a and feedback circuit unit 17, switching element 18c provided between sensing part 11b and amplifier 16, and switching element 18d between sensing part 11b and feedback circuit unit 17. The switching of switching elements 18a to 18d can cause amplifier 16 to selectively amplify sensing signals S11a and S11b from sensing parts 11a and 11b and to output the amplified signal as sensing signal S15a. For example, in the case that inertia sensor 10 is an angular velocity sensor which detects multi-axial angular velocities, amplifier 16 selectively amplifies a sensing signal due to angular velocity about an X-axis and a sensing signal due to angular velocity about a Y-axis. Feedback circuit unit 17 is connected between input port 16a and output port 16c of amplifier 16 via switching elements 18a to 18d, thus constituting feedback loop 17f.

In this configuration, switching elements 18a to 18d disposed in feedback loop 17f of amplifier circuit 15a can reduce fluctuation of the output voltage of amplifier circuit 15a associated with fluctuation of ON-resistance values which are resistance values of switching elements 18a to 18d which are turned on, and as a result, can improve an S/N ratio of inertia sensor 10.

A configuration of amplifier circuit 15a will detailed below.

Amplifier 16 has input port 16a which is an inverting input terminal, input port 16b which is a non-inverting input terminal, and output port 16c. Input port 16a is connected to sensing part 11a via switching element 18a, and is connected to sensing part 11b via switching element 18c. Input port 16b is connected to a reference potential Vref.

Feedback circuit unit 17 is connected to sensing part 11a via switching element 18b, and is connected to sensing part 11b via switching element 18d. Feedback circuit unit 17 has end 17c connected to output port 16c of amplifier 16, and has end 17d connected at node 19a to switching elements 18a and 18c.

Feedback circuit unit 17 includes feedback resistor 17a connected between end 17c and end 17d and feedback capacitor 17b connected in parallel to feedback resistor 17a. End 17c of feedback circuit unit 17 is connected to output port 16c of amplifier 16 while end 17d of feedback circuit unit 17 is connected to input port 16a of amplifier 16 via switching elements 18a to 18d. Feedback circuit unit 17 is thus connected in parallel to amplifier 16. Feedback circuit unit 17 is parallel connected to amplifier 16 to function as a low-pass filter having a cutoff frequency fc. The cutoff frequency fc is expressed by Formula 1 with a capacitance value $C_f$ of feedback capacitor 17b and a resistance value $R_f$ of feedback resistor 17a.

$$f_c = \frac{1}{2\pi C_f R_f} \quad \text{[Formula 1]}$$

The capacitance value $C_f$ of feedback capacitor 17b and the resistance value $R_f$ of feedback resistor 17a are determined to allow the cutoff frequency fc to be sufficiently larger than a resonance frequency of vibrator 11. This configuration allows amplifier circuit 15a to functions as an I/V converting circuit for converting a current, which is the sensing signal output from sensing parts 11a and 11b, into a voltage.

As described above, amplifier 16, feedback circuit unit 17, and sensing parts 11a and 11b are configured such that the switching of switching elements 18a to 18d can switch between a state in which amplifier 16 amplifies the sensing signal from sensing part 11a and a state in which amplifier 16 amplifies the sensing signal from sensing part 11b. Specifically, a state in which only switching elements 18a and 18b are turned on and switching elements 18c and 18d are turned off is switched to a state in which only switching elements 18c and 18d are turned on and switching elements 18a and 18b are turned off. This switching causes a state in which amplifier 16 amplifies the sensing signal from sensing part 11a to be switched to the state in which amplifier 16 amplifies the sensing signal from sensing part 11b.

Figure 36A:
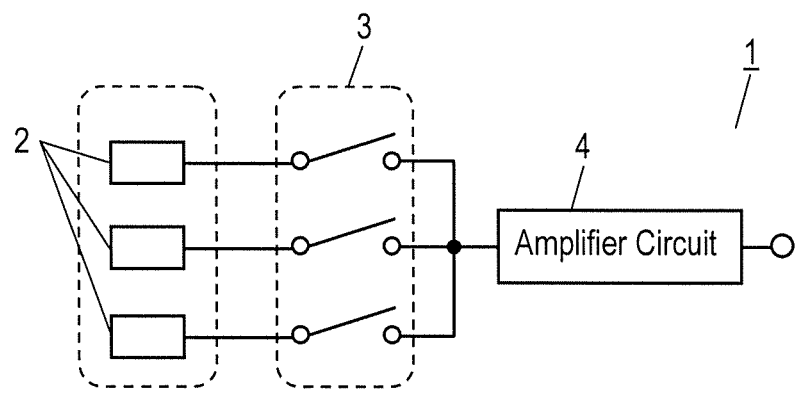
FIG. 36A is a block diagram of a conventional inertia sensor.
Figure 36B:
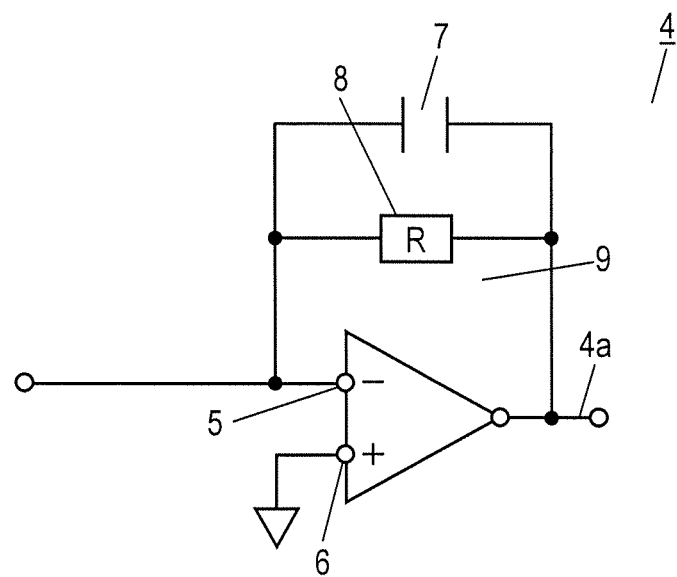
FIG. 36B is a circuit block diagram of an amplifier circuit of the conventional inertia sensor.

In conventional inertia sensor 1 shown in FIGS. 36A and 36B which has a switching structure with using switching element 3 output characteristics or an S/N ratio of a sensor deteriorates. This is because an ON-resistance value of switching element 3 drifts along with, for example, fluctuation in a temperature environment in which inertia sensor 1 is used, and therefore an output of amplifier circuit 4 fluctuates.

In more detail, the relationship, in amplifier circuit 4, between current $I_{in}$ input to switching element 3 from piezoelectric element 2 and output voltage $V_{out}$ of amplifier circuit 4 can be expressed as Formula 2 with an ON-resistance value $R_{SW}$ of switching element 3 and a capacitance value C of piezoelectric element 2.

$$V_{out} = -\frac{1}{1+j\omega C_f R_f} \cdot \frac{1}{1+j\omega C R_{SW}} I_{in} \quad \text{[Formula 2]}$$

Therefore, the relationship between a phase $\phi(I_{in})$ of the current $I_{in}$ and a phase $\phi(V_{out})$ of the voltage $V_{out}$ is expressed as Formula 3.

$$\phi(V_{out})=\phi(I_{in})+180-\arctan(\omega C_f R_f)-\arctan(\omega C R_{SW}) \quad \text{[Formula 3]}$$

As shown in Formula 3, the phase of the voltage $V_{out}$ is influenced by the ON-resistance value $R_{SW}$ of switching element 3. Therefore, when the ON-resistance value $R_{SW}$ of switching element 3 fluctuates due to change in the temperature of the switching element or change in a voltage for causing switching element 3 to operate, the phase of the voltage $V_{out}$ output from amplifier circuit 4 fluctuates. For this reason, the output of the inertia sensor fluctuates, or unwanted signals are generated due to this phase shift, and as a result the S/N ratio of inertia sensor 1 deteriorates.

In amplifier circuit 15a shown in FIG. 2 of inertia sensor 10 in accordance with Embodiment 1 shown in FIG. 1, switching elements 18a and 18b are connected to sensing part 11a at node NA1, and switching elements 18c and 18d are connected to sensing part 11a at node NB1. Input port 16a of amplifier 16 is connected to switching elements 18a and 18c at node 19a. End 17d of feedback circuit unit 17 is connected to switching elements 18b and 18d at node 19b. In other words, switching element 18a is connected between node NA1 and node 19a. Switching element 18b is connected between node NA1 and node 19b. Switching element 18c is connected between node NB1 and node 19a. Switching element 18d is connected between node NB1 and node 19b. Switching elements 18a and 18b are disposed in feedback loop 17f formed between node NA1 and amplifier 16 while switching elements 18c and 18d are disposed in feedback loop 17f formed between node NB1 and amplifier 16. This configuration can reduce the fluctuation of the output voltage of amplifier circuit 15a associated with the fluctuation of the ON-resistance values of switching elements 18a to 18d. This operation will be detailed below. In the following description, switching elements 18a and 18b are turned on, and switching elements 18c and 18d are turned off; thus, sensing signal S11a from sensing part 11a out of sensing signals S11a and S11b from sensing parts 11a and 11b is selectively input to input port 16a of amplifier 16 to be amplified.

The relationship among (i) an input potential $V_{in}$ which is a potential of input port 16a of amplifier 16 connected to sensing part 11a, (ii) an output potential $V_0$, which is a potential of output port 16c of amplifier 16, and (iii) an input current $I_{in}$ input to amplifier circuit 15a from sensing part 11a is expressed as Formula 4 with the ON-resistance value $R_{SW}$ of switching element 18b, resistance value $R_f$ of feedback resistor 17a, and capacitance value $C_f$ of feedback capacitor 17b.

$$V_{in} - V_0 = \left(R_{SW} + \frac{R_f}{1+j\omega C_f R_f}\right)I_{in} \quad \text{[Formula 4]}$$

Since almost no current flows via switching element 18a, the input potential $V_{in}$ is equal to reference potential Vref. When the reference potential Vref is set to 0 V, input potential $V_{in}$ is 0, so that a phase $\phi(V_0)$ of output potential $V_0$ is expressed as Formula 5.

$$\phi(V_0) = \phi(I_{in}) + 180 - \arctan(\omega C_f R_f) + \arctan\left(\frac{\omega C_f R_f R_{SW}}{R_{SW}+R_f}\right) \quad \text{[Formula 5]}$$

Since resistance value $R_f$ of feedback resistor 17a is about several hundred times of ON-resistance value $R_{SW}$ of switching element 18a, Formula 5 can be approximated to Formula 6.

$$\phi(V_0)=\phi(I_{in})+180-\arctan(\omega C_f R_f)+\arctan(\omega C_f R_{SW}) \quad \text{[Formula 6]}$$

Being concerned with the fourth term on the right side of Formula 3 related to amplifier circuit 4 in conventional inertia sensor 1 shown in FIG. 36B and the fourth term on the right side of Formula 6, capacitance value $C_f$ of feedback capacitor 17b of inertia sensor 10 in accordance with Embodiment 1 is smaller than to the capacitance value C of piezoelectric element 2 of conventional inertia sensor 1. Therefore, amplifier 16 of inertia sensor 10 in accordance with Embodiment 1 exhibits a smaller phase shift. As a result, even if the ON-resistance value $R_{SW}$ changes due to, e.g. a change in the temperature of switching element 18a or a fluctuation of a power source voltage, inertia sensor 10 can reduce the phase shift of output voltage $V_{out}$ with respect to the current $I_{in}$ input from the element, hence suppressing the generation of the output change of the sensor.

Amplifier circuit 15a in accordance with Embodiment 1 is not limited to the configuration shown in FIG. 2. For example, a part of the configuration can be added or removed.

Switching elements 18a to 18d are implemented by, for example, semiconductor elements, such as CMOS transistors.

Figure 3:
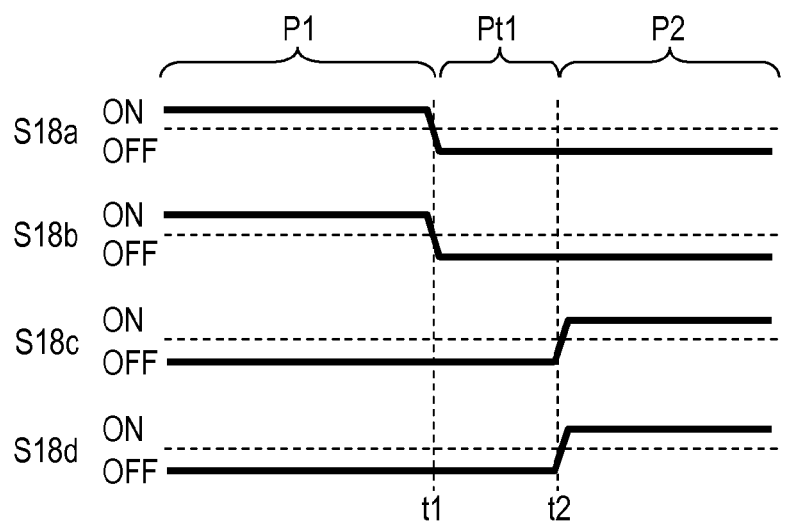
FIG. 3 shows signal waveforms of the amplifier circuit shown in FIG. 2.

An operation of amplifier circuit 15a will be described below. FIG. 3 shows signal waveforms of amplifier circuit 15a and illustrates control signals S18a to S18d supplied to switching elements 18a to 18d, respectively. In FIG. 3, the horizontal axis represents time, and the vertical axis represents levels of control signal S18a to S18d. The levels of control signals S18a to S18d consist of a level "ON" to turn on switching elements 18a to 18d and a level "OFF" to turn off switching elements 18a to 18d, respectively.

Amplifier 16 selectively amplifies the sensing signals from sensing parts 11a and 11b in durations P1 and P2, respectively.

In duration P1, switching elements 18a and 18b continue being turned on, and switching elements 18c and 18d continue being turned off. In this state, sensing signal S11a output from sensing part 11a of sensing parts 11a and 11b is selectively input to input port 16a of amplifier 16 and is amplified, but sensing signal S11b output from sensing part 11b is not input to input port 16a of amplifier 16.

In order to switch a state in which sensing signal S11a from sensing part 11a is input to input port 16a of amplifier 16 and is amplified in duration P1 to a state in which sensing signal S11b from sensing part 11b is input to input port 16a of amplifier 16 and is amplified in duration P2, switching elements 18a and 18b which have been turned on are turned off at time point t1 at which duration P1 ends. This operation terminates the input of sensing signal S11a from sensing part 11a to input port 16a of amplifier 16, and stops the state of amplifying sensing signal S11a. Subsequently, switching elements 18c and 18d which have been turned off are turned on at time point t2 at which duration P2 starts. This operation allows sensing signal S11b from sensing part 11b to be selectively input to input port 16a of amplifier 16 and amplified at duration P2. In other words, in duration Pt1 from time point t1 to time point t2, amplifier circuit 15a is switched from the state of amplifying sensing signal S11a from sensing part 11a to the state of amplifying sensing signal S11b from sensing part 11b. As described above, sensing signals S11a and S11b can be switched while switching elements 18a to 18d are disposed in feedback loop 17f of amplifier circuit 15a.

This configuration in which switching elements 18a to 18d are disposed in feedback loop 17f reduces the phase shift of a current associated with the fluctuation of the ON-resistance values of switching elements 18a to 18d, hence stabilizing output characteristics of amplifier circuit 15a and suppressing generation of unwanted signals.

Although switching elements 18a to 18d are switched in an order of time points t1 and t2 in accordance with Embodiment 1, the order of switching is not limited to this order. For example, switching elements 18a to 18d may be switched simultaneously at time point t1. Specifically, at time point t1, switching elements 18a and 18b which have been turned on may be turned off, and simultaneously, switching elements 18c and 18d which have been turned off may be turned on. Alternatively, at time point t1, switching elements 18c and 18d which have been turned off may be turned on, and at time point t2, switching elements 18a and 18b which have been turned on may be turned off. This configuration performs the switching operation without opening feedback loop 17f of amplifier circuit 15a in duration Pt1.

Inertia sensor 10 in accordance with Embodiment 1 detects an angular velocity as an inertial force; however, the inertial force to be detected is not limited to an angular velocity. For example, inertia sensor 10 may detect other inertial forces, such as accelerations in different axis directions in an XYZ orthogonal coordinate system defined by an X-axis, a Y-axis, and a Z-axis which are perpendicular to each other.

All of sensing signals S11a and S11b correspond to angular velocities; however, inertia sensor 10 in accordance with Embodiment 1 is not limited to this. Specifically, sensing signal S11a from sensing part 11a may correspond to an angular velocity, and sensing signal S11b from sensing part 11b may be a signal corresponding to another inertial force, such as acceleration. In this case, sensor element 21 may employ a composite sensor element which can detect acceleration and an angular velocity. Such a composite sensor element is disclosed in, for example, Japanese Patent Laid-Open Publication No. 2008-23070. Alternatively, sensor element 21 may include a sensor element for detecting acceleration and a sensor element for detecting angular velocity as separate bodies. Such a sensor element is disclosed in, for example, Japanese Patent Laid-Open Publication No. 2010-24061.

Figure 4:
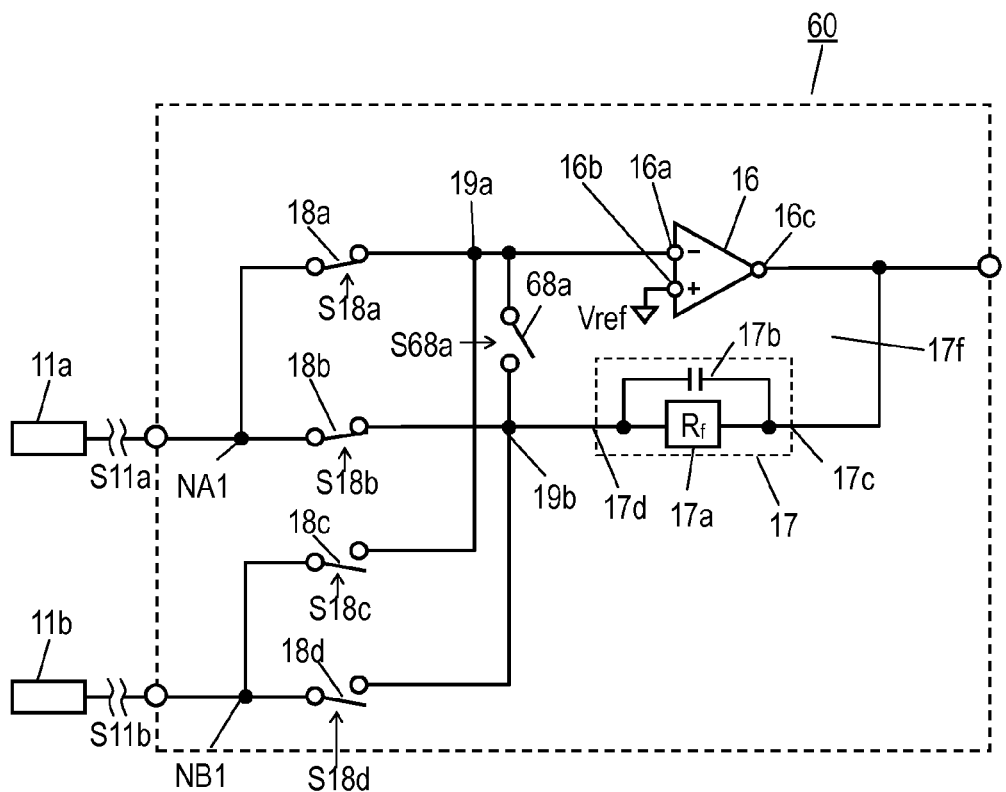
FIG. 4 is a circuit block diagram of another amplifier circuit of the inertia sensor in accordance with Embodiment 1.

FIG. 4 is circuit block diagram of another amplifier circuit 60 of inertia sensor 10 in accordance with Embodiment 1. In FIG. 4, components identical to those of amplifier circuit 15a shown in FIG. 2 are denoted by the same reference numerals. Amplifier circuit 60 includes amplifier circuit 15a shown in FIG. 2 and further includes switching element 68a.

As shown in FIG. 4, switching elements 18a and 18c are connected to input port 16a of amplifier 16 at node 19a, and switching elements 18b and 18d are connected to end 17d of feedback circuit unit 17 at node 19b. Switching element 68a is connected between node 19a and node 19b.

Figure 5:
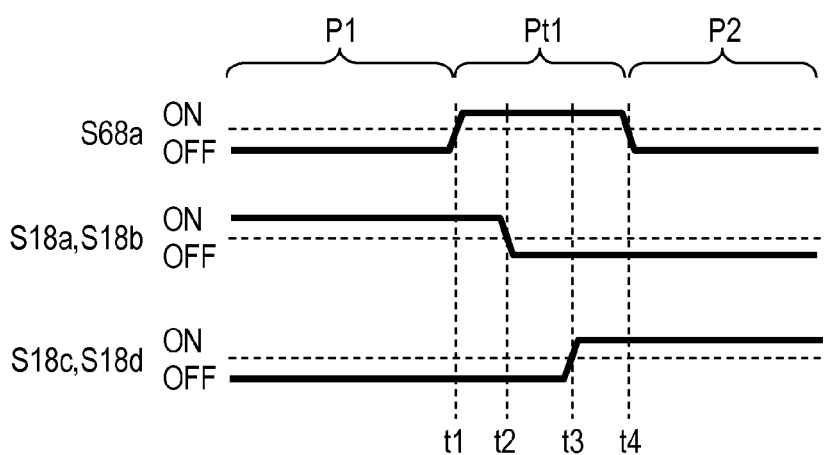
FIG. 5 shows signal waveforms of the amplifier circuit shown in FIG. 4.

An operation of amplifier circuit 60 will be described below. FIG. 5 shows signal waveforms of amplifier circuit 60 and illustrates control signals S18a to S18d and S68a supplied to switching elements 18a to 18d and 68a, respectively. In FIG. 5, the horizontal axis represents time, and the vertical axis represents levels of control signal S18a to S18d and S68a. The levels of control signal S18a to S18d and S68a consist of a level "ON" to turn on switching elements 18a to 18d and 68a and of a level "OFF" to turn off switching elements 18a to 18d and 68a, respectively.

Amplifier 16 selectively amplifies sensing signals S11a and S11b from sensing parts 11a and 11b in durations P1 and P2, respectively.

In duration P1, switching elements 18a and 18b continue being turned on, and switching elements 18c, 18d, and 68a continue being turned off. In this state, sensing signal S11a output from sensing part 11a of sensing parts 11a and 11b is selectively input to input port 16a of amplifier 16 and is amplified, but sensing signal S11b is not input to input port 16a. In other words, in this state, amplifier 16 selectively amplifies sensing signal S11a.

In order to switch a state in which sensing signal S11a from sensing part 11a is input to input port 16a of amplifier 16 and is amplified in duration P1 to a state in which sensing signal S11b from sensing part 11b is input to input port 16a and is amplified in duration P2, switching element 68a which has been turned off is first turned on at time point t1 at which duration P1 ends. Subsequently, switching elements 18a and 18b which have been turned on are turned off at time point t2. This operation terminates the input of sensing signal S11a from sensing part 11a to input port 16a, and stops the amplifying of sensing signal S11a. Subsequently, switching elements 18c and 18d which have been turned off are turned on at time point t3, and then, switching element 68a which has been turned on is turned off at time point t4 at which duration P2 starts. This operation allows sensing signal S11b from sensing part 11b to be selectively input to input port 16a of amplifier 16 and amplified. In other words, amplifier circuit 60 is switched, in duration Pt1 from time point t1 to time point t4, from the state of amplifying sensing signal S11a from sensing part 11a to the state of amplifying sensing signal S11b from sensing part 11b. The configuration in which switching elements 18a to 18d are disposed in feedback loop 17f reduces the phase shift of a current associated with the fluctuation of the ON-resistance values of switching elements 18a to 18d, thus stabilizing characteristics of amplifier circuit 60. Further, in amplifier circuit 60, the switching operation can be performed without opening feedback loop 17f in duration Pt1. If feedback loop 17f opens, the output may change rapidly and prevent the inertial force from being detected accurately until the change becomes small. Amplifier circuit 60 can reduce the duration in which output accuracy is reduced.

Figure 6:
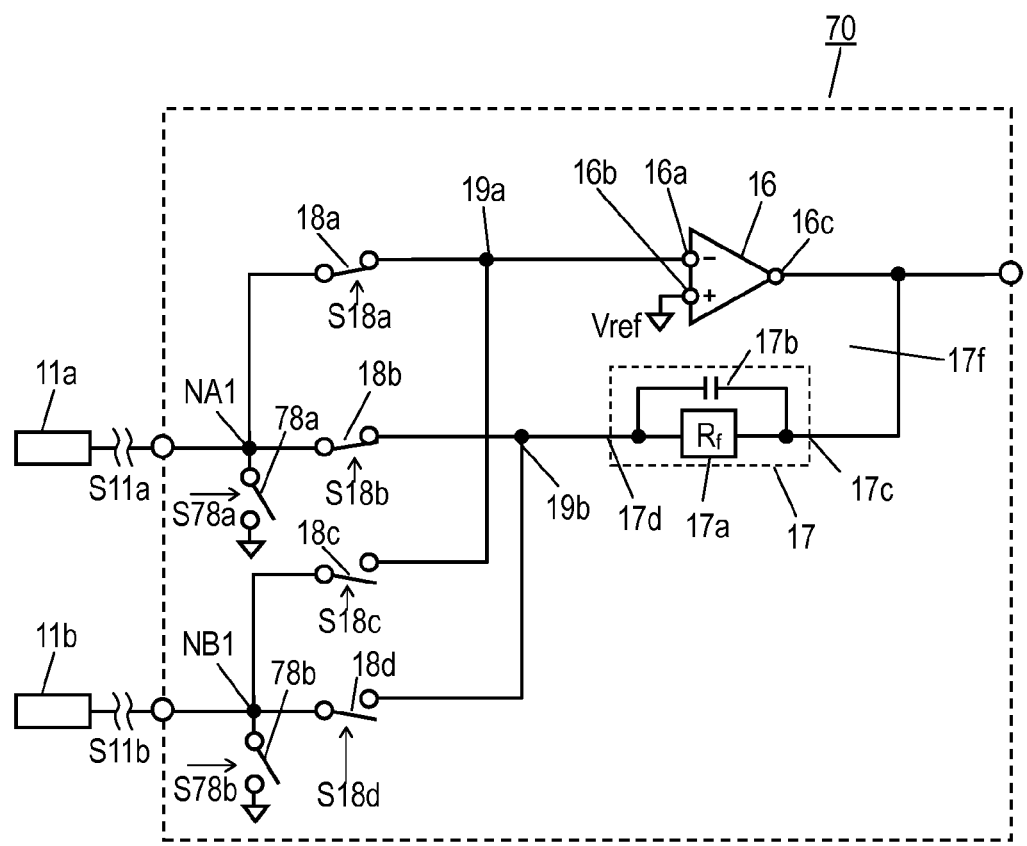
FIG. 6 is a circuit block diagram of still another amplifier circuit of the inertia sensor in accordance with Embodiment 1.

FIG. 6 is a circuit block diagram of still another amplifier circuit 70 in accordance with Embodiment 1. In FIG. 6, components identical to those of amplifier circuit 15a shown in FIG. 2 are denoted by same reference numerals. Amplifier circuit 70 includes amplifier circuit 15a shown in FIG. 2 and further includes switching elements 78a and 78b.

Switching element 78a is connected between reference potential Vref and node NA1 at which switching elements 18a and 18b are connected to sensing part 11a. Switching element 78b is connected between reference potential Vref and node NB1 at which switching elements 18c and 18d are connected to sensing part 11b. Switching elements 18a and 18b are turned on to connect sensing parts 78a and 78b to reference potential Vref, respectively.

Figure 7A:
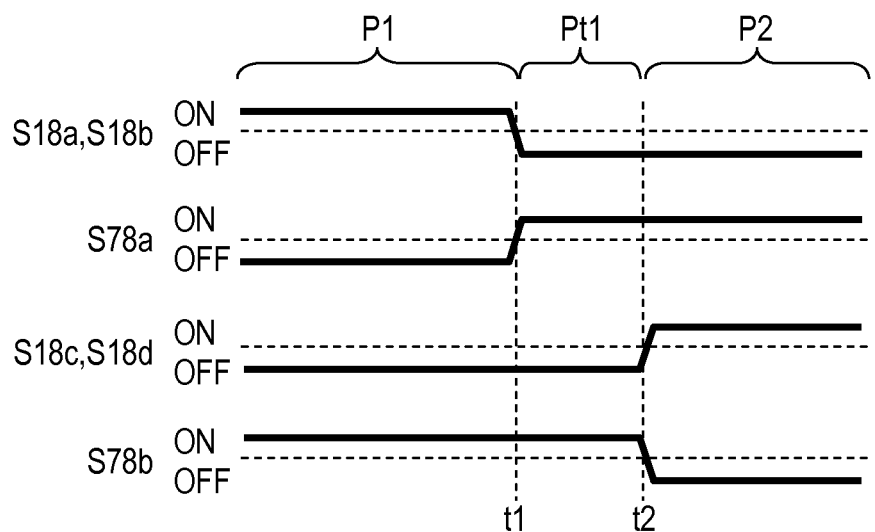
FIG. 7A shows signal waveforms of the amplifier circuit shown in FIG. 6.

FIG. 7A shows signal waveforms of amplifier circuit 70 and illustrates control signals S18a to S18d, S78a, and S78b supplied to switching elements 18a to 18d, 78a, and 78b, respectively. In FIG. 7A, the horizontal axis represents time, and the vertical axis represents levels of control signals S18a to S18d, S78a, and S78b. The levels of control signals S18a to S18d, S78a, and S78b consist of a level "ON" to turn on switching elements 18a to 18d, S78a, and S78b and of a level "OFF" to turn off switching elements 18a to 18d, S78a, and S78b.

Amplifier 16 selectively amplifies sensing signals S11a and S11b from sensing parts 11a and 11b in durations P1 and P2, respectively.

In duration P1, switching elements 18a, 18b, and 78b continue being turned on, and switching elements 18c, 18d, and 78a continue being turned off. In this state, sensing signal S11a output from sensing part 11a of sensing parts 11a and 11b is selectively input to input port 16a of amplifier 16 and amplified, but sensing signal S11b is not input to input port 16a. In other words, amplifier 16 selectively amplifies the detection signal output from sensing signal S11a.

In order to switch a state in which sensing signal S11a from sensing part 11a is input to input port 16a and is amplified in duration P1 to a state in which sensing signal S11b from sensing part 11b is input to input port 16a and is amplified in duration P2, first, at time point t1 at which duration P1 ends, switching elements 18a and 18b which have been turned on are turned off, and switching element 78a which has been turned off is turned on. This operation terminates the input of sensing signal S11a from sensing part 11a to input port 16a, and stops the amplifying of sensing signal S11a. Subsequently, at time point t2 at which duration P2 starts, switching elements 18c and 18d which have been turned off are turned on, and switching element 78b which has been turned on is turned off. This operation allows sensing signal S11b from sensing part 11b to be selectively input to input port 16a of amplifier 16 and amplified. In other words, the state in which sensing signal S11a from sensing part 11a is amplified is switched to the state in which sensing signal S11b from sensing part 11b is amplified. This operation allows sensing signal S11b from sensing part 11b to be selectively input to input port 16a of amplifier 16 and amplified. In other words, amplifier circuit 70 is switched, in duration P11 from time point t1 to time point t2, from the state of amplifying sensing signal S11a from sensing part 11a to the state of amplifying sensing signal S11b from sensing part 11b. As described above, sensing signals S11a and S11b can be switched while switching elements 18a to 18d are disposed in feedback loop 17f of amplifier circuit 70. This configuration can reduce the phase shift of a current associated with the fluctuation of the ON-resistance values of switching elements 18a to 18d, hence stabilizing output characteristics of amplifier circuit 70.

Switching elements 78a and 78b which are turned on discharge electric charges accumulated in sensing parts 11a and 11b. This operation allows no unwanted electric charge to be accumulated in sensing parts 11a and 11b after switching elements 18a to 18d are switched. Unwanted electric charges accumulated in sensing part 11a and 11b may cause unwanted vibration modes in sensing parts 11a and 11b. Switching elements 78a and 78b which are turned on discharge the unwanted electric charges, and therefore, prevents the unwanted vibration modes in sensing parts 11a and 11b, hence allowing inertia sensor 10 to operate stably. Amplifier circuit 70 includes switching elements 78a and 78b for connecting sensing parts 11a and 11b to reference potential Vref; however, amplifier circuit 70 is not limited to this configuration. For example, instead of switching elements 78a and 78b, amplifier circuit 70 may have a function to connect sensing parts 11a and 11b to reference potential Vref when switching elements 18a to 18d are turned off.

Figure 7B:
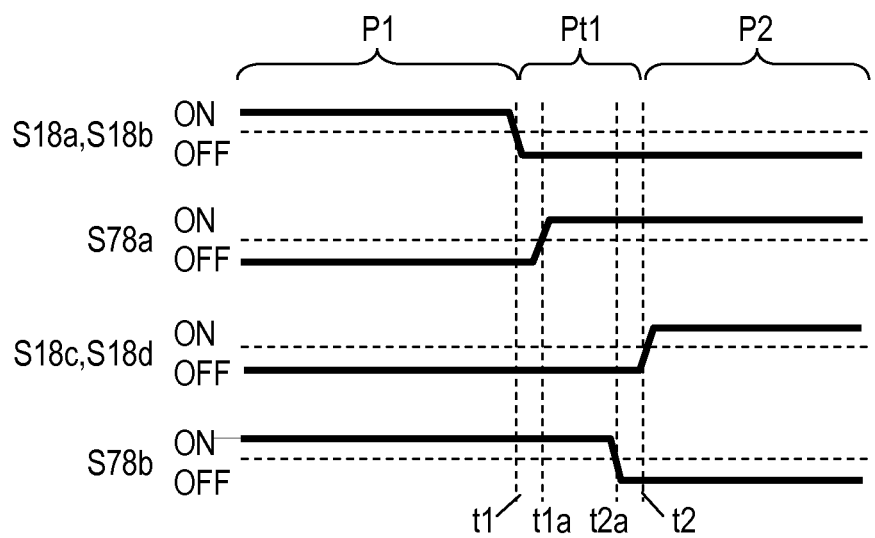
FIG. 7B shows other signal waveforms of the amplifier circuit shown in FIG. 7B.

FIG. 7B is other signal waveforms of amplifier circuit 70 and illustrates control signals S18a to S18d, S78a, and S78b supplied to switching elements 18a to 18d, 78a, and 78b, respectively. In FIG. 7B, items identical to those in FIG. 7A are denoted by the same reference numerals.

In the operation shown in FIG. 7A, switch 78a is turned on simultaneously when switches 18a and 18b are turned off at time point t1 at which duration P1 ends, and switch 78b is turned off simultaneously when switches 18c and 18d are turned on at time point t2 at which duration P2 starts.

Switches 78a and 78b produce an effect for discharging the electric charges accumulated in sensing parts 11a and 11b in durations P1 and P2 and reduce the unwanted vibration modes induced by the electric charge. Therefore, the above effect is obtained by discharging the electric charge at duration Pt1 at which sensing parts 11a and 11b are switched. Thus, the same effect as the operation shown in FIG. 7A is obtained by, for example as shown in FIG. 7B, turning on switch 78a at time point t1a after time point t1 at which duration P1 ends, i.e., duration Pt1 starts, turning off switches 18a and 18b to discharge the electric charge accumulated in sensing part 11a. Further, switch 78a is turned off before duration P1 starts to allow signal S11a from sensing part 11a to be input to input port 16a of amplifier 16 in duration P1.

Further, switch 78b is turned off at time point t2a before time point t2 at which duration Pt1 ends and duration P2 starts to allow signal S11b from sensing part 11b to be input to input port 16a of amplifier 16 in duration P2. Similarly, switch 78b is turned on to discharge the electric charge accumulated in sensing part 11b a time point after duration P2 ends and switches 18c and 18d are turned off, providing the same effect as the operation shown in FIG. 7A. Time points t1a and t2a are both in duration Pt1, and either of time points t1a and t2a may be earlier.

Figure 8:
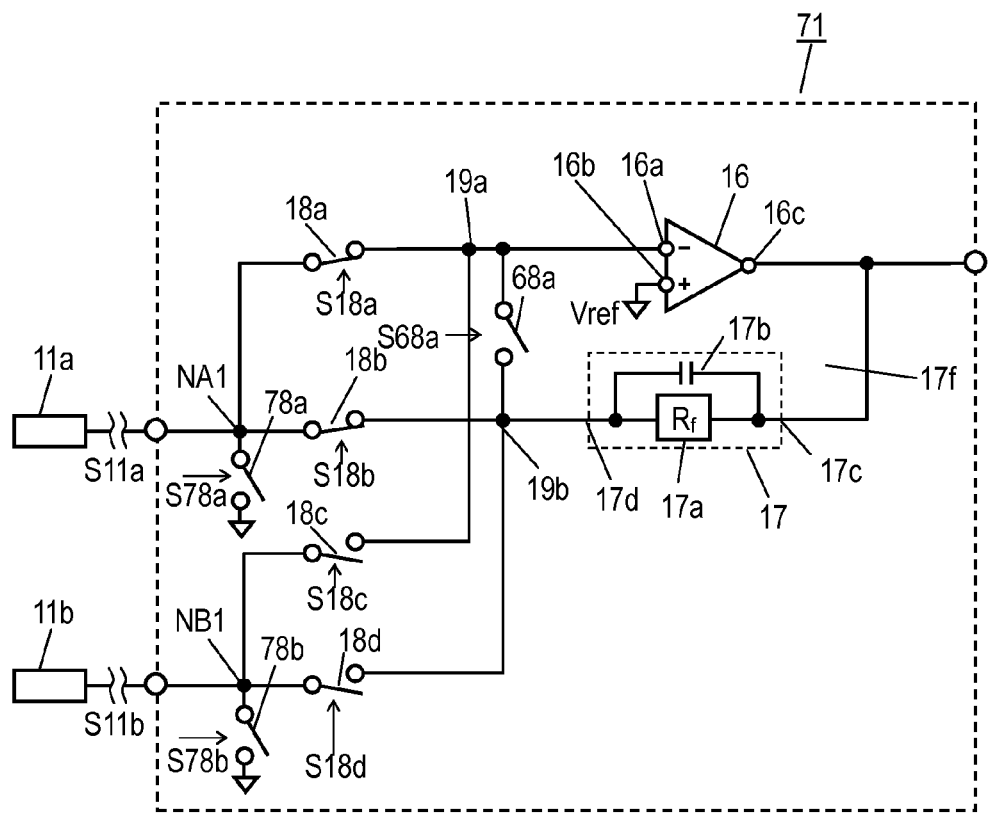
FIG. 8 is a circuit block diagram of a further amplifier circuit of the inertia sensor in accordance with Embodiment 1.

FIG. 8 is a circuit block diagram of further amplifier circuit 71 of inertia sensor 10 in accordance with Embodiment 1. In FIG. 8, components identical to those of amplifier circuits 15a, 60, and 70 shown in FIGS. 2, 4, and 6 are denoted by the same reference numerals. Amplifier circuit 71 shown in FIG. 8 includes amplifier circuit 15a shown in FIG. 2 and further includes switching element 68a of amplifier circuit 60 shown in FIG. 4 and switching elements 78a and 78b of amplifier circuit 70 shown in FIG. 6.

Figure 9:
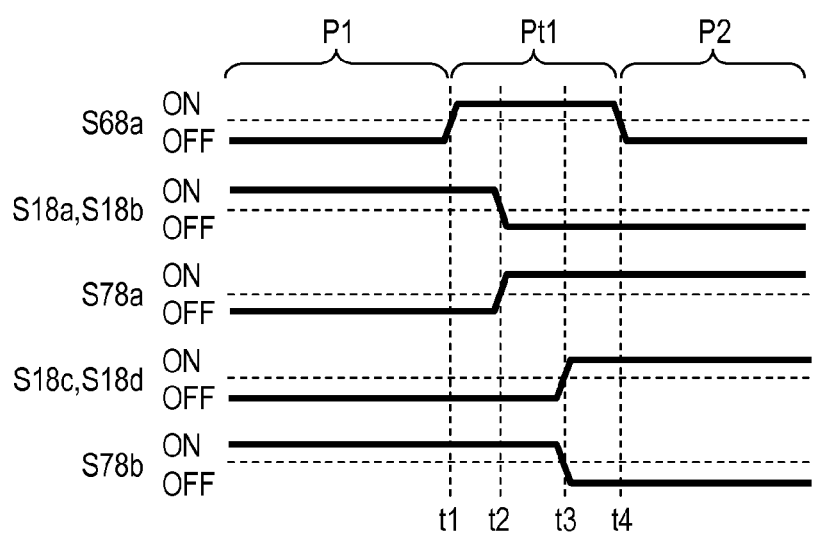
FIG. 9 shows signal waveforms of the amplifier circuit shown in FIG. 8.

An operation of amplifier circuit 71 will be described below. FIG. 9 shows signal waveforms of amplifier circuit 71 and illustrates control signals S18a to S18d, S68a, S78a, and S78b supplied to switching elements 18a to 18d, 68a, 78a, and 78b, respectively. In FIG. 9, the horizontal axis represents time, and the vertical axis represents levels of control signals S18a to S18d, S68a, S78a, and S78b. The levels of control signals S18a to S18d, S68a, S78a, and S78b consist of a level "ON" to turn on respective switching elements 18a to 18d, 68a, 78a, and 78b and of a level "OFF" to turn off respective switching elements 18a to 18d, 68a, 78a, and 78b.

Amplifier 16 selectively amplifies sensing signals S11a and S11b from sensing parts 11a and 11b in durations P1 and P2, respectively.

In duration P1, switching elements 18a, 18b, and 78b continue being turned on, and switching elements 18c, 18d, 68a, and 78a continue being turned off. In this state, sensing signal S11a output from sensing part 11a of sensing parts 11a and 11b is selectively input to input port 16a of amplifier 16 and amplified, but sensing signal S11b is not input to input port 16a. In other words, amplifier 16 selectively amplifies the detection signal output from sensing signal S11a.

In order to switch a state in which sensing signal S11a from sensing part 11a is input to input port 16a of amplifier 16 and amplified in duration P1 to a state in which sensing signal S11b from sensing part 11b is input to input port 16a and amplified in duration P2, switching element 68a which has been turned off is first turned on at time point t1 at which duration P1 ends. Subsequently, at time point t2, switching elements 18a and 18b which have been turned on are turned off, and simultaneously switching element 78a which has been turned off is turned on. This operation terminates the input of sensing signal S11a from sensing part 11a to input port 16a, and stops the amplifying of sensing signal S11a. Subsequently, at time point t3, switching elements 18c and 18d which have been turned off are turned on, and switching element 78b which has been turned on is turned off. Then, switching element 68a which has been turned on is off at time point t4 at which duration P2 starts. This operation allows sensing signal S11b from sensing part 11b to be selectively input to input port 16a of amplifier 16 and amplified. In other words, amplifier circuit 71 is switched, in duration Pt1 from time point t1 to time point t4, from the state of amplifying sensing signal S11a from sensing part 11a to the state of amplifying sensing signal S11b from sensing part 11b. The configuration in which switching elements 18a to 18d are disposed in feedback loop 17f can reduce the phase shift of a current associated with the fluctuation of the ON-resistance values of switching elements 18a to 18d, thus stabilizing characteristics of amplifier circuit 71. Further, in amplifier circuit 71, the switching operation can be performed without opening feedback loop 17f in duration Pt1. Upon opening, feedback loop 17f may cause an output fluctuation (rapid change of output), and prevent an inertial force from being detected accurately until the change becomes small. Amplifier circuit 71 can reduce the period in which output accuracy is reduced. Further, switching elements 78a and 78b which are turned on discharge unwanted electric charges, and therefore, suppress induction of unwanted vibration modes in sensing parts 11a and 11b, hence allowing inertia sensor 10 to operate stably. Similarly to the operation shown in FIG. 7B, switch 78a may be switched at a time point different from the time point at which switches 18a and 18b are switched, and switch 78b may be switched at a time point different from the time point at which switches 18c and 18d are switched.

Figure 10:
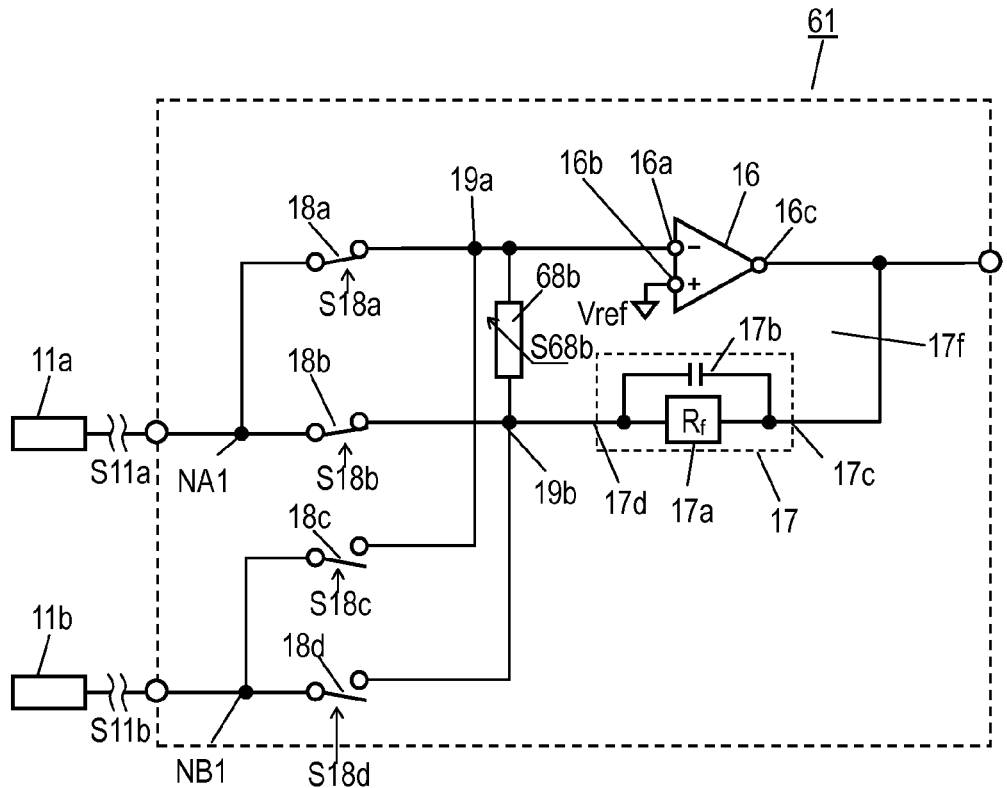
FIG. 10 is a circuit block diagram of a further amplifier circuit of the inertia sensor in accordance with Embodiment 1.

FIG. 10 is a circuit block diagram of further amplifier circuit 61 of inertia sensor 10 in accordance with Embodiment 1. In FIG. 10, components identical to those of amplifier circuit 60 shown in FIG. 4 are denoted by the same reference numerals. Amplifier circuit 61 includes variable resistor 68b connected between nodes 19a and 19b, instead of switching element 68a of amplifier circuit 60 shown in FIG. 4.

Switching element 68a implemented by a semiconductor element, such as a field effect transistor (FET), in amplifier circuit 60 shown in FIG. 4 may be regarded as a variable resistor which has a very small resistance value while being turned on and which has a very large resistance value while being turned off. In amplifier circuit 61 shown in FIG. 10, a control signal S68b switches the resistance value of variable resistor 68b, which is installed instead of switching element 68a, between a low resistance value and a high resistance value higher than the low resistance value. The high resistance value of variable resistor 68b is not smaller than the resistance value of switching element 68a of amplifier circuit 60 shown in FIG. 4 which is turned off. Amplifier circuit 61 can amplify sensing signals S11a and S11b similarly to the amplifier circuit shown in FIG. 4.

Figure 11:
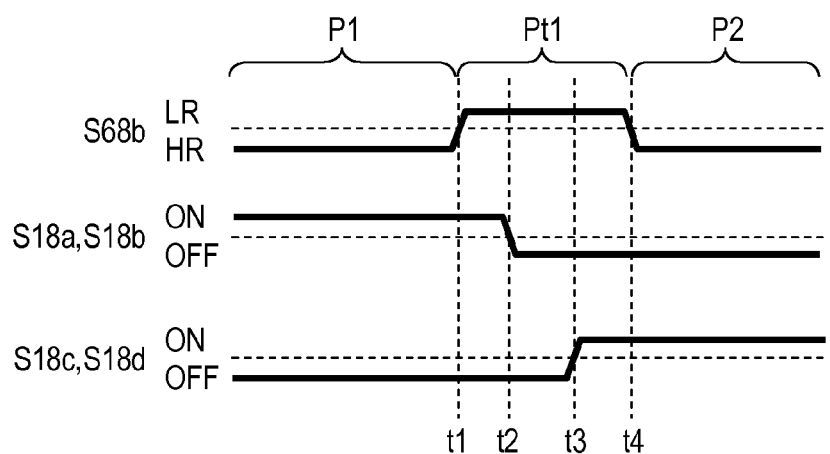
FIG. 11 is a signal waveform diagram of the amplifier circuit shown in FIG. 10.

An operation of amplifier circuit 61 will be described below. FIG. 11 shows signal waveforms of amplifier circuit 61 and illustrates control signals S18a to S18d supplied to switching elements 18a to 18d, respectively, and illustrates control signal S68b supplied to variable resistor 68b. In FIG. 11, items identical to those of the signal waveforms of amplifier circuit 60 shown in FIG. 5 are denoted by the same reference numerals. In FIG. 11, the horizontal axis represents time, and the vertical axis levels of control signals S18a to S18d, and S68b. The levels of each of control signals S18a to S18d consist of a level "ON" to turn on switching elements 18a to 18d and of a level "OFF" to turn off switching elements 18a to 18d. The levels of control signal S68b consist of a level "HR" to set the resistance value of variable resistor 68b to the high resistance value and of a level "LR" to set the resistance value of variable resistor 68b to the low resistance value.

Variable resistor 68b has the low resistance value at the same timing at which switching element 68a of amplifier circuit 60 shown in FIG. 4 is turned on, and has the high resistance value at the same timing at which switching element 68a is turned off. That is, in duration P1 in which sensing signal S11a of sensing signals S11a and S11b is selectively amplified, variable resistor 68b has the high resistance value. Similarly, in duration P2 in which sensing signal S11b of sensing signals S11a and S11b is selectively amplified, variable resistor 68b has the high resistance value. An operation of amplifier circuit 61 will be detailed below.

Amplifier 16 selectively amplifies sensing signals S11a and S11b from sensing parts 11a and 11b in durations P1 and P2, respectively.

In duration P1, switching elements 18a and 18b continue being turned on, switching elements 18c and 18d continue being turned off, and variable resistor 68b has the high resistance value. In this state, sensing signal S11a output from sensing part 11a of sensing parts 11a and 11b is selectively input to input port 16a of amplifier 16 and amplified, but sensing signal S11b is not input to input port 16a. That is, in this state, amplifier 16 amplifies sensing signal S11a.

In order to switch from the state in which sensing signal S11a from sensing part 11a is input to input port 16a of amplifier 16 and amplified in duration P1 to the state in which sensing signal S11b from sensing part 11b is input to input port 16a of amplifier 16 and amplified in duration P2, the resistance value of variable resistor 68b is first changed from the high resistance value to the low resistance value at time point t1 at which duration P1 ends. Subsequently, switching elements 18a and 18b which have been turned on are turned off at time point t2. This operation terminates the input of sensing signal S11a from sensing part 11a to input port 16a, and stops the amplifying of sensing signal S11a. Subsequently, switching elements 18c and 18d which have been turned off are turned on at time point t3, and the resistance value of variable resistor 68b is then changed from the low resistance value to the high resistance value at time point t4 at which duration P2 starts. This operation allows sensing signal S11b from sensing part 11b to be selectively input to input port 16a of amplifier 16 and amplified. In other words, amplifier circuit 61 is switched, in duration Pt1 from time point t1 to time point t4, from the state of amplifying sensing signal S11a from sensing part 11a to the state of amplifying sensing signal S11b from sensing part 11b.

In duration Pt1 in which switching element 68a shown in FIGS. 4 and 5 continues being turned on, variable resistor 68b shown in FIGS. 10 and 11 has the low resistance value. The configuration in which switching elements 18a to 18d are disposed in feedback loop 17f can reduce the phase shift of a current associated with the fluctuation of the ON-resistance values of switching elements 18a to 18d, thus stabilizing characteristics of amplifier circuit 61. Further, variable resistor 68b having the low resistance value in amplifier circuit 61 allows the sensing signals to be switched without opening feedback loop 17f in duration Pt1, similarly to switching element 68a shown in FIG. 4. Upon opening, feedback loop 17f may change the output rapidly, and prevent the inertial force from being detected accurately until the change becomes small. Amplifier circuit 61 can shorten the duration in which output accuracy is reduced.

Since variable resistor 68b electrically disconnects between node 19a and 19b instead of switching element 68a shown in FIG. 4, the high resistance value of variable resistor 68b is not smaller than the resistance value of switching element 68a which is turned off. On the other hand, the low resistance value of variable resistor 68b is just smaller than the resistance value $R_f$ of feedback resistor 17a of feedback circuit unit 17 to prevent feedback loop 17f from opening similarly to switching element 68a shown in FIG. 4; therefore, the low resistance value may not necessarily be as low as a conductive state.

Variable resistor 68b can be disposed in a smaller area than switching element 68a shown in FIG. 4, accordingly providing amplifier circuit 61 with a small size.

An operation of inertia sensor 10 shown in FIG. 1 will be described below.

Monitor parts 31e and 31f of sensor element 21 output monitor signals S31e and S31f corresponding to the driving vibration of vibrator 11. Drive circuit 12 includes monitor-signal amplifier 12f which amplifies monitor signals S31e and S31f input from monitor parts 31e and 31f via signal wirings 34e and 34f, respectively, and outputs monitor signal S12f. Monitor-signal amplifier 12f includes differential amplifier 12a. Differential amplifier 12a amplifies the difference between monitor signals S31e and S31f input from monitor parts 31e and 31f, and outputs monitor signal S12f. In accordance with Embodiment 1, monitor signal S31e is input to a non-inverting input terminal of differential amplifier 12a, and a monitor signal S31f is input to an inverting input terminal of differential amplifier 12a. Monitor signals S31e and S31f have phases reverse to each other. Therefore, the difference between monitor signals S31e and S31f provides monitor signal S12f with large amplitude and an averaged phase shift. AGC amplifier 12b amplifies monitor signal S12f and outputs monitor signal S12b. Band pass filter (BPF) 12c outputs a component of monitor signal S12b in a predetermined frequency band as filtered signal S12c. Filtered signal S12c is amplified by amplifier 12d and then input as drive signals S31c and S31d to drive parts 31c and 31d of sensor element 21 via signal wirings 34c and 34d, and causes vibrator 11 to generate a driving vibration. As described above, sensor element 21 and drive circuit 12 constitute a drive loop for causing vibrator 11 to vibrate to generate the driving vibration. In the chive loop, AGC amplifier 12b has a gain adjusted such that a level of filtered signal S12c input to AGC amplifier 12b is constant. Therefore, amplitudes of monitor signals S31e and S31f output from monitor parts 31e and 31f are constant. This configuration allows vibrator 11 to vibrate with constant amplitude. Phase shifter 12e shifts a phase of monitor signal S12f by 90 degrees and outputs the signal with the shifted phase as monitor signal S12e to detection circuit 15.

While vibrating due to drive signals S31c and S31d provided from drive circuit 12, vibrator 11 changes a state of the vibration, depending on the angular velocity, which is an inertial force applied from outside. For example, angular velocity Ω applied to vibrator 11 while vibrator 11 generates the driving vibration applies a Coriolis force to vibrator 11. This Coriolis force causes vibrator 11 to vibrate, i.e., generate a detecting vibration having amplitude proportional to the angular velocity Ω. Sensing signals S11a and S11b obtained based on this detecting vibration are output from sensing parts 11a and 11b, respectively.

Amplifier circuit 15a amplifies sensing signals S11a and 11b from sensing parts 11a and 11b. Sensing signals S11a and S11b are electric currents which are flows of electric charges caused by the Coriolis force applied to vibrator 11, and amplifier circuit 15a performs IN conversion to convert sensing signals S11a and S11b which are electric currents into a voltage and to output the voltage as sensing signal S15a.

Detection circuit 15c detects sensing signal S15a from amplifier circuit 15a synchronously to monitor signal S12e. In other words, detection circuit 15c synchronously detects sensing signal S15a from amplifier circuit 15a by using signal S12f. The Coriolis force contained in sensing signal S15a, which is a sensing component depending on the angular velocity Ω, has the same frequency as monitor signal S12e but has the phase deviating from the phase of monitor signal S12e by 90 degrees. Thus, detection circuit 15c detects sensing signal S15a synchronously to monitor signal S12e obtained by advancing the phase of monitor signal S12c by 90 degrees by phase shifter 12e, and extracts only the sensing component from sensing signal S15a. Detection circuit 15c can thus output detection signal S15c constituted only of the sensing component.

Low-pass filter 15d can obtain an output signal S15d corresponding to the sensing component of the angular velocity Ω applied to vibrator 11 by smoothing detection signal S15c from detection circuit 15c.

Exemplary Embodiment 2

Figure 12:
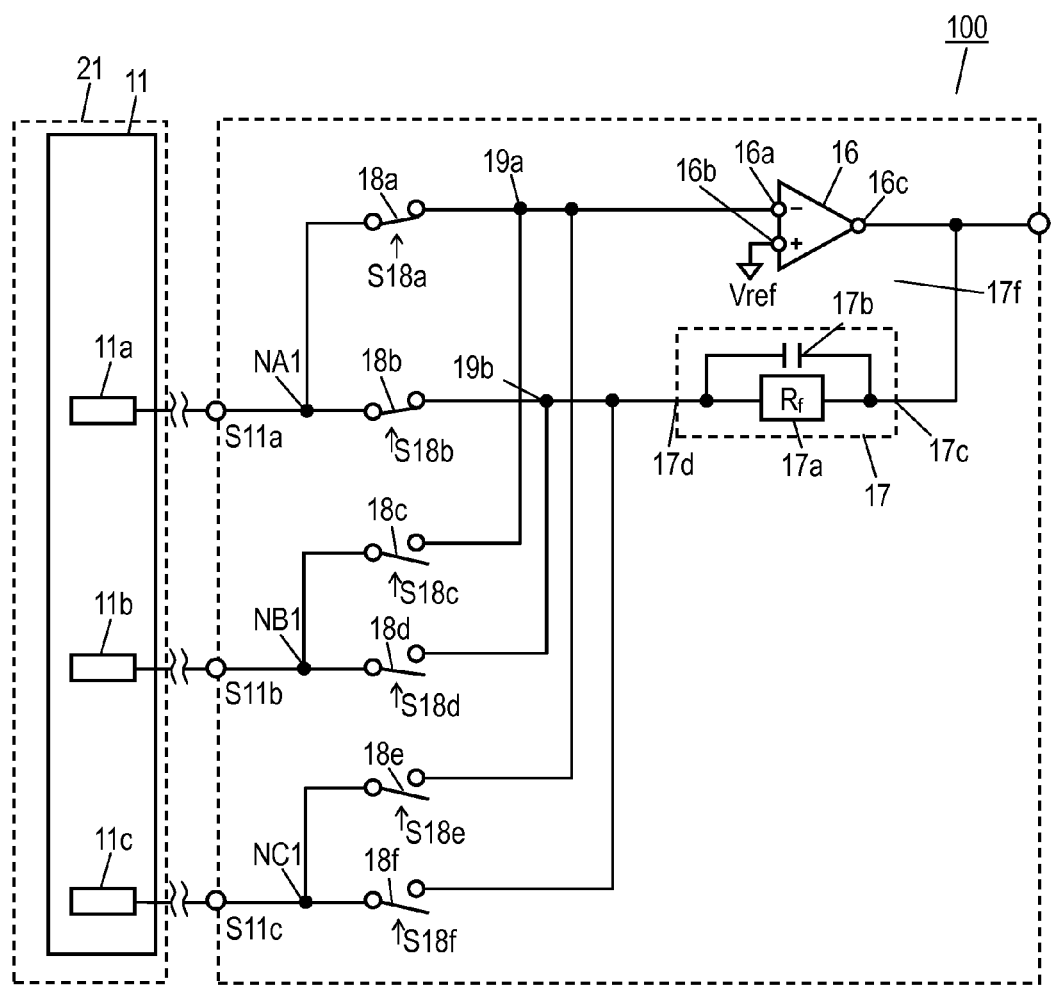
FIG. 12 is a circuit block diagram of an amplifier circuit of an inertia sensor in accordance with Exemplary Embodiment 2 of the present disclosure.

FIG. 12 is a circuit block diagram of amplifier circuit 100 of an inertia sensor in accordance with Exemplary Embodiment 2. In FIG. 12, components identical to those of amplifier circuit 15a in accordance with Embodiment 1 shown in FIG. 2 are denoted by the same reference numerals. Sensor element 21 shown in FIG. 12 further includes sensing part 11c provided on vibrator 11. Amplifier circuit 100 in accordance with Embodiment 2 shown in FIG. 12 includes amplifier circuit 15a in accordance with Embodiment 1 shown in FIG. 2 and further includes switching element 18e provided between sensing part 11c and input port 16a of amplifier 16 and switching element 18f provided between sensing part 11c and end 17d of feedback circuit unit 17. Sensing part 11a is connected to switching elements 18a and 18b at node NA1. Sensing part 11b is connected to switching elements 18c and 18d at node NB1. Sensing part 11c is connected to switching elements 18e and 18f at node NC1. Amplifier 16 selectively amplifies sensing signals S11a to S11c output from respective sensing parts 11a to 11c, and outputs the amplified signal from output port 16c. In amplifier circuit 100, The switching of switching elements 18a and 18f switches among the a in which sensing signal S11a from sensing part 11a is input to input port 16a of amplifier 16 and amplified, a state in which sensing signal S11b from sensing part 11b is input to input port 16a of amplifier 16 and amplified, and a state in which sensing signal S11c from sensing part 11c is input to input port 16a of amplifier 16 and amplified.

Figure 13:
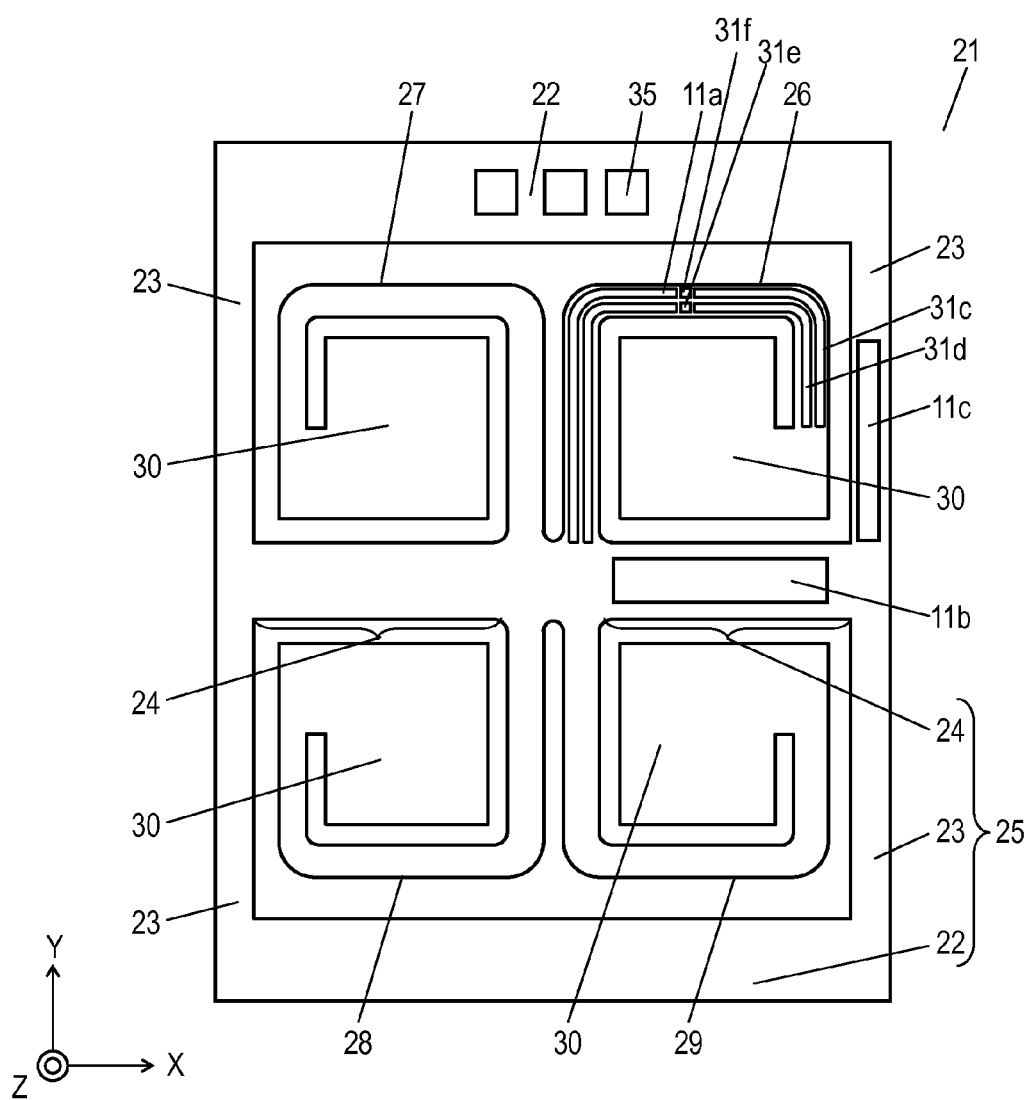
FIG. 13 is a schematic view of a sensor element of the inertia sensor in accordance with Embodiment 2.

FIG. 13 is a schematic view of sensor element 21 in accordance with Embodiment 2 shown in FIG. 12. Sensor element 21 can detect angular velocities about multiple axes, which are multi-axial inertial forces. In FIG. 13, an X-axis, a Y-axis, and a Z-axis perpendicular to each other are defined. Further, an X-Y plane including the X-axis and the Y-axis is defined.

Sensor element 21 includes vibrator 11, drive parts 31c and 31d provided on vibrator 11, monitor parts 31e and 31f provided on vibrator 11, sensing parts 11a to 11c provided on vibrator 11, and connection electrodes 35 electrically connected to drive parts 31c and 31d, sensing parts 11a to 11c, and monitor parts 31e and 31f via wirings. Vibrator 11 includes base 25, arms 26, 27, 28, and 29 having respective one ends supported by base 25, and weights 30 connected to respective other ends of arms 26, 27, 28, and 29. Base 25 includes fixed members 22, two longitudinal beams 23 connected to fixing members 22, lateral beam 24 connected between two longitudinal beams 23. Drive parts 31c and 31d are disposed on portions of arms 26, 27, 28, and 29 closer to weights 30, and move arms 26, 27, 28, and 29 in the X-Y plane, and cause arms 26, 27, 28, and 29 to vibrate. Sensing part 11a is disposed on portions of arm 26 closer to base 25. Sensing parts 11b and 11c are disposed on base 25. Connection electrodes 35 are electrically connected to drive parts 31c and 31d and sensing parts 11a to 11c via the wirings. Sensing part 11a detects an inertial force caused by an angular velocity about the Z-axis. Sensing part 11b detects an inertial force caused by an angular velocity about the Y-axis. Sensing part 11c detects an inertial force caused by an angular velocity about the X-axis.

Figure 14A:
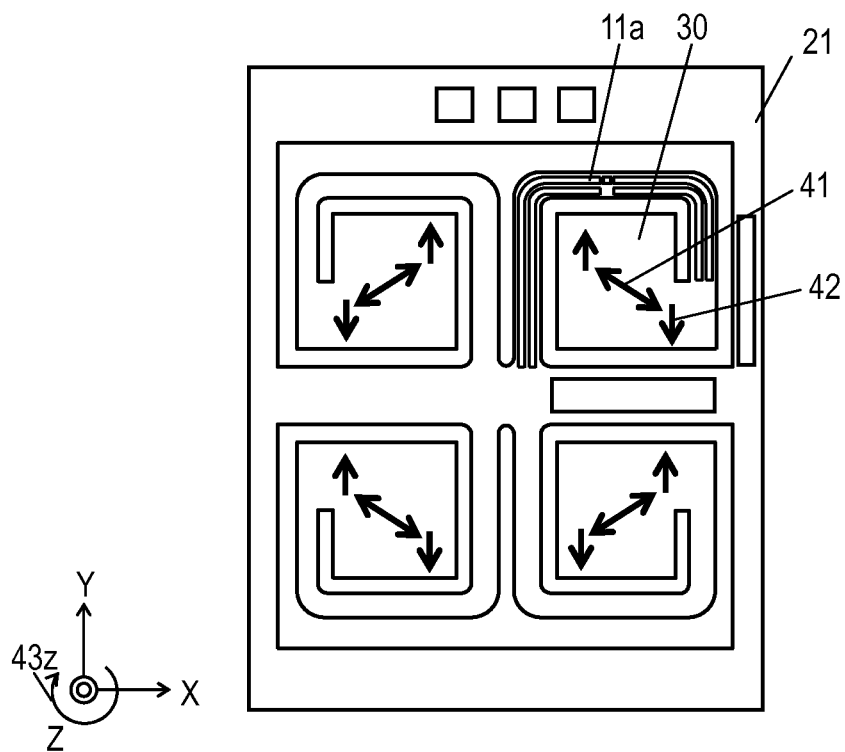
FIG. 14A is a plan view of the sensor element in accordance with Embodiment 2 for detecting an angular velocity about a Z-axis.

FIG. 14A is a plan view of sensor element 21 that detects angular velocity 43z about the Z-axis. The drive signals are supplied to drive parts 31c and 31d from drive circuit 12 to generate driving vibrations 41 in weights 30 in the X-Y plane, as shown in FIG. 14A. When angular velocity 43z about the Z-axis is applied to sensor element 21 while driving vibration 41 is generated in weight 30, an inertial force (Coriolis force) is generated in the Y-axis direction, and generates a detecting vibration 42 in weights 30, so that detecting vibration 42 causes sensing part 11a to generate sensing signal S11a. Sensing signal S11a has the same frequency as the driving vibration and has amplitude depending on angular velocity 43z. Therefore, the amplitude of sensing signal S11a is measured to detect a magnitude of angular velocity 43z.

Figure 14B:
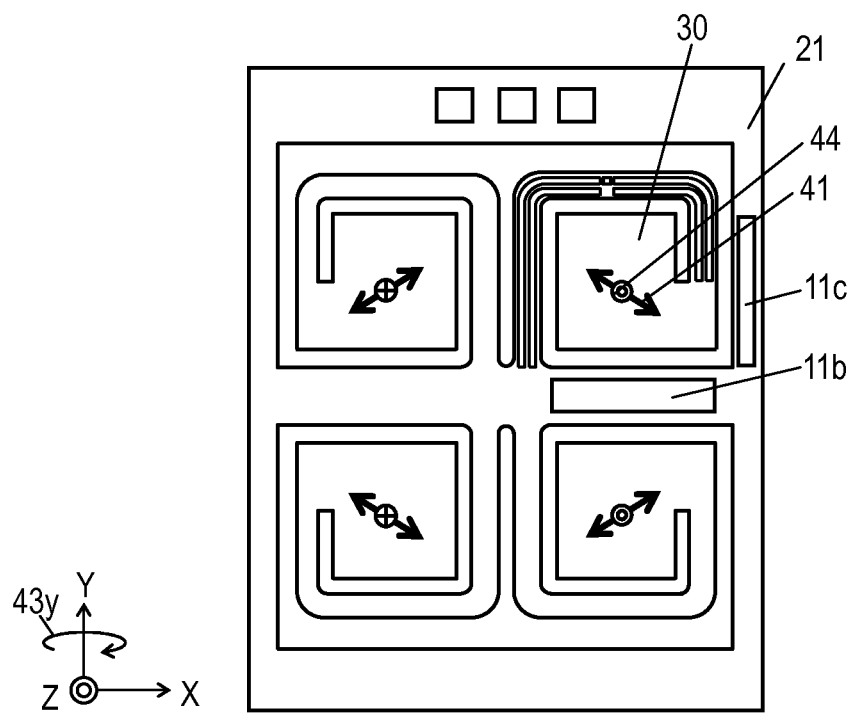
FIG. 14B is a plan view of the sensor element in accordance with Embodiment 2 for detecting an angular velocity about a Y-axis.

FIG. 14B is a plan view of sensor element 21 detecting angular velocity 43y about the Y-axis. When angular velocity 43y about the Y-axis is applied to sensor element 21 while driving vibration 41 is generated in weights 30, a detecting vibration 44 is generated in weights 30 in the Z-axis direction due to the inertial force. Sensing signal S11b is output from sensing part 11b due to detecting vibration 44. Sensing signal S11b has the same frequency as driving vibration 41 and has amplitude depending on angular velocity 43y. Therefore, the amplitude of sensing signal S11b is measured to detect a magnitude of angular velocity 43y. An angular velocity about the X-axis can be detected similarly to the angular velocity about the Y-axis. Specifically, when the angular velocity about the X-axis is applied to sensor element 21 while driving vibration 41 is generated in weights 30, sensing part 11c outputs sensing signal S11c having the same frequency as the driving vibration and having amplitude depending on the angular velocity. Therefore, the amplitude of sensing signal S11c is measured to detect a magnitude of the angular velocity about the X-axis.

Sensor element 21 detects the inertial force generated by angular velocity 43z about the Z-axis by using sensing part 11a, detects the inertial force generated by angular velocity 43y about the Y-axis by using sensing part 11b, and detects the inertial force generated by the angular velocity about the X-axis by using sensing part 11c. Sensor element 21 is not limited to this configuration. Specifically, sensing part 11a may detect the inertial force generated by the angular velocity about the X-axis or the Y-axis, and sensing part 11b or 11c may detect the inertial force generated by the angular velocity about the Z-axis or X-axis.

Sensor element 21 detects the angular velocities about the multiple axes by using sensing parts 11a to 11c disposed on one vibrator 11; however, sensor element 21 is not limited to this configuration. Specifically, sensor element 21 may include plural sensor elements each detecting, for example, an angular velocity about one axis. In other words, sensor element 21 may include plural vibrators each having three sensing parts 11a to 11c disposed thereon.

Sensing parts 11a to 11c, drive parts 31c and 31d, and monitor parts 31e and 31f employ piezoelectric material to driving vibrator 11 and to detect the vibration of vibrator 11; however, this embodiment is not restrictive. For example, an angular velocity sensor including sensing parts 11a to 11c, drive parts 31c and 31d, monitor parts 31e and 31f, and vibrator 11 may employ, for example, capacitances to drive vibrator 11 to detect the vibration of vibrator 11.

Amplifier circuit 100 shown in FIG. 12 is used for, for example, inertia sensor 10 equipped with sensor element 21 shown in FIG. 13 which can detect the angular velocities as the inertial forces about multiple axes. Amplifier circuit 100 can selectively amplify the sensing signal depending on the angular velocity as the inertial force about the X-axis, the sensing signal depending on the angular velocity as the inertial force about the Y-axis, and the sensing signal depending on the angular velocity as the inertial force about the Z-axis.

An operation of amplifier circuit 100 will be described below. FIG. 15 shows signal waveforms of amplifier circuit 100 and illustrates control signals S18a to S18f supplied to switching elements 18a and 18f, respectively. In FIG. 15, the horizontal axis represents time, and the vertical axis represents levels of control signal S18a to S18f. The levels of control signals S18a to S18f consist of a level "ON" to turn on switching elements 18a and 18f and of a level "OFF" to turn off switching elements 18a and 18f. When control signals S18a and S18b are at the level "OFF" to turn off switching elements 18a and 18b, switching elements 18a and 18b may connect sensing part 11a to a reference potential Vref. Further, when control signals S18c and S18d are at the level "OFF" to turn off switching elements 18c and 18d, switching elements 18c and 18d may connect sensing part 11b to reference potential Vref. Further, when control signals S18e and S18f are at the level "OFF" to turn off switching elements 18e and 18f, switching elements 18e and 18f may connect sensing part 11c to reference potential Vref.

Amplifier 16 selectively amplifies sensing signals S11a, S11b, and S11c from sensing parts 11a, 11b, and 11c, in durations P1, P2, and P3, respectively, and selectively amplifies sensing signal S11a from sensing part 11a again in duration P4 after duration P3.

In duration P1, switching elements 18a and 18b continue being turned on, and switching elements 18c to 18f continue being turned off. In this state, sensing signal S11a output from sensing part 11a of sensing parts 11a and 11b is selectively input to input port 16a of amplifier 16 and amplified, but sensing signals S11b and S11c output from sensing parts 11b and 11c are not input to input port 16a of amplifier 16.

In order to switch from a state in which sensing signal S11a from sensing part 11a is input to input port 16a of amplifier 16 and amplified in duration P1 to a state in which sensing signal S11b from sensing part 11b is input to input port 16a of amplifier 16 and amplified in duration P2, switching elements 18a and 18b which has been turned on is first turned off at time point t1 at which duration P1 ends.

This operation connects sensing part 11a to reference potential Vref. This operation terminates the input of sensing signal S11a from sensing part 11a to input port 16a of amplifier 16, and stop the amplifying of sensing signal S11a. Subsequently, switching elements 18c and 18d which have been turned off are turned on at time point t2 at which duration P2 starts. This operation allows sensing signal S11b from sensing part 11b to be selectively input to input port 16a of amplifier 16 and amplified in duration P2. In other words, amplifier circuit 100 is switched, in duration Pt1 from time point t1 to time point t2, from the state of amplifying sensing signal S11a from sensing part 11a to the state of amplifying sensing signal S11b from sensing part 11b. As described above, sensing signals S11a and S11b can be switched while switching elements 18a to 18d are disposed in feedback loop 17f of amplifier circuit 100.

In order to switch from the state in which sensing signal S11b from sensing part 11b is input to input port 16a of amplifier 16 and amplified in duration P2 to a state in which sensing signal S11c from sensing part 11c is input to input port 16a of amplifier 16 in duration P3, switching elements 18c and 18d which have been turned on are first turned off at time point t3 at which duration P2 ends. This operation connects sensing part 11b to reference potential Vref. This operation terminates the input of sensing signal S11b from sensing part 11b to input port 16a of amplifier 16, and stops the amplifying of sensing signal S11b. Subsequently, switching elements 18e and 18f which have been turned off are turned on at time point t4 at which duration P3 starts. This operation allows sensing signal S11c from sensing part 11c to be input to input port 16a of amplifier 16 and amplified in duration P3. In other words, in duration Pt2 from time point t3 to time point t4, amplifier circuit 100 is switched from the state of amplifying sensing signal S11b from sensing part 11b to the state of amplifying sensing signal S11c from sensing part 11c. As described above, sensing signals S11b and S11c can be switched while switching elements 18c to 18f are disposed in feedback loop 17f of amplifier circuit 100.

In order to switch from the state in which sensing signal S11c from sensing part 11c is input to input port 16a of amplifier 16 and amplified in duration P3 to the state in which sensing signal S11a from sensing part 11a is input to input port 16a of amplifier 16 in duration P4, switching elements 18e and 18f which have been turned on are first turned off at time point t5 at which duration P3 ends. This operation connects sensing part 11c to reference potential Vref. This operation terminates the input of sensing signal S11c from sensing part 11c to input port 16a of amplifier 16, and stops the amplifying of sensing signal S11c. Subsequently, switching elements 18a and 18b which have been turned off are turned on at time point t6 at which duration P4 starts. This operation allows sensing signal S11a from sensing part 11a to be selectively input to input port 16a of amplifier 16 and amplified in duration P4. In other words, in duration Pt3 from time point t5 to time point t6, amplifier circuit 100 is switched from the state of amplifying sensing signal S11c from sensing part 11c to the state of amplifying sensing signal S11a from sensing part 11a. As described above, sensing signals S11a and S11c can be switched while switching elements 18a, 18b, 18e, and 18f are disposed in feedback loop 17f of amplifier circuit 100.

This configuration in which switching elements 18a and 18f are disposed in feedback loop 11f can reduce the phase shifts of sensing signals S11a to S11c associated with the fluctuation of ON-resistance values of switching elements 18a and 18f, hence stabilizing output characteristics of amplifier circuit 100, and suppressing generation of unwanted signals.

Figure 16:
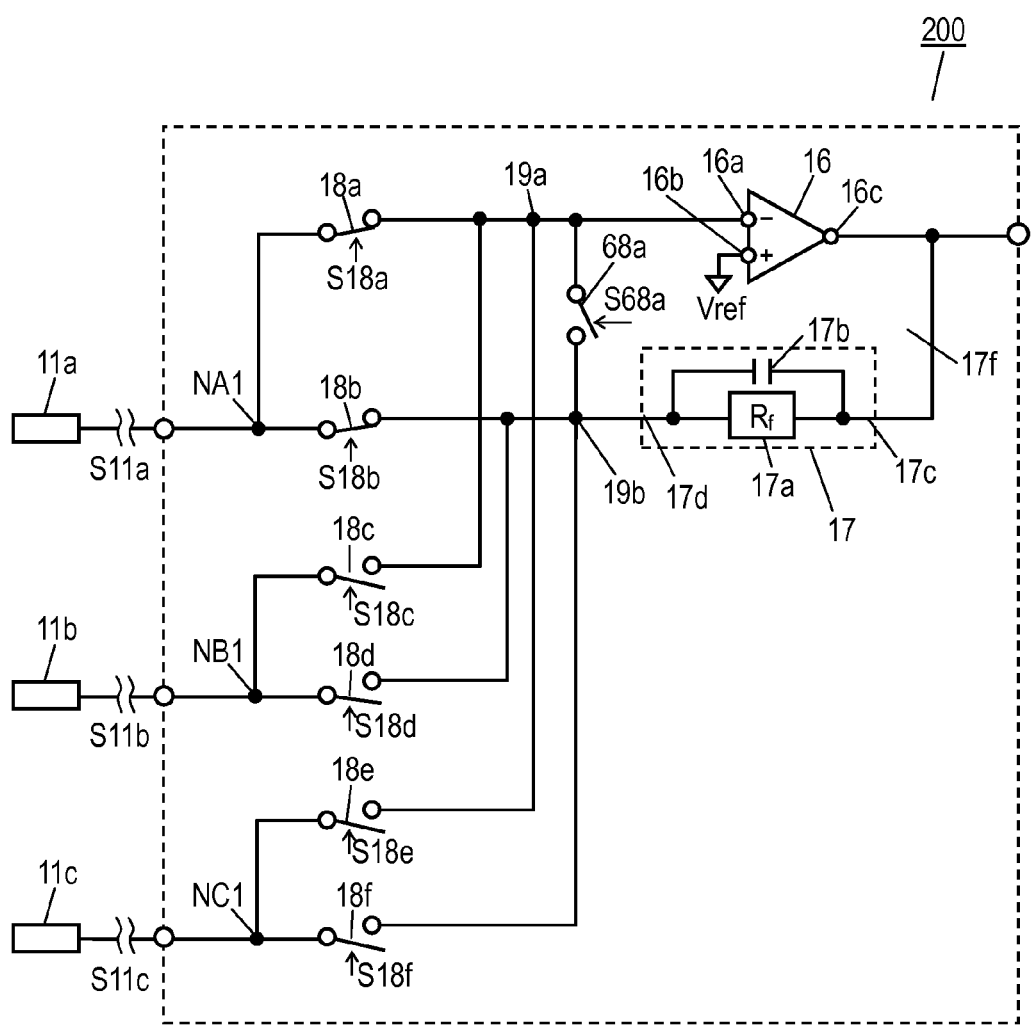
FIG. 16 is a circuit block diagram of another amplifier circuit of the inertia sensor in accordance with Embodiment 2.

FIG. 16 is a circuit block diagram of another amplifier circuit 200 in accordance with Embodiment 2. In FIG. 16, components identical to those of amplifier circuit 100 shown in FIG. 12 and amplifier circuit 60 in accordance with Embodiment 1 shown in FIG. 4 are denoted by the same reference numerals. Amplifier circuit 200 shown in FIG. 16 includes amplifier circuit 100 shown in FIG. 12 and further includes switching element 68a of amplifier circuit 60 in accordance with Embodiment 1 shown in FIG. 4.

Switching elements 18a, 18c, and 18e are connected to input port 16a of amplifier 16 at node 19a. Switching elements 18b, 18d, and 18f are connected to end 17d of feedback circuit unit 17 at node 19b. Switching element 68a is connected between node 19a and node 19b.

Figure 17:
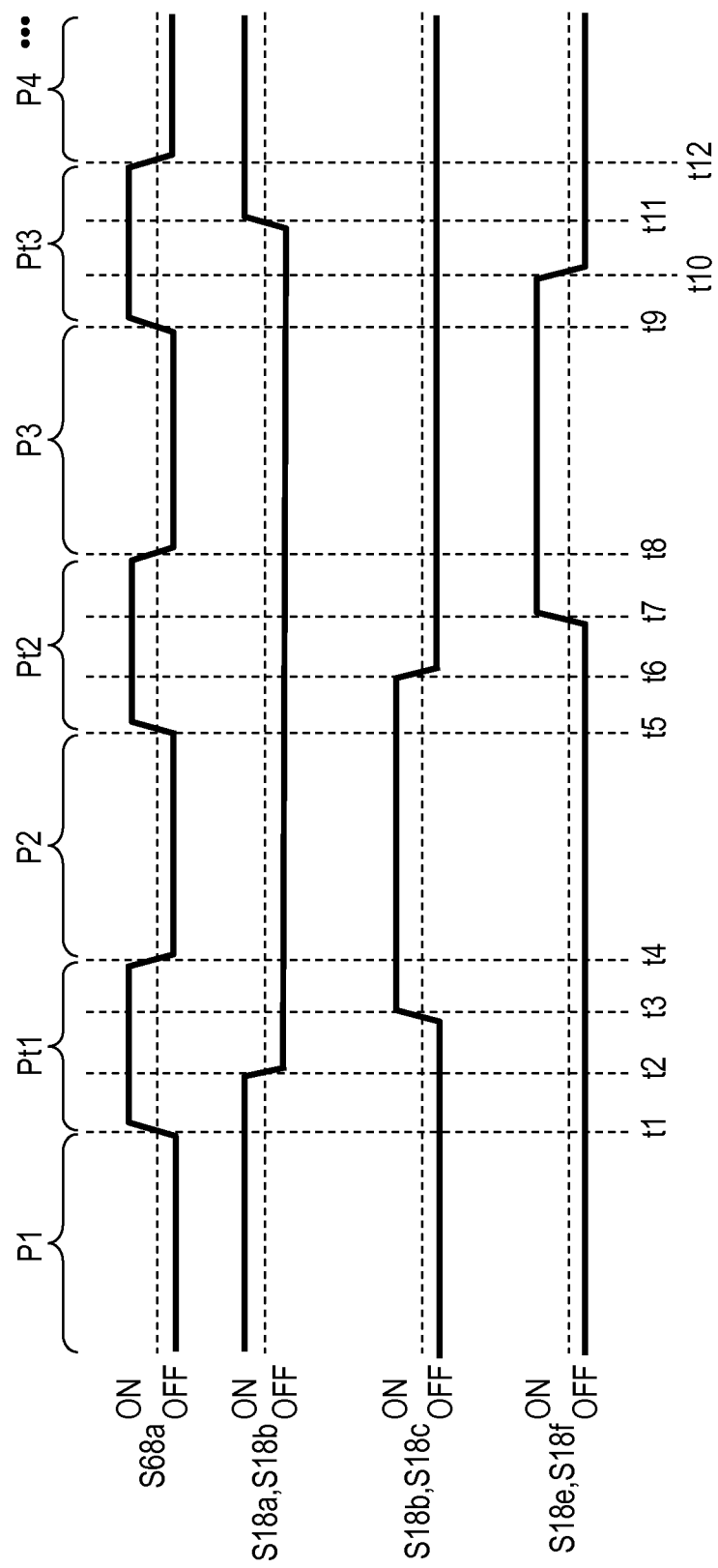
FIG. 17 shows signal waveforms of the amplifier circuit shown in FIG. 16.

An operation of amplifier circuit 200 will be described below. FIG. 17 shows signal waveforms of amplifier circuit 200 and illustrates control signals S18a to S18f, and S68a supplied to switching elements 18a to 18f, and 68a, respectively. In FIG. 17, the horizontal axis represents time, and the vertical axis represents levels of control signal S18a to S18f, and S68a. The levels of control signal S18a to S18f, and S68a consist of a level "ON" to turn on respective switching elements 18a to 18f, and 68a and of a level "OFF" to turn off respective switching elements 18a to 18f, and 68a.

Amplifier 16 selectively amplifies sensing signals S11a, S11b, and S11c of sensing signals S11a to S11c from sensing parts 11a, 11b, and 11c, in durations P1, P2, and P3, respectively. Amplifier 16 selectively amplifies sensing signal S11a from sensing part 11a of sensing signals S11a to S11c again in duration P4.

In duration P1, switching elements 18a and 18b continue being turned on, and switching elements 18c to 18f, and 68a continue being turned off. In this state, sensing signal S11a output from sensing part 11a of sensing parts 11a, 11b, and 11c is selectively input to input port 16a of amplifier 16 and amplified, but sensing signals S11b and S11c are not input to input port 16a. In this state, amplifier 16 amplifies sensing signal S11a.

In order to switch from a state in which sensing signal S11a from sensing part 11a is input to input port 16a of amplifier 16 and amplified in duration P1 to a state in which sensing signal S11b from sensing part 11b is input to input port 16a of amplifier 16 and amplified in duration P2, switching element 68a which has been turned off is first turned on at time point t1 at which duration P1 ends. Subsequently, switching elements 18a and 18b which are turned on are turned off at time point t2. This operation connects sensing part 11a to reference potential Vref and terminates the input of sensing signal S11a from sensing part 11a to input port 16a of amplifier 16, and stops the amplifying of sensing signal S11a. Subsequently, switching elements 18c and 18d which have been turned off are turned on at time point t3. Subsequently, switching element 68a which has been turned on is turned off at time point t4 at which duration P2 starts. This operation allows sensing signal S11b from sensing part 11b to be selectively input to input port 16a of amplifier 16 and amplified in duration P2. In other words, in duration Pt1 from time point t1 to time point t4, amplifier circuit 200 is switched from the state of amplifying sensing signal S11a from sensing part 11a to the state of amplifying sensing signal S11b from sensing part 11b. As described above, sensing signals S11a and S11b can be switched while switching elements 18a to 18d are disposed in feedback loop 17f of amplifier circuit 200.

In order to switch from the state in which sensing signal S11b from sensing part 11b is input to input port 16a of amplifier 16 and amplified in duration P2 to a state in which sensing signal S11c from sensing part 11c is input to input port 16a of amplifier 16 and amplified in duration P3, switching element 68a which has been turned off is first turned on at time point t5 in which duration P2 ends. Subsequently, switching elements 18c and 18d which have been turned on are turned off at time point t6. This operation connects sensing part 11b to the reference potential Vref. This operation terminates the input of sensing signal S11b from sensing part 11b to input port 16a of amplifier 16, and stops the amplifying of sensing signal S11b. Subsequently, switching elements 18e and 18f which have been turned off are turned on at time point t7. Subsequently, switching element 68a which has been turned on is turned off at time point t8 at which duration P3 starts. This operation allows sensing signal S11c from sensing part 11c to be input to input port 16a of amplifier 16 and amplified in duration P3. In other words, in duration Pt2 from time point t5 to time point t8, amplifier circuit 200 is switched from the state of amplifying sensing signal S11b from sensing part 11b to the state of amplifying sensing signal S11c from sensing part 11c. As described above, sensing signals S11b and S11c can be switched while switching elements 18c to 18f are disposed in feedback loop 17f of amplifier circuit 100.

In order to switch from the state in which sensing signal S11c from sensing part 11c is input to input port 16a of amplifier 16 and amplified in duration P3 to the state in which sensing signal S11a from sensing part 11a is input to input port 16a of amplifier 16 and amplified in duration P4, switching element 68a which has been turned off is first turned on at time point t9 in which duration P3 ends. Subsequently, switching elements 18e and 18f which have been turned on are turned off at time point t10. By this operation, sensing part 11c is connected to the reference potential Vref. This operation terminates the input of sensing signal S11c from sensing part 11c to input port 16a of amplifier 16, and the state of amplifying sensing signal S11c is thus interrupted. Subsequently to that, switching elements 18a and 18b which have been turned off are turned on at time point t11. Subsequently to that, switching element 68a which has been turned on is turned off at time point t12 at which duration P4 starts. This operation allows sensing signal S11a from sensing part 11a to be selectively input to input port 16a of amplifier 16 and amplified in duration P4. In other words, in duration Pt3 from time point t5 to time point t6, amplifier circuit 100 is switched from the state of amplifying sensing signal S11c from sensing part 11c to the state of amplifying sensing signal S11a from sensing part 11a. As described above, sensing signals S11a and S11c can be switched while switching elements 18a, 18b, 18e, and 18f are disposed in feedback loop 17f of amplifier circuit 100.

This configuration in which switching elements 18a and 18f are disposed in feedback loop 17f can reduce the phase shifts of the currents, i.e., sensing signals S11a to S11c, associated with the fluctuation of the ON-resistance values of switching elements 18a and 18f, hence stabilizing output characteristics of amplifier circuit 100, suppressing generation of unwanted signals. Further, the switching operations can be performed while feedback loop 17f is closed in the durations Pt1, Pt2, and Pt3. Upon opening, feedback loop 17f causes a rapid fluctuation of the output, and prevents the inertial force from being detected accurately before this fluctuation becomes small. Amplifier circuit 200 can thus shorten a period in which output accuracy is reduced.

Switching element 68a may be replaced by variable resistor 68b of amplifier circuit 61 in accordance with Embodiment 1 shown in FIG. 10, providing the same effects.

Figure 18:
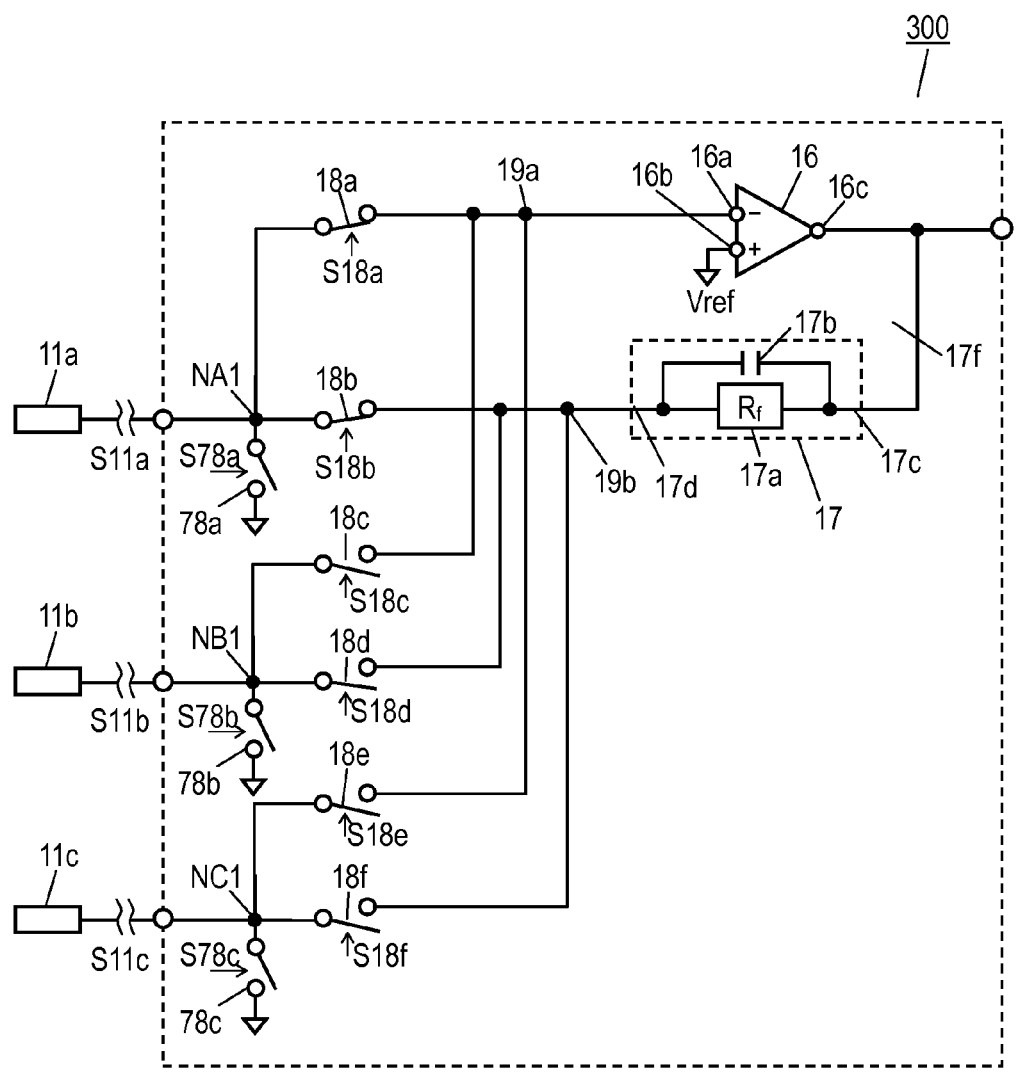
FIG. 18 is a circuit block diagram of still another amplifier circuit of the inertia sensor in accordance with Embodiment 2.

FIG. 18 is a circuit block diagram of still another amplifier circuit 300 in accordance with Embodiment 2. In FIG. 18, components identical to those of amplifier circuit 100 shown in FIG. 12 and amplifier circuit 60 in accordance with Embodiment 1 shown in FIG. 6 are denoted by the same reference numerals. Amplifier circuit 300 shown in FIG. 18 includes amplifier circuit 100 shown in FIG. 12 and further includes switching elements 78a and 78b of amplifier circuit 70 in accordance with Embodiment 1 shown in FIG. 6 and switching element 78c.

Sensing part 11a is connected to switching elements 18a and 18b at node NA1. Switching element 78a is connected between node NA1 and the reference potential Vref. Sensing part 11b is connected to switching elements 18c and 18d at node NB1. Switching element 78b is connected between node NB1 and the reference potential Vref. Sensing part 11c is connected to switching elements 18e and 18f at node NC1. Switching element 78c is connected to node NC1 and the reference potential Vref. Switching elements 78a, 78b, and 78c are turned on to connect sensing parts 11a, 11b, and 11c to the reference potential Vref, respectively.

Figure 19:
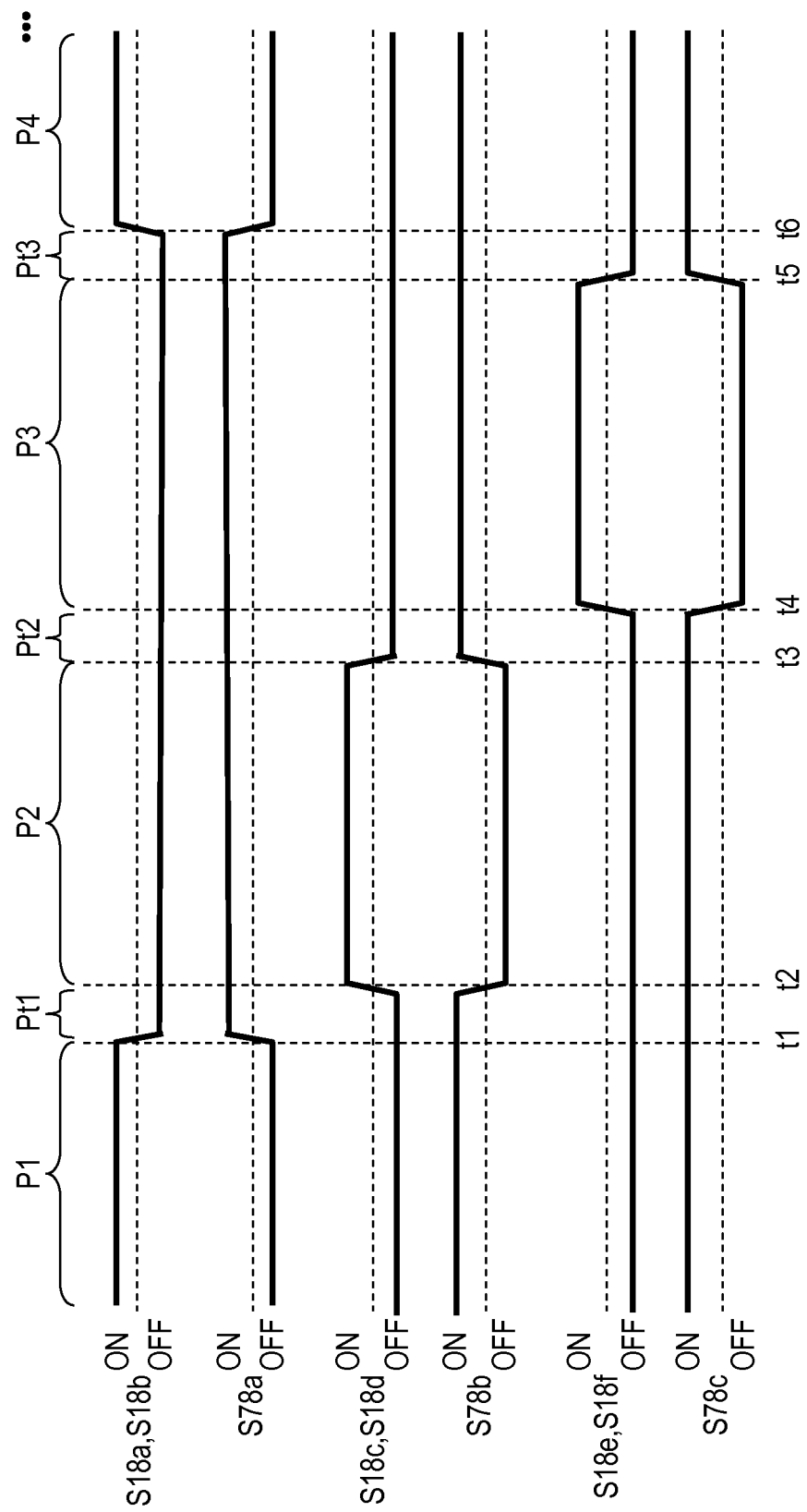
FIG. 19 shows signal waveforms of the amplifier circuit shown in FIG. 18.

FIG. 19 shows signal waveforms of amplifier circuit 300 and illustrates control signal S18a to S18f and S78a to S78c supplied to switching elements 18a to 18f and 78a to 78c, respectively. In FIG. 19, the horizontal axis represents time, and the vertical axis represents levels of control signal S18a to S18f and S78a to S78c. The levels of control signal S18a to S18f and S78a to S78c consist of a level "ON" to turn on respective switching elements 18a to 18f and 78a to 78c and of a level "OFF" to turn off respective switching elements 18a to 18f and 78a to 78c.

Amplifier 16 selectively amplifies sensing signals S11a, S11b, and S11c from sensing parts 11a, 11b, and 11c in durations P1, P2, and P3, respectively. Amplifier 16 selectively amplifies sensing signal S11a from sensing part 11a again in duration P4.

In duration P1, switching elements 18a, 18b, 78b, and 78c continue being turned on, and switching elements 18c to 18f and 78a continue being turned off. In this state, sensing signal S11a output from sensing part 11a of sensing parts 11a, 11b, and 11c is selectively input to input port 16a of amplifier 16 and amplified, but sensing signals S11b and S11c are not input to input port 16a. In other words, amplifier 16 selectively amplifies the detection signal output from sensing signal S11a.

In order to switch from the state in which sensing signal S11a from sensing part 11a is input to input port 16a and amplified in duration P1 to a state in which sensing signal S11b from sensing part 11b is input to input port 16a and amplified in duration P2; first, switching elements 18a and 18b which have been turned on are turned off and switching element 78a which has been turned off is turned on at time point t1 at which duration P1 ends. This operation connects sensing part 11a to the reference potential Vref, terminates the input of sensing signal S11a from sensing part 11a to input port 16a, and stops the amplifying of sensing signal S11a. Subsequently to that, switching elements 18c and 18d which have been turned off are turned on and switching element 78b which has been turned on is turned off at time point t2 at which duration P2 starts. This operation allows sensing signal S11b from sensing part 11b to be selectively input to input port 16a of amplifier 16 and amplified. In other words, amplifier circuit 300 is switched, in duration Pt1 from time point t1 to time point t2, from the state of amplifying sensing signal S11a from sensing part 11a to the state of amplifying sensing signal S11b from sensing part 11b. As described above, sensing signals S11a and S11b can be switched while switching elements 18a to 18d are disposed in feedback loop 17f of amplifier circuit 300. This configuration can reduce the phase shifts of sensing signals S11a and S11b associated with the fluctuation of the ON-resistance values of the switching elements 18a to 18d, hence stabilizing output characteristics of amplifier circuit 300.

In order to switch from the state in which sensing signal S11b from sensing part 11b is input to input port 16a and amplified in duration P2 to a state in which sensing signal S11c from sensing part 11c is input to input port 16a and amplified in duration P3, first, switching elements 18c and 18d which have been turned on are turned off and switching element 78b which has been turned off is turned on at time point t3 at which duration P2 ends.

This operation connects sensing part 11b to the reference potential Vref, terminates the input of sensing signal S11b from sensing part 11b to input port 16a, and stops the amplifying of sensing signal S11b. Subsequently to that, switching elements 18e and 18f which have been turned off are turned on and switching element 78c which has been turned on is turned off at time point t4 at which duration P3 starts. This operation allows sensing signal S11c from sensing part 11c to be selectively input to input port 16a of amplifier 16 and amplified. In other words, in duration Pt2 from time point t3 to time point t4, amplifier circuit 300 is switched from the state of amplifying sensing signal S11b from sensing part 11b to the state of amplifying sensing signal S11c from sensing part 11c. As described above, sensing signals S11b and S11c can be switched while switching elements 18c to 18f are disposed in feedback loop 17f of amplifier circuit 300. This configuration can reduce the phase shifts of sensing signals S11b and S11c associated with the fluctuation of the ON-resistance values of switching elements 18c to 18f, hence stabilizing the output characteristics of amplifier circuit 300.

In order to switch from the state in which sensing signal S11c from sensing part 11c is input to input port 16a and amplified in duration P3 to the state in which sensing signal S11a from sensing part 11a is input to input port 16a and amplified in duration P4, first, switching elements 18e and 18f which have been turned on are turned off and switching element 78c which has been turned off is turned on at time point t5 at which duration P3 ends. This operation connects sensing part 11c to the reference potential Vref, terminates the input of sensing signal S11c from sensing part 11c to input port 16a, and stops the amplifying of sensing signal S11c. Subsequently to that, switching elements 18a and 18b which have been turned off are turned on, and switching element 78a which has been turned on is turned off at time point t6 at which duration P4 starts. This operation allows sensing signal S11a from sensing part 11a to be selectively input to input port 16a of amplifier 16 and amplified. In other words, in duration Pt3 from time point t5 to time point t6, amplifier circuit 300 is switched from the state of amplifying sensing signal S11c from sensing part 11c to the state of amplifying sensing signal S11a from sensing part 11a. As described above, sensing signals S11a and S11c can be switched while switching elements 18a, 18b, 18e, and 18f are disposed in feedback loop 17f of amplifier circuit 300. This configuration can reduce the phase shifts of sensing signals S11a and S11c associated with the fluctuation of the ON-resistance values of switching elements 18a, 18b, 18e, and 18f, hence stabilizing the output characteristics of amplifier circuit 300.

Upon being turned on, switching elements 78a to 78c prevent unwanted electric charges from being accumulated in sensing parts 11a to 11c, respectively, even after switching elements 18a and 18f is switched. Unwanted electric charges accumulated in sensing parts 11a to 11c may induce unwanted vibration modes in sensing parts 11a to 11c. Amplifier circuit 300 can suppress the unwanted vibration modes in sensing parts 11a to 11c, hence allowing inertia sensor 10 to stably operate.

In accordance with Embodiment 2, switching elements 18a and 18f are switched in the order of durations P1, P2, P3, and P4 to selectively amplify sensing signals S11a, S11b, S11c, and S11a; however, this order is not restrictive.

Similarly to the operation shown in FIG. 7B, switch 78a may be switched at a time point different from the time point at which switches 18a and 18b are switched. Switch 78b may be switched at a time point different from the time point at which switches 18c and 18d are switched. Switch 78c may be switched at a time point different from a time point at which switches 18e and 18f are switched.

Figure 20:
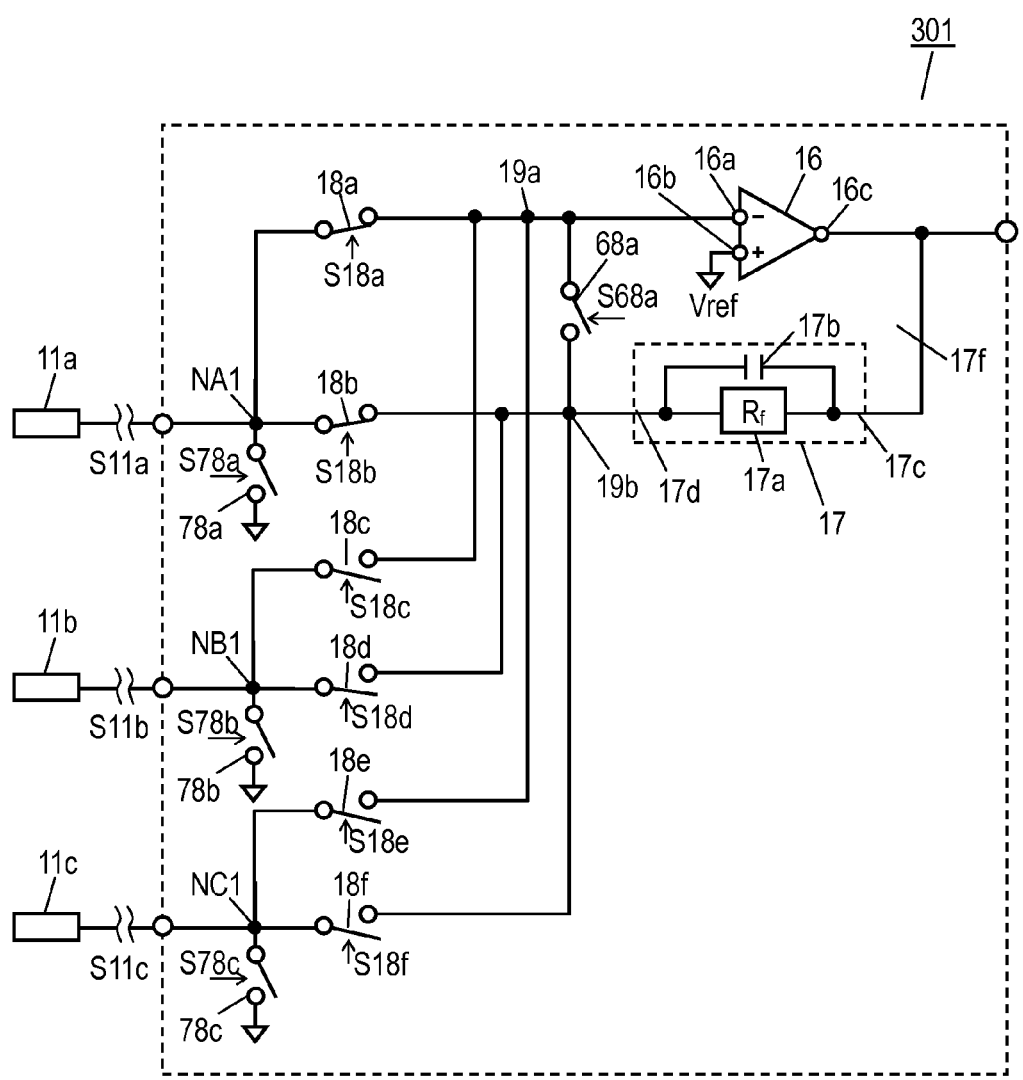
FIG. 20 is a circuit block diagram of a further amplifier circuit of the inertia sensor in accordance with Embodiment 2.

FIG. 20 is a circuit block diagram of further amplifier circuit 301 of inertia sensor 10 in accordance with Embodiment 2. In FIG. 20, components identical to those of amplifier circuits 100, 200, and 300 shown in FIGS. 12, 16, and 18 are denoted by the same reference numerals. Amplifier circuit 301 shown in FIG. 20 includes amplifier circuit 100 shown in FIG. 12 and further includes switching element 68a of amplifier circuit 200 shown in FIG. 16 and switching elements 78a, 78b, and 78c of amplifier circuit 300 shown in FIG. 18.

Figure 21:
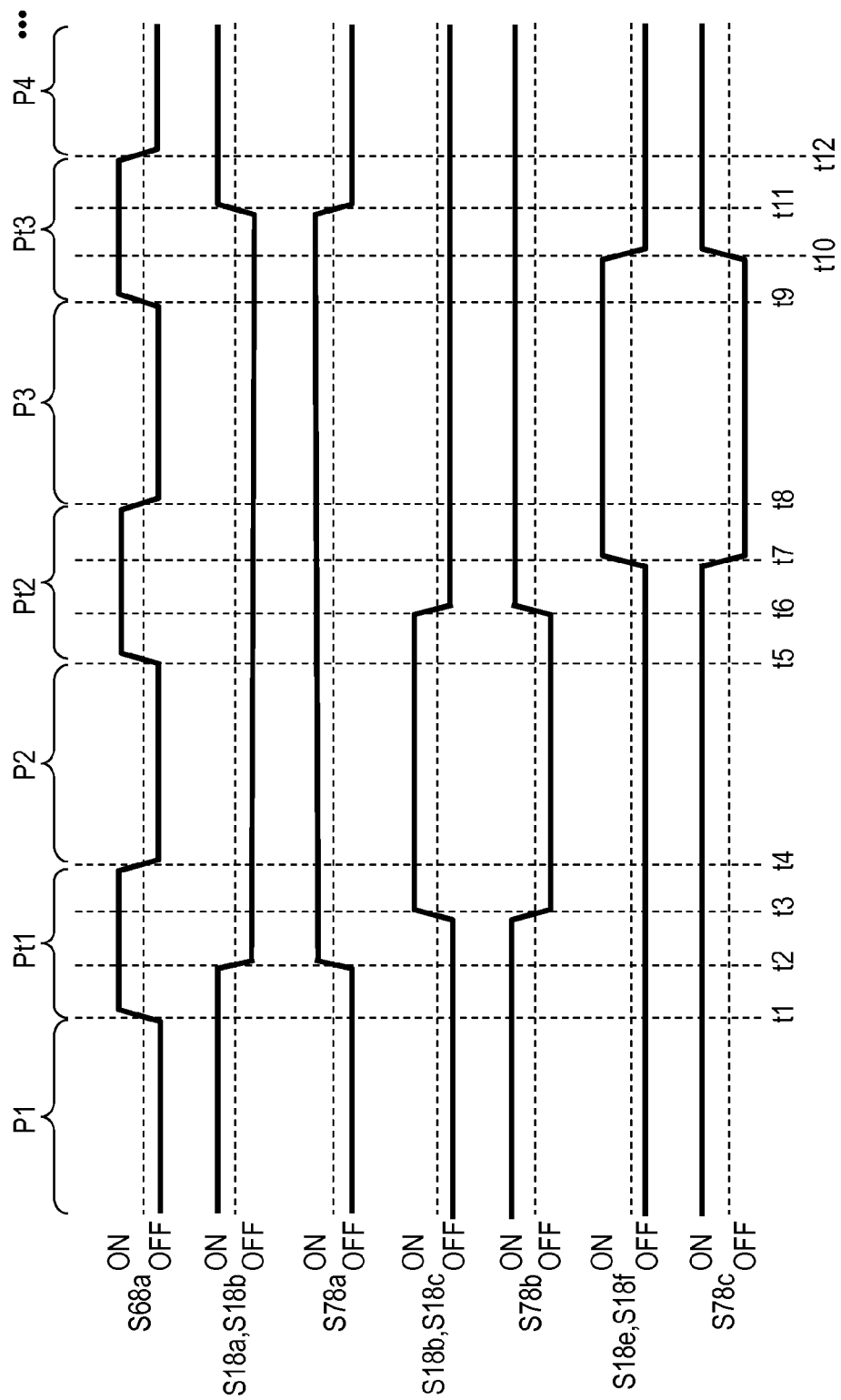
FIG. 21 shows signal waveforms of the amplifier circuit shown in FIG. 20.

An operation of amplifier circuit 301 will be described below. FIG. 21 shows signal waveforms of amplifier circuit 301 and illustrates control signal S18a to S18f, S68a, and S78a to S78c supplied to switching elements 18a to 18f, 68a, and 78a to 78c, respectively. In FIG. 21, the horizontal axis represents time, and the vertical axis represents levels of control signal S18a to S18f, S68a, and S78a to S78c. The levels of control signal S18a to S18f, S68a, and S78a to S78c consist of a level "ON" to turn on respective switching elements 18a to 18f, 68a, and 78a to 78c and of a level "OFF" to turn off respective switching elements 18a to 18f, 68a, and 78a to 78c.

Amplifier 16 selectively amplifies sensing signals S11a, S11b, and S11c from sensing parts 11a, 11b, and 11c in durations P1, P2, and P3, respectively. Amplifier 16 selectively amplifies sensing signal S11a from sensing part 11a again in duration P4.

In duration P1, switching elements 18a, 18b, 78b, and 78c continue being turned on, and switching elements 18c to 18f, 68a, and 78a continue being turned off. In this state, sensing signal S11a output from sensing part 11a of sensing parts 11a, 11b, and 11c is selectively input to input port 16a of amplifier 16 and is amplified, but sensing signals S11b and S11c are not input to input port 16a. In other words, in this state, amplifier 16 selectively amplifies sensing signal S11a.

In order to switch from the state in which sensing signal S11a from sensing part 11a is input to input port 16a of amplifier 16 and amplified in duration P1 to a state in which sensing signal S11b from sensing part 11b is input to input port 16a and amplified in duration P2, switching element 68a which has been turned off is first turned on at time point t1 at which duration P1 ends. Subsequently to that, at time point t2, switching elements 18a and 18b which have been turned on are turned off, and simultaneously, switching element 78a which has been turned off is turned on. This operation terminates the input of sensing signal S11a from sensing part 11a to input port 16a, and stops the amplifying of sensing signal S11a. Subsequently to that, at time point t3, switching elements 18c and 18d which have been turned off are turned on, and switching element 78b which has been turned on is turned off. Then, switching element 68a which has been turned on is turned off at time point t4 at which duration P2 starts. This operation allows sensing signal S11b from sensing part 11b to be selectively input to input port 16a of amplifier 16 and amplified. In other words, amplifier circuit 301 is switched, in duration Pt1 from time point t1 to time point t4, from the state of amplifying sensing signal S11a from sensing part 11a to the state of amplifying sensing signal S11b from sensing part 11b. The configuration in which switching elements 18a to 18d are disposed in feedback loop 17f can reduce the phase shift of a current associated with the fluctuation of the ON-resistance values of switching elements 18a to 18d, hence stabilizing characteristics of amplifier circuit 60. Further, in amplifier circuit 301, the switching operation can be performed without opening feedback loop 17f in duration Pt1. Upon opening, feedback loop 17f may change the output rapidly, and prevent the inertial force from being detected accurately until the change becomes small. Amplifier circuit 301 can shorten the duration in which output accuracy is reduced.

In order to switch from the state in which sensing signal S11b from sensing part 11b is input to input port 16a of amplifier 16 and amplified in duration P2 to a state in which sensing signal S11c from sensing part 11c is input to input port 16a and amplified in duration P3, switching element 68a which has been turned off is first turned on at time point t5 at which duration P2 ends. Subsequently to that, at time point t6, switching elements 18c and 18d which have been turned on are turned off, and simultaneously, switching element 78b which has been turned off is turned on. This operation terminates the input of sensing signal S11b from sensing part 11b to input port 16a, and stops the amplifying of sensing signal S11b. Subsequently to that, at time point t1, switching elements 18e and 18f which have been turned off are turned on, and switching element 78c which has been turned on is turned off. Subsequently to that, switching element 68a which has been turned on is turned off at time point t8 at which duration P3 starts. This operation allows sensing signal S11c from sensing part 11c to be selectively input to input port 16a of amplifier 16 and amplified. In other words, in duration Pt2 from time point t5 to time point t8, amplifier circuit 301 is switched from the state of amplifying sensing signal S11b from sensing part 11b to the state of amplifying sensing signal S11c from sensing part 11c. The configuration in which switching elements 18c to 18f are disposed in feedback loop 17f can reduce the phase shift of a current associated with the fluctuation of the ON-resistance values of switching elements 18c to 18f, hence stabilizing output characteristics of amplifier circuit 301. Further, in amplifier circuit 301, the switching operation can be performed without opening feedback loop 17f in duration Pt2. Upon opening, feedback loop 17f may change the output rapidly, and prevent the inertial force from being detected accurately until the change becomes small. Amplifier circuit 301 can shorten the duration in which output accuracy is reduced.

In order to switch from the state in which sensing signal S11c from sensing part 11c is input to input port 16a of amplifier 16 and amplified in duration P3 to the state in which sensing signal S11a from sensing part 11a is input to input port 16a and amplified in duration P4, switching element 68a which has been turned off is first turned on at time point t9 at which duration P3 ends. Subsequently to that, at time point t10, switching elements 18e and 18f which have been turned on are turned off, and simultaneously, switching element 78c which has been turned off is turned on. This operation terminates the input of sensing signal S11c from sensing part 11c to input port 16a, and stops the amplifying of sensing signal S11c. Subsequently to that, at time point t11, switching elements 18a and 18b which have been turned off are turned on, and switching element 78a which has been turned on is turned off. Then, switching element 68a which has been turned on is turned off at time point t12 at which duration P4 starts. This operation allows sensing signal S11a from sensing part 11a to be selectively input to input port 16a of amplifier 16 and amplified. In other words, in duration Pt3 from time point t9 to time point t12, amplifier circuit 301 is switched from the state of amplifying sensing signal S11c from sensing part 11c to the state of amplifying sensing signal S11a from sensing part 11a. The configuration in which switching elements 18a, 18b, 18e, and 18f are disposed in feedback loop 17f can reduce the phase shift of a current associated with the fluctuation of the ON-resistance values of switching elements 18a, 18b, 18e, and 18f, hence stabilizing the output characteristics of amplifier circuit 301. Further, in amplifier circuit 301, the switching operation can be performed without opening feedback loop 17f in duration Pt3. Upon opening, feedback loop 17f may change the output rapidly, and prevent the inertial force from being detected accurately until the change becomes small. Amplifier circuit 301 can shorten the duration in which output accuracy is reduced.

Upon being turned on, switching elements 78a to 78c discharge the unwanted electric charges accumulated in sensing parts 11a to 11c. This configuration prevents the unwanted vibration modes from induced in sensing parts 11a to 11c, hence allowing inertia sensor 10 to operate stably.

Switching element 68a may be replaced by variable resistor 68b of amplifier circuit 61 in accordance with Embodiment 1 shown in FIG. 10, providing the same effects.

Similarly to the operation shown in FIG. 7B, switch 78a may be switched at a time point different from the time point at which switches 18a and 18b are switched. Switch 78b may be switched at a time point different from the time point at which switches 18c and 18d are switched. Switch 78c may be switched at a time point different from the time point at which switches 18e and 18f are switched.

Figure 22:
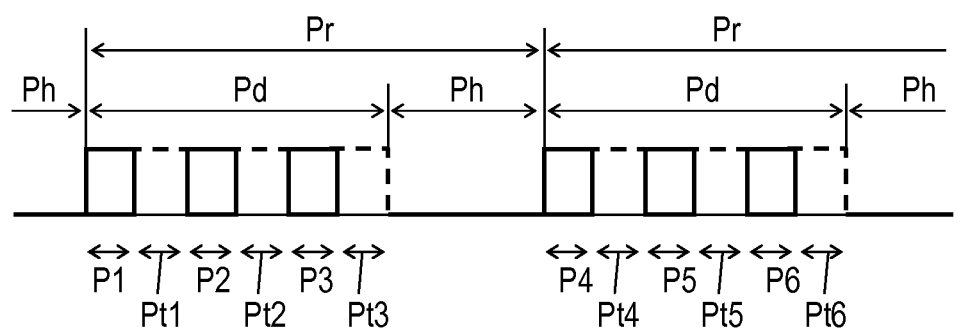
FIG. 22 shows a signal waveform of the inertia sensor in accordance with Embodiment 2.

FIG. 22 shows a signal waveform of amplifier circuits 100, 200, 300, and 301 in accordance with Embodiment 2. In FIG. 22, items identical to those of the signal waveforms of amplifier circuits 100, 200, 300, and 301 shown in FIGS. 15, 17, 19, and 21 are denoted by the same reference numerals. Amplifier 16 selectively amplifies sensing signals S11a, S11b, and S11c from sensing parts 11a, 11b, and 11c in durations P1, P2, and P3, respectively. Amplifier 16 selectively amplifies sensing signals S11a, S11b, and S11c from sensing parts 11a, 11b, and 11c in durations P4, P5, and P6, respectively, after duration P3. This operation allows inertia sensor 10 (FIG. 1) to output signals corresponding to the values of the components corresponding to sensing signals S11a, S11b, and S11c of the inertial force applied to sensor element 21 in durations P1, P2, and P3, respectively. Amplifier 16 outputs the signals corresponding to the values of the components corresponding to sensing signals S11a, S11b, and S11c of the inertial force applied to sensor element 21 in durations P4, P5, and P6, respectively. In detail, in durations P1 to P6, after a certain settling time lapses after the start of each duration, the signal corresponding to the value of each component of the inertial force is output. The settling time depends on a delay time, such as a time required for sampling on an A/D converter constituting each circuit of inertia sensor 10 and such as a response time of an analog circuit. The durations P1 to PG are determined based on the settling time and specifications of devices coupled to inertia sensor 10. Before the signal of the values corresponding to three sensing signals S11a, S11b, and S11c are output, duration Pd which is the total of the sum of durations P1 to P3 and the sum of durations Pt1 to Pt3 in which sensing parts 11a to 11c are switched is necessary. Output rate $F_0$ at which inertia sensor 10 outputs values corresponding to a set of sensing signals S11a to S11c satisfies the following formula:

$F_0 \leq 1/(P1+Pt1+P2+Pt2+P3+Pt3)=1/Pd.$

That is, duration Pr from a certain time point when a set of signals corresponding to sensing signals S11a to S11c are output to the next time point when a set of signals corresponding to sensing signals S11a to S11c satisfies the following formula:

$Pr=1/F_0 \geq Pd.$

In the above case, duration Ph (=Pr−Pd) in which no signal is output from inertia sensor 10 is produced. In duration Ph, inertia sensor 10 may reduce or stop electric power supplied to detection circuit 15 and phase shifter 12e of drive circuit 12, and may supply electric power only to a circuit, such as drive circuit 12, that maintains the driving vibration of vibrator 11 of sensor element 21. This operation reduces power consumption of inertia sensor 10.

Exemplary Embodiment 3

Figure 23:
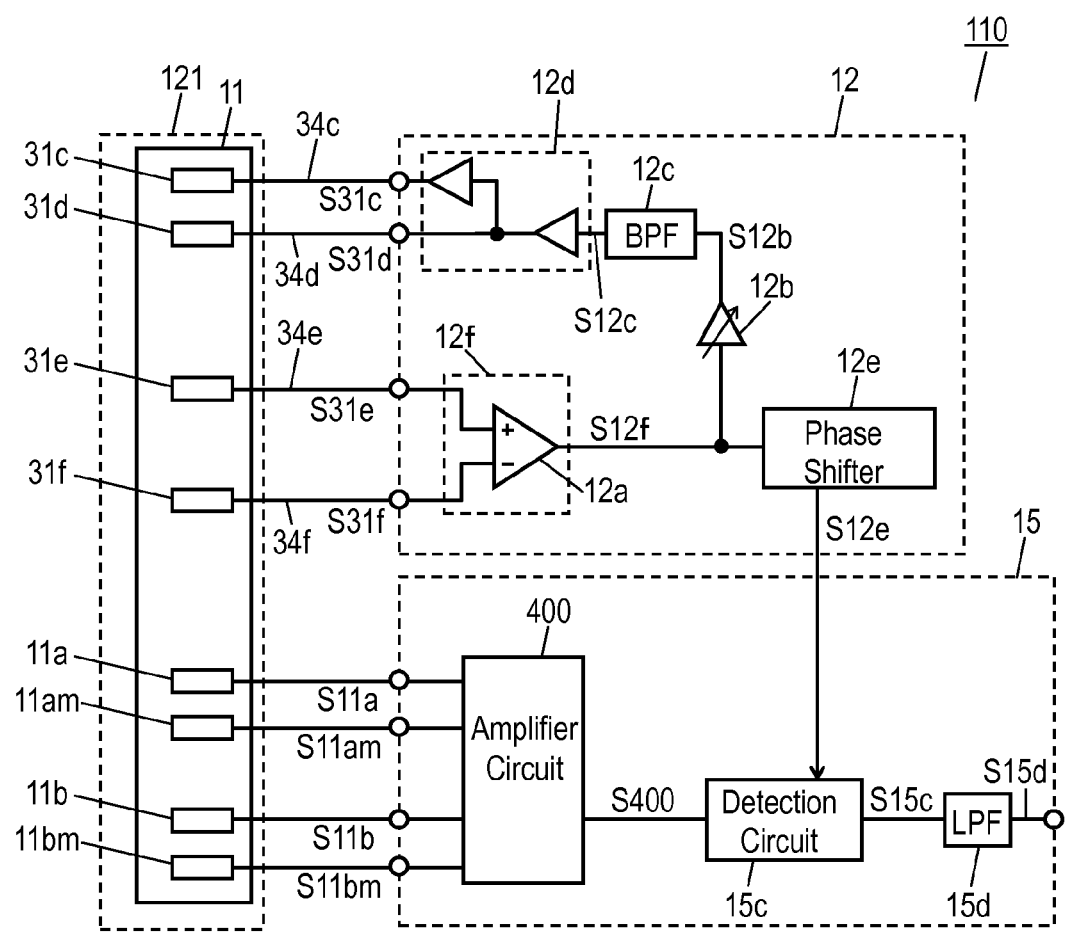
FIG. 23 is a schematic diagram of an inertia sensor in accordance with Exemplary Embodiment 3 of the present disclosure.

FIG. 23 is a schematic diagram of inertia sensor 110 in accordance with Exemplary Embodiment 3 of the present disclosure. In FIG. 23, components identical to those of inertia sensor 10 in accordance with Embodiment 1 shown in FIG. 1 are denoted by the same reference numerals. Inertia sensor 110 shown in FIG. 23 includes sensor element 121 and amplifier circuit 400 instead of sensor element 21 and amplifier circuit 15a of inertia sensor 10 shown in FIG. 1. Similarly to inertia sensor 10 in accordance with Embodiment 1, in inertia sensor 110 in accordance with Embodiment 3, detection circuit 15c synchronously detects a sensing signal output from amplifier circuit 400 and outputs a detection signal S15c.

Sensor element 121 includes components of sensor element 21 shown in FIG. 1 and further includes sensing parts 11am and 11bm provided on vibrator 11. Sensing parts 11a and 11am are arranged at positions symmetrical to each other with respect to a neutral axis of the driving vibration of vibrator 11. Sensing parts 11b and 11bm are arranged at positions symmetrical to each other with respect to the neutral axis. One part out of parts of vibrator 11 separated by the neutral axis is compressed by the driving vibration, and the other part is expanded. A positive electric charge is generated in the sensing part disposed on the part of sensing parts 11a and 11am being compressed by the driving vibration of vibrator 11 while a negative electric charge is generated in the sensing part disposed on the part being stretched; therefore, sensing signals S11a and S11am output from sensing parts 11a and 11am have amplitude identical to each other and have polarities opposite to each other. Similarly, sensing signals S11b and S11bm output from sensing parts 11b and 11bm due to the driving vibration of vibrator 11 have amplitude identical to each other and have polarities opposite to each other.

Figure 24:
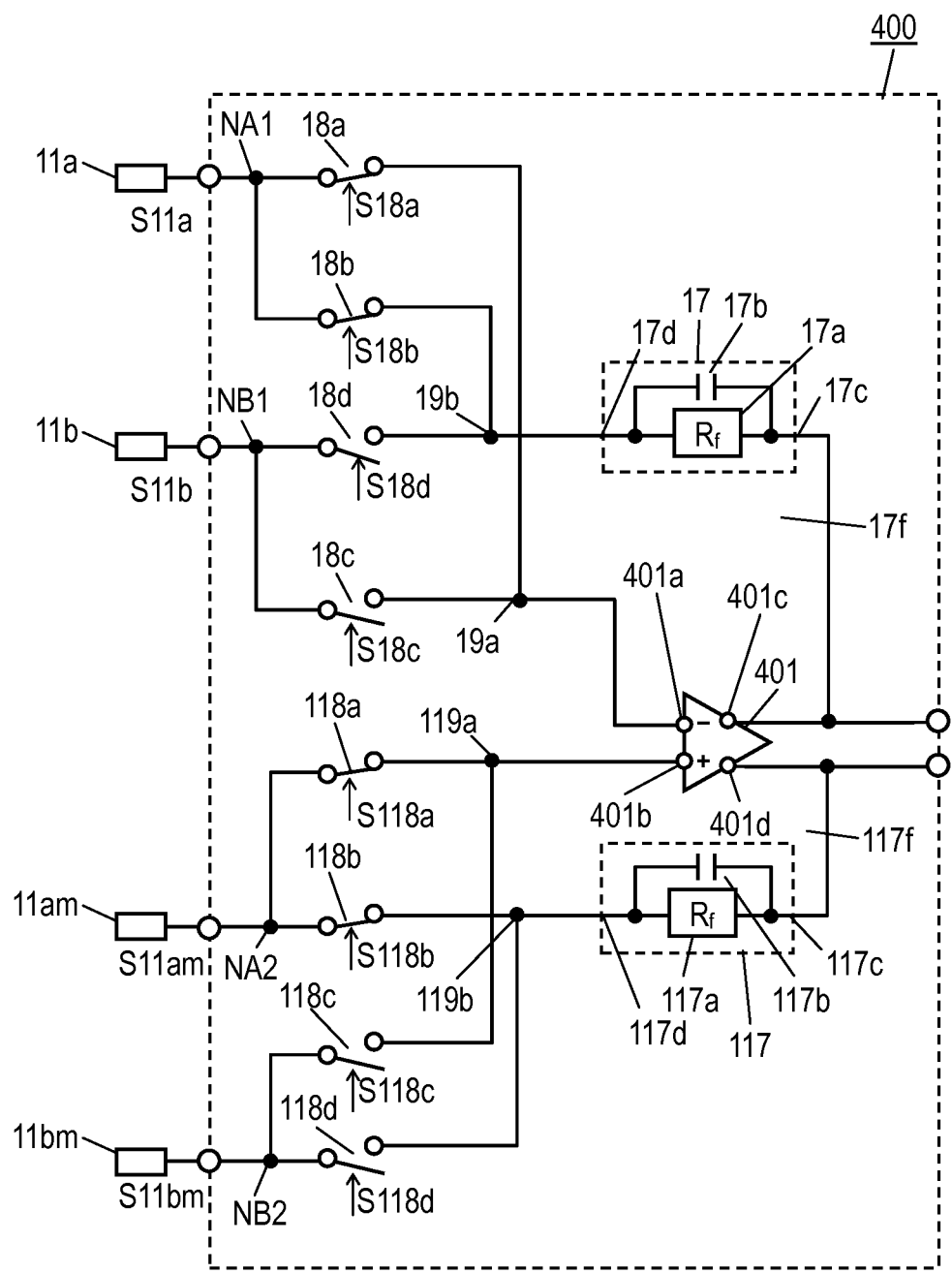
FIG. 24 is a circuit block diagram of an amplifier circuit of the inertia sensor in accordance with Embodiment 3.

FIG. 24 is a circuit block diagram of amplifier circuit 400. In FIG. 24, components identical to those of amplifier circuit 15a in accordance with Embodiment 1 shown in FIG. 2 are denoted by the same reference numerals. Amplifier circuit 400 includes amplifier 401 instead of amplifier 16 of amplifier circuit 15a shown in FIG. 2, and further includes feedback circuit unit 117. Amplifier 401 is a fully-differential amplifier having input port 401a which is an inverting input terminal, input port 401b which is a non-inverting input terminal, output port 401c which is a non-inverting output port, and output port 401d which is an inverting output port. Input ports 401a and 401b and output port 401c of amplifier 401 have the same functions as input ports 16a and 16b and output port 16c of amplifier 16 in accordance with Embodiment 1 shown in FIG. 2, respectively. Fully-differential amplifier 401 allows amplifier circuit 400 to detect an inertial force, such as angular velocity, applied to sensor element 121, based on the difference between sensing signals S11a and S11am, and to detect an inertial force, such as angular velocity, applied to sensor element 121, based on the difference between sensing signals S11b and S11bm.

Similarly to feedback circuit unit 17, feedback circuit unit 117 includes feedback resistor 117a connected in series between ends 117c and 117d and feedback capacitor 117b connected in parallel to feedback resistor 117a. Feedback circuit units 17 and 117 are connected in parallel to amplifier 401. Ends 17c and 117c of feedback circuit unit 17 and 117 are connected to output ports 401c and 401d of amplifier 401, respectively.

Amplifier circuit 400 further includes switching elements 118a to 118d. Switching element 18a is disposed between sensing part 11a and input port 401a of amplifier 401. Switching element 18b is disposed between sensing part 11a and end 17d of feedback circuit unit 17. Switching element 118a is disposed between sensing part 11am and input port 401b of amplifier 401. Switching element 118b is disposed between sensing part 11am and end 117d of feedback circuit unit 117. Switching element 18c is disposed between sensing part 11b and input port 401a of amplifier 401. Switching element 18d is disposed between sensing part 11b and end 17d of feedback circuit unit 17. Switching element 118c is disposed between sensing part 11bm and input port 401b of amplifier 401. Switching element 118d is disposed between sensing part 11bm and end 117d of feedback circuit unit 117. In detail, sensing part 11a is connected to switching elements 18a and 18b at node NA1. Sensing part 11b is connected to switching elements 18c and 18d at node NB1. Sensing part 11am is connected to switching elements 118a and 118b at node NA2. Sensing part 11bm is connected to switching elements 118c and 118d at node NB2. Switching elements 18a and 18c are connected to input port 401a of amplifier 401 at node 19a. Switching elements 18b and 18d are connected to end 17d of feedback circuit unit 17 at node 19b. Switching elements 118a and 118c are connected to input port 401b of amplifier 401 at node 119a. Switching elements 118b and 118d are connected to end 117d of feedback circuit unit 117 at node 119b. That is, switching element 18a is connected between nodes NA1 and 19a. Switching element 18b is connected between nodes NA1 and 19b. Switching element 18c is connected between nodes NB1 and 19a. Switching element 18d is connected between nodes NB1 and 19b. Switching element 118a is connected between nodes NA2 and 119a. Switching element 118b is connected between nodes NA2 and 119b. Switching element 118c is connected between nodes NB2 and 119a. Switching element 118d is connected between nodes NB2 and 119b. Feedback circuit unit 17 is connected between input port 401a and output port 401c of amplifier 401 via switching elements 18a to 18d, thereby constituting feedback loop 17f. Feedback circuit unit 117 is connected between input port 401b and output port 401d of amplifier 401 via switching elements 118a to 118d, thereby constituting feedback loop 117f.

Figure 25:
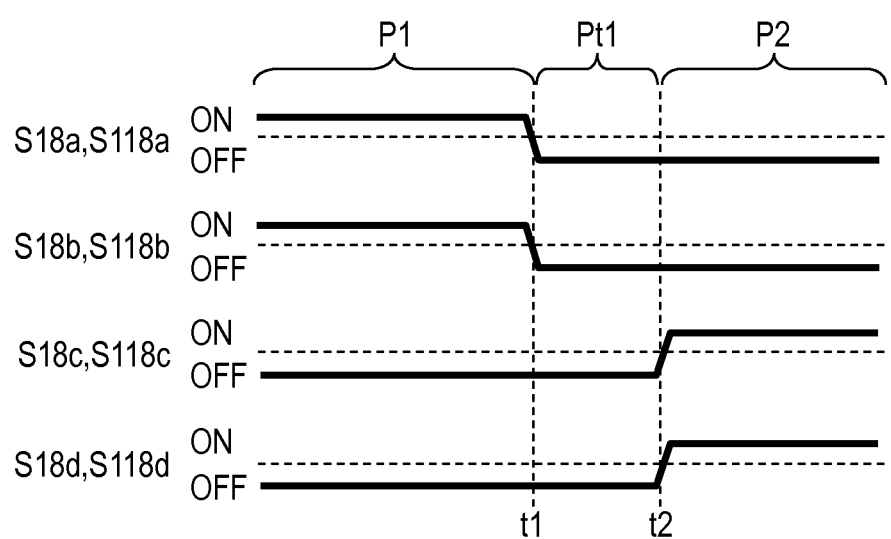
FIG. 25 shows signal waveforms of the amplifier circuit shown in FIG. 24.

An operation of amplifier circuit 400 will be described below. FIG. 25 shows signal waveforms of amplifier circuit 400 and illustrates control signals S18a to S18d and S118a to S118d supplied to switching elements 18a to 18d and 118a to 118d, respectively. In FIG. 25, the horizontal axis represents time, and the vertical axis represents levels of control signal S18a to S18d and S118a to S118d. The levels of control signal S18a to S18d and S118a to S118d consist of a level "ON" to turn on respective switching elements 18a to 18d and 118a to 118d and of a level "OFF" to turn off respective switching elements 18a to 18d and 118a to 118d. When control signal S18a and S18b are at the level "OFF" to turn off switching elements 18a and 18b, switching elements 18a and 18b may connect sensing part 11a to a reference potential Vref. Further, when control signal S18c and S18d are at the level "OFF" to turn off switching elements 18c and 18d, switching elements 18c and 18d may connect sensing part 11b to reference potential Vref. Further, when control signal S118a and S118b are at a level "OFF" to turn off switching elements 118a and 118b, switching elements 118a and 118b may connect sensing part 11am to a reference potential Vref. Further, when control signal S118c and S118d are at a level "OFF" to turn off switching elements 118c and 118d, switching elements 118c and 118d may connect sensing part 11bm to the reference potential Vref.

Amplifier 401 amplifies the difference between sensing signals S11a and S11am from sensing parts 11a and 11am in duration P1, and amplifies the difference between sensing signals S11b and S11bm from sensing parts 11b and 11bm in duration P2.

In duration P1, switching elements 18a, 18b, 118a, and 118b continue being turned on, and switching elements 18c, 18d, 118c, and 118d continue being turned off. In this state, sensing signal S11a output from sensing part 11a out of sensing parts 11a and 11b is selectively input to input port 401a of amplifier 401, sensing signal S11am output from sensing part 11am out of sensing parts 11am and 11bm is selectively input to input port 401b of amplifier 401, and amplifier 401 amplifies a signal of the difference between sensing signals S11a and S11am. At this moment, sensing signals S11b and S11bm from sensing parts 11b and 11bm are not input to input ports 401a and 401b of amplifier 401.

In order to switch from the state in which the difference between sensing signals S11a and S11am from sensing parts 11a and 11am is amplified in duration P1 to a state in which the difference between sensing signals S11b and S11bm from sensing parts 11b and 11bm is amplified in duration P2, switching elements 18a, 18b, 118a, and 118b which have been turned on are first turned off at time point t1 at which duration P1 ends. This operation terminates the input of sensing signals S11a and S11am from sensing parts 11a and 11am to input ports 401a and 401b of amplifier 401, and stops the amplifying of the difference between sensing signals S11a and S11am. Subsequently to that, switching elements 18c, 18d, 118c, and 118d which have been turned off are turned on at time point t2 at which duration P1 starts. This operation, in duration P2, allows sensing signals S11b and S11bm from sensing parts 11b and 11bm to be selectively input to input ports 401a and 401b of amplifier 401, respectively, to allow the difference between sensing signals S11b and S11bm to be amplified. In other words, in duration Pt1 from time point t1 to time point t2, amplifier circuit 400 is switched from the state of amplifying the difference between sensing signals S11a and S11am from sensing parts 11a and 11am to the state of amplifying the difference between sensing signals S11b and S11bm from sensing parts 11b and 11bm. As described above, sensing signals S11a, S11am, S11b, and S11bm can be switched while switching elements 18a to 18d are disposed in feedback loop 17f of amplifier circuit 400 and switching elements 118a to 118d are disposed in feedback loop 117f.

The configuration in which switching elements 18a to 18d are disposed in feedback loop 17f and switching elements 118a to 118d are disposed in feedback loop 117f can reduce the phase shifts of the sensing signals associated with the fluctuation of ON-resistance values of switching elements 18a to 18d and 118a to 118d, hence stabilizing output characteristics of amplifier circuit 400 and suppressing generation of unwanted signals.

Figure 26:
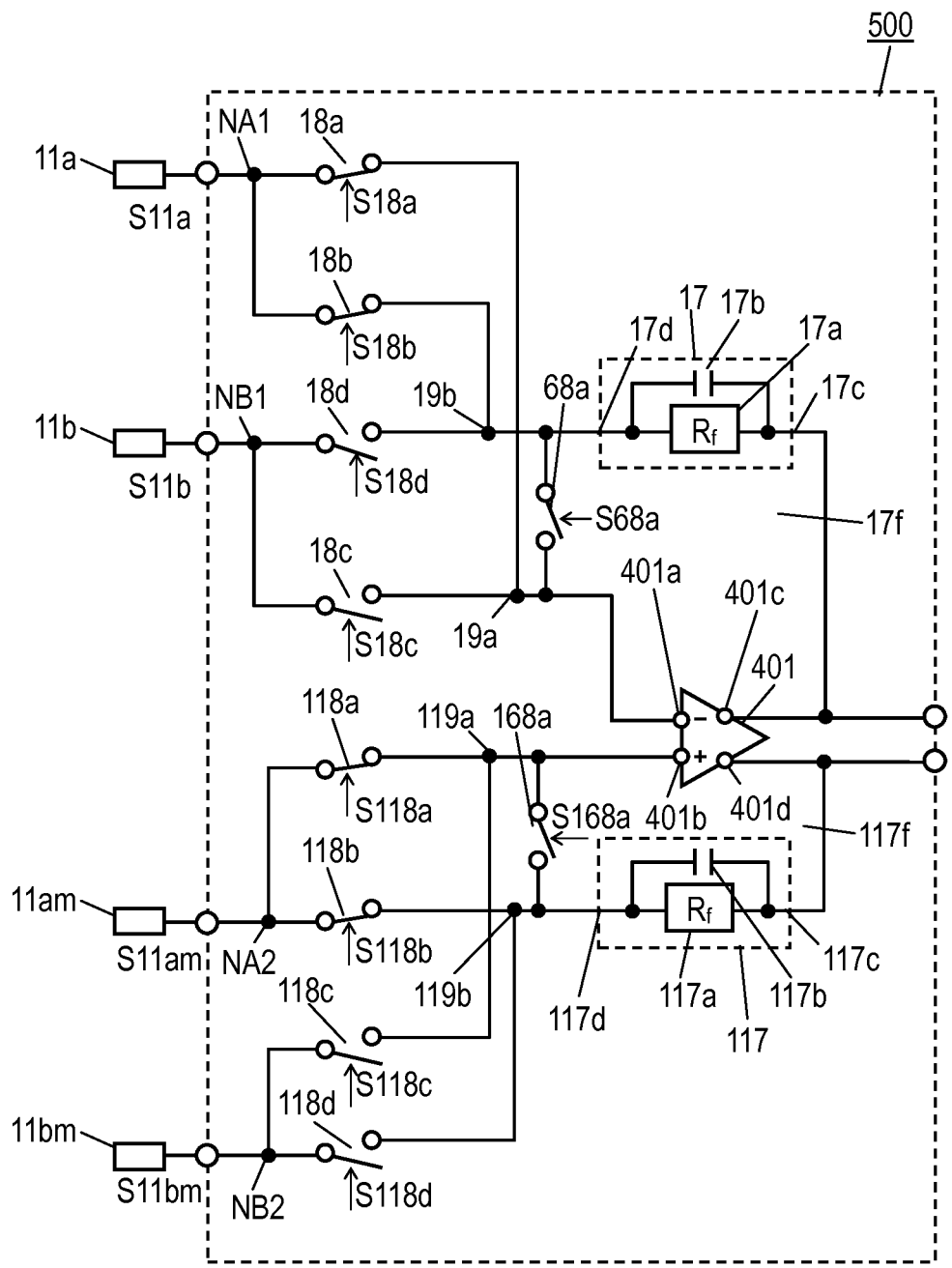
FIG. 26 is a circuit block diagram of still another amplifier circuit of the inertia sensor in accordance with Embodiment 3.

FIG. 26 is a circuit block diagram of another amplifier circuit 200 in accordance with Embodiment 3. In FIG. 26, components identical to those of amplifier circuit 400 shown in FIG. 24 and amplifier circuit 60 in accordance with Embodiment 1 shown in FIG. 4 are denoted by the same reference numerals. Amplifier circuit 500 shown in FIG. 26 includes amplifier circuit 100 shown in FIG. 12 and further includes switching elements 68a and 168a. Switching element 68a is connected between nodes 19a and 19b. Switching element 168a is connected between nodes 119a and 119b.

Figure 27:
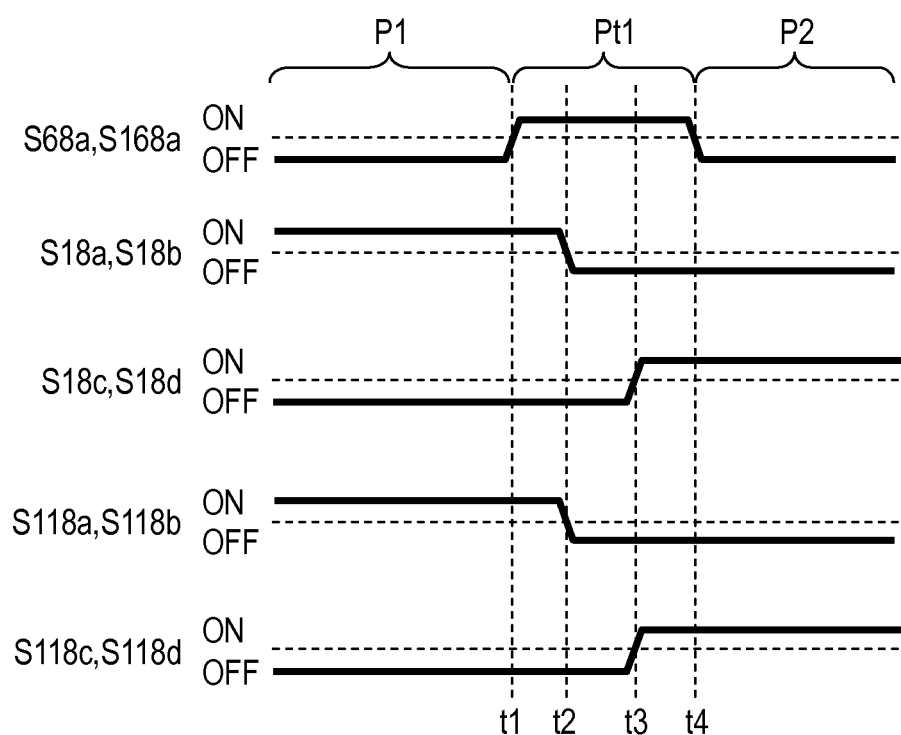
FIG. 27 shows signal waveforms of the amplifier circuit shown in FIG. 26.

An operation of amplifier circuit 500 will be described below. FIG. 27 shows signal waveforms of amplifier circuit 500 and illustrates control signals S18a to S18d, S118a to S118d, S68a, and S168a supplied to switching elements 18a to 18d, 118a to 118d, 68a, and 168a, respectively. In FIG. 27, the horizontal axis represents time, and the vertical axis represents levels of control signal S18a to S18d, S118a to S118d, S68a, and S168a. The levels of control signal S18a to S18d, S118a to S118d, S68a, and S168a consist of a level "ON" to turn on respective switching elements 18a to 18d, 118a to 118d, 68a, and 168a and of a level "OFF" to turn off respective switching elements 18a to 18d, 118a to 118d, 68a, and 168a. Switching elements 18a and 18b may connect sensing part 11a to the reference potential Vref when switching elements 18a and 18b are turned off. Switching elements 18c and 18d may connect sensing part 11b to the reference potential Vref when switching elements 18c and 18d are turned off. Switching elements 118a and 118b may connect sensing part 11am to the reference potential Vref when switching elements 118a and 118b are turned off. Switching elements 118c and 118d may connect sensing part 11bm to the reference potential Vref when switching elements 118c and 118d are turned off.

Amplifier 401 amplifies the difference between sensing signals S11a and S11am from sensing parts 11a and 11am in duration P1, and amplifies the difference between sensing signals S11b and S11bm from sensing parts 11b and 11bm in duration P2.

In duration P1, switching elements 18a, 18b, 118a, and 118b continue being turned on, and switching elements 18c, 18d, 68a, 118c, 118d, and 168a continue being turned off. In this state, sensing signal S11a output from sensing part 11a out of sensing parts 11a and 11b is selectively input to input port 401a of amplifier 401, sensing signal S11am output from sensing part 11am out of sensing parts 11am and 11bm is selectively input to input port 401b of amplifier 401, and amplifier 401 amplifies the difference between sensing signals S11a and S11am. At this moment, sensing signals S11b and S11bm from sensing parts 11b and 11bm are not input to input ports 401a and 401b of amplifier 401.

In order to switch from the state in which the difference between sensing signals S11a and S11am from sensing parts 11a and 11am is amplified in duration P1 to the state in which the difference between sensing signals S11b and S11bm from sensing parts 11b and 11bm is amplified in duration P2, switching elements 68a and 168a which have been turned off are first turned on at time point t1 at which duration P1 ends. Subsequently to that, at time point t2, switching elements 18a, 18b, 118a, and 118b which have been turned on are turned off. This operation connects sensing parts 11a and 11am to the reference potential Vref and terminates the input of sensing signals S11a and S11am from sensing parts 11a and 11am to input ports 401a and 401b of amplifier 401, and stops the amplifying of the difference between sensing signals S11a and S11am. Subsequently to that, at time point t3, switching elements 18c, 18d, 118c, and 118d which have been turned off are turned on. Subsequently to that, at time point t4, switching elements 68a and 168a which have been turned on are turned off. This operation, in duration P2, allows sensing signals S11b and S11bm from sensing parts 11b and 11bm to be selectively input to input ports 401a and 401b of amplifier 401, respectively, and allows the difference between sensing signals S11b and S11bm to be amplified. In other words, in duration Pt1 from time point t1 to time point t4, amplifier circuit 500 is switched from the state of amplifying the difference between sensing signals S11a and S11am from sensing parts 11a and 11am to the state of amplifying the difference between sensing signals S11b and S11bm from sensing parts 11b and 11bm. As described above, sensing signals S11a, S11b, S11am, and S11bm can be switched while switching elements 18a to 18d are disposed in feedback loop 17f of amplifier circuit 500 and switching elements 118a to 118d are disposed in feedback loop 117f.

This configuration in which switching elements 18a to 18d are disposed in feedback loop 17f and switching elements 118a to 118d are disposed in feedback loop 117f can reduce the phase shifts of the currents which are sensing signals S11a, S11b, S11am, and S11bm associated with the fluctuation of the ON-resistance values of switching elements 18a to 18d and 118a to 118d. This operation stabilizes output characteristics of amplifier circuit 500, and suppresses generation of unwanted signals. Further, the switching operations can be performed while feedback loops 17f and 117f are closed in duration Pt1. Upon opening, feedback loops 17f and 117f may cause rapid fluctuation of the output, and prevent the inertial force from being detected accurately in a period before this fluctuation becomes small; however, amplifier circuit 500 can thus shorten a period in which output accuracy is reduced.

Figure 28:
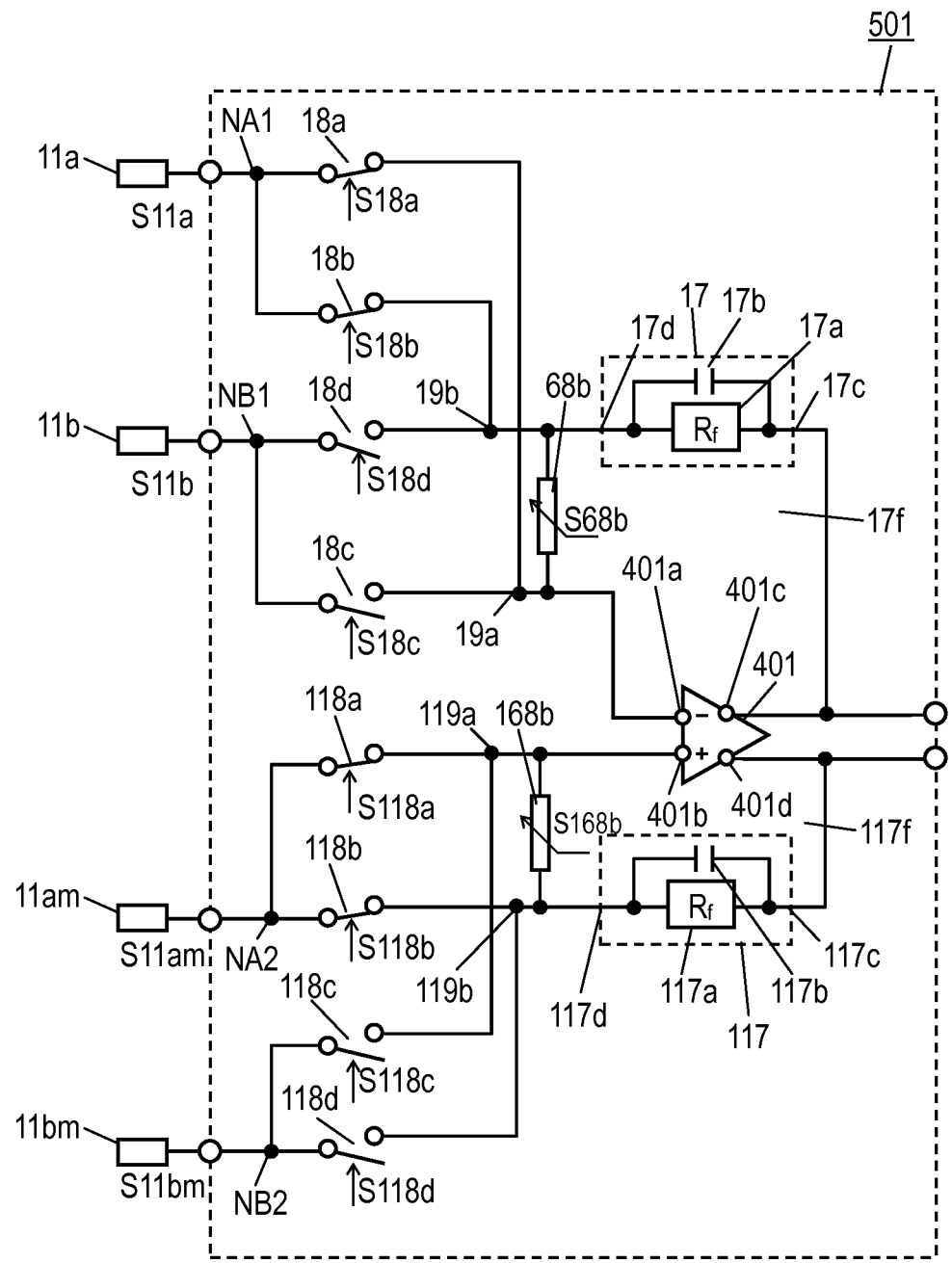
FIG. 28 is a circuit block diagram of a further amplifier circuit of the inertia sensor in accordance with Embodiment 3.

FIG. 28 is a circuit block diagram of still another amplifier circuit 501 of inertia sensor 110 in accordance with Embodiment 3. In FIG. 28, components identical to those of amplifier circuit 500 shown in FIG. 26 and amplifier circuit 61 in accordance with Embodiment 1 shown in FIG. 10 are denoted by the same reference numerals. Amplifier circuit 501 includes variable resistor 68b connected between nodes 19a and 19b and variable resistor 168b connected between nodes 119a and 119b, instead of switching elements 68a and 168a of amplifier circuit 500 shown in FIG. 26.

Switching elements 68a and 168a implemented by semiconductor elements, such as FETs, of amplifier circuit 500 shown in FIG. 26 are regarded as variable resistors which have very small resistance values while being turned on, and have very large resistance values while being turned off. In amplifier circuit 501 shown in FIG. 28, control signals S68b and S168b switch the resistance values of variable resistors 68b and 168b between low resistance values and high resistance values higher than the low resistance values instead of switching elements 68a and 168a. The high resistance values of variable resistors 68b and 168b are not smaller than the resistance values of switching elements 68a and 168a which are turned off in amplifier circuit 500 shown in FIG. 23. In this arrangement, amplifier circuit 501 can amplify the difference between sensing signals S11a and S11am and the difference between sensing signals S11b and S11bm similarly to amplifier circuit 500 shown in FIG. 26.

Figure 29:
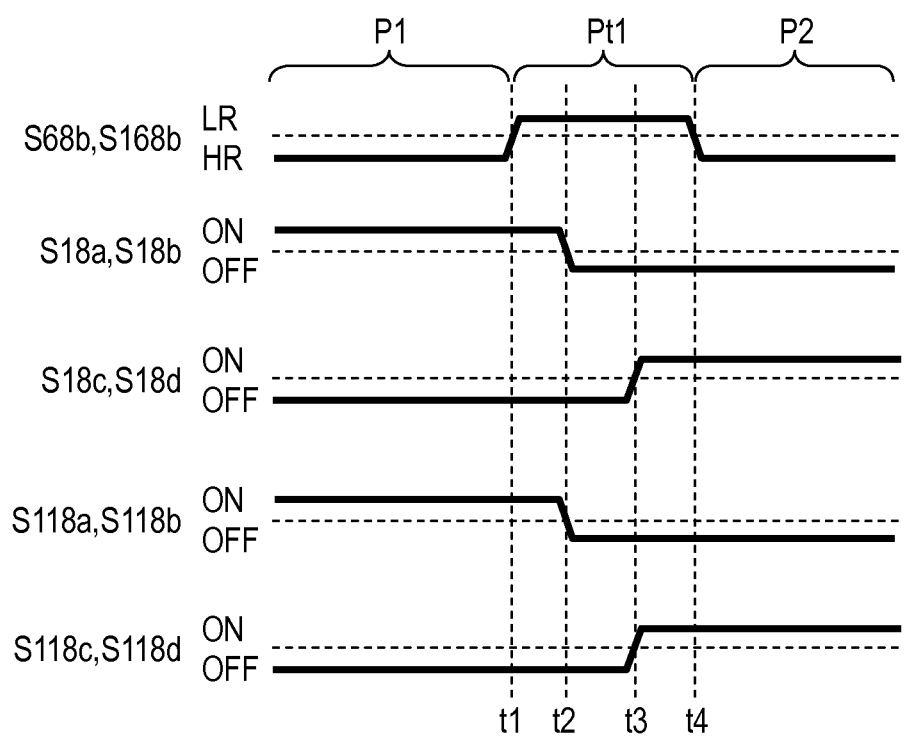
FIG. 29 shows signal waveforms of the amplifier circuit shown in FIG. 28.

An operation of amplifier circuit 501 will be described below. FIG. 29 shows signal waveforms of amplifier circuit 501 and illustrates control signal S18a to S18d and S118a to S118d supplied to switching elements 18a to 18d and 118a to 118d, respectively, and control signal S68b and S168b supplied to variable resistors 68b and 168b, respectively. In FIG. 29, items identical to those of the signal waveforms of amplifier circuit 500 shown in FIG. 27 are denoted by the same reference numerals. In FIG. 29, the horizontal axis represents time, and the vertical axis represents levels of control signal S18a to S18d, S118a to S118d, and S168b. The levels of control signal S18a to S18d and S118a to S118d consist of a level "ON" to turn on respective switching elements 18a to 18d and 118a to 118d and a level "OFF" to turn off respective switching elements 18a to 18d and 118a to 118d. The levels of control signal S68b and S168b consist of a level "HR" to set the resistance values of variable resistor 68b and 168b to the high resistance values and a level "LR" to set the resistance values of variable resistors 68b and 168b to the low resistance values.

Variable resistors 68b and 168b have the low resistance values at the same timing at which switching elements 68a and 168a of amplifier circuit 500 shown in FIG. 26 are turned on. Variable resistors 68b and 168b have the high resistance values at the same timing at which switching elements 68a and 168a are turned off. That is, in duration P1 in which the difference between sensing signals S11a and S11am out of the difference between sensing signals S11a and S11am and the deference between sensing signals S11b and S11bm is selectively amplified, variable resistors 68b and 168b have the high resistance values. Similarly, in duration P2 in which the difference between sensing signals S11b and S11bm out of the difference between sensing signals S11a and S11am and the deference between sensing signals S11b and S11bm is selectively amplified, variable resistors 68b and 168b have the high resistance values. An operation of amplifier circuit 501 will be detailed below.

Amplifier 401 amplifies the difference between sensing signals S11a and S11am from sensing parts 11a and 11am in duration P1, and amplifies the difference between sensing signals S11b and S11bm from sensing parts 11b and 11bm in duration P2.

In duration P1, switching elements 18a, 18b, 118a, and 118b continue being turned on, switching elements 18c, 18d, 118c, and 118d continue being turned off, and the resistance values of variable resistors 68b and 168b are the high resistance values. In this state, sensing signal S11a output from sensing part 11a out of sensing parts 11a and 11b is selectively input to input port 401a of amplifier 401, sensing signal S11am output from sensing part 11am out of sensing parts 11am and 11bm is selectively input to input port 401b of amplifier 401, and amplifier 401 amplifies the difference between sensing signals S11a and S11am. At this moment, sensing signals S11b and S11bm from sensing parts 11b and 11bm are not input to input ports 401a and 401b of amplifier 401.

In order to switch from the state in which the difference between sensing signals S11a and S11am from sensing parts 11a and 11am is amplified in duration P1 to the state in which the difference between sensing signals S11b and S11bm from sensing parts 11b and 11bm is amplified in duration P2, the resistance values of variable resistors 68b and 168b are first switched from the high resistance values to the low resistance values at time point t1 at which duration P1 ends. Subsequently to that, at time point t2, switching elements 18a, 18b, 118a, and 118b which have been turned on are turned off. This operation connects sensing parts 11a and 11am to reference potential Vref and terminates the input of sensing signals S11a and S11am from sensing parts 11a and 11am to input ports 401a and 401b of amplifier 401, and stops the amplifying of the difference between sensing signals S11a and S11am. Subsequently to that, at time point t3, switching elements 18c, 18d, 118c, and 118d which have been turned off are turned on. Subsequently to that, at time point t4, the resistance values of variable resistors 68b and 168b are switched from the low resistance values to the high resistance values. This operation allows in duration P2, sensing signals S11b and S11bm from sensing parts 11b and 11bm are selectively input to input ports 401a and 401b of amplifier 401, respectively, and allows the difference between sensing signals S11b and S11bm to be amplified. In other words, in duration Pt1 from time point t1 to time point t4, amplifier circuit 501 is switched from the state of amplifying the difference between sensing signals S11a and S11am from sensing parts 11a and 11am to the state of amplifying the difference between sensing signals S11b and S11bm from sensing parts 11b and 11bm. As described above, sensing signals S11a, S11b, S11am, and S11bm can be switched while switching elements 18a to 18d are disposed in feedback loop 17f of amplifier circuit 500 and switching elements 118a to 118d are disposed in feedback loop 117f.

In duration Pt1 in which switching elements 68a and 168a shown in FIGS. 26 and 27 are turned on, variable resistors 68b and 168b shown in FIGS. 28 and 29 have the low resistance values. The configuration in which switching elements 18a to 18d are disposed in feedback loop 17f and switching elements 118a to 118d are disposed in feedback loop 117f can reduce the phase shift of a current associated with the fluctuation of the ON-resistance values of switching elements 18a to 18d and 118a to 118d, hence stabilizing output characteristics of amplifier circuit 501. Further, since variable resistors 68b and 168b can have the low resistance values in amplifier circuit 501, sensing signals S11a, S11b, S11am, and S11bm can be switched without opening feedback loops 17f and 117f in duration Pt1, similarly to switching elements 68a and 168a shown in FIG. 26. Upon opening, feedback loops 17f and 117f may change the output rapidly, and prevent the inertial force from being detected accurately until the change becomes small. Amplifier circuit 501 can thus shorten the duration in which output accuracy is reduced.

Since variable resistors 68b and 168b electrically disconnect between node 19a and 19b and between nodes 119a and 119b instead of switching elements 68a and 168a shown in FIG. 26, the high resistance values of variable resistors 68b and 168b are not smaller than the resistance values of switching elements 68a and 168a which are turned off. On the other hand, the low resistance values of variable resistors 68b and 168b are just smaller than the resistance value $R_f$ of feedback resistors 17a and 117a of feedback circuit units 17 and 117 to prevent feedback loops 17f and 117f from opening similarly to switching elements 68a and 168a shown in FIG. 26; therefore, the low resistance values may not necessarily be as low as a conductive state.

Variable resistors 68b and 168b can be disposed in smaller areas than switching elements 68a and 168a shown in FIG. 26, providing amplifier circuit 501 with a small size.

Exemplary Embodiment 4

Figure 30:
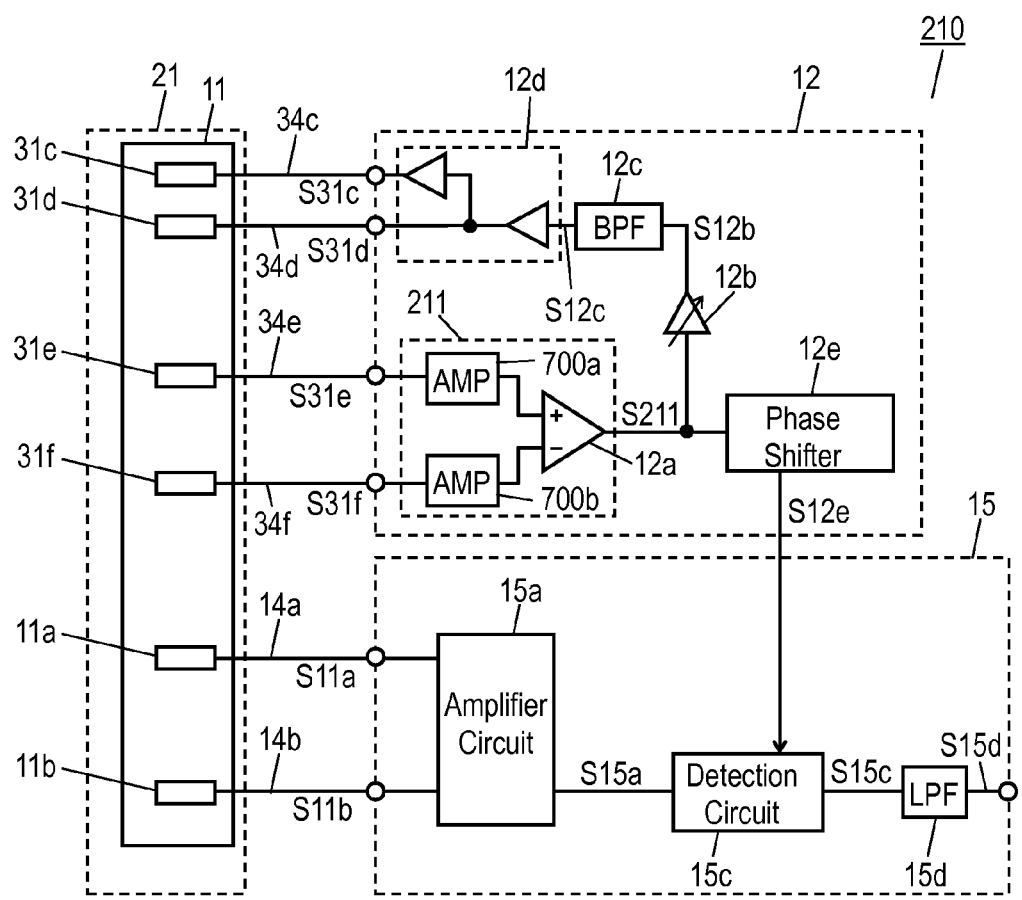
FIG. 30 is a schematic view of an inertia sensor in accordance with Exemplary Embodiment 4 of the present disclosure.

FIG. 30 is a schematic diagram of inertia sensor 210 in accordance with Exemplary Embodiment 4 of the present disclosure. In FIG. 30, components identical to those of inertia sensor 10 in accordance with Embodiment 1 shown in FIG. 1 are denoted by the same reference numerals. Drive circuit 12 of inertia sensor 210 includes monitor-signal amplifier 211, instead of monitor-signal amplifier 12f of inertia sensor 10 shown in FIG. 1, to amplify monitor signals S31e and S31f input from respective monitor parts 31e and 31f via signal wirings 34e and 34f and to output a monitor signal S211. Monitor-signal amplifier 211 includes differential amplifier 12a shown in FIG. 1 and further includes monitor-signal amplifier circuits 700a and 700b which amplify monitor signals S31e and S31f, respectively.

Figure 31:
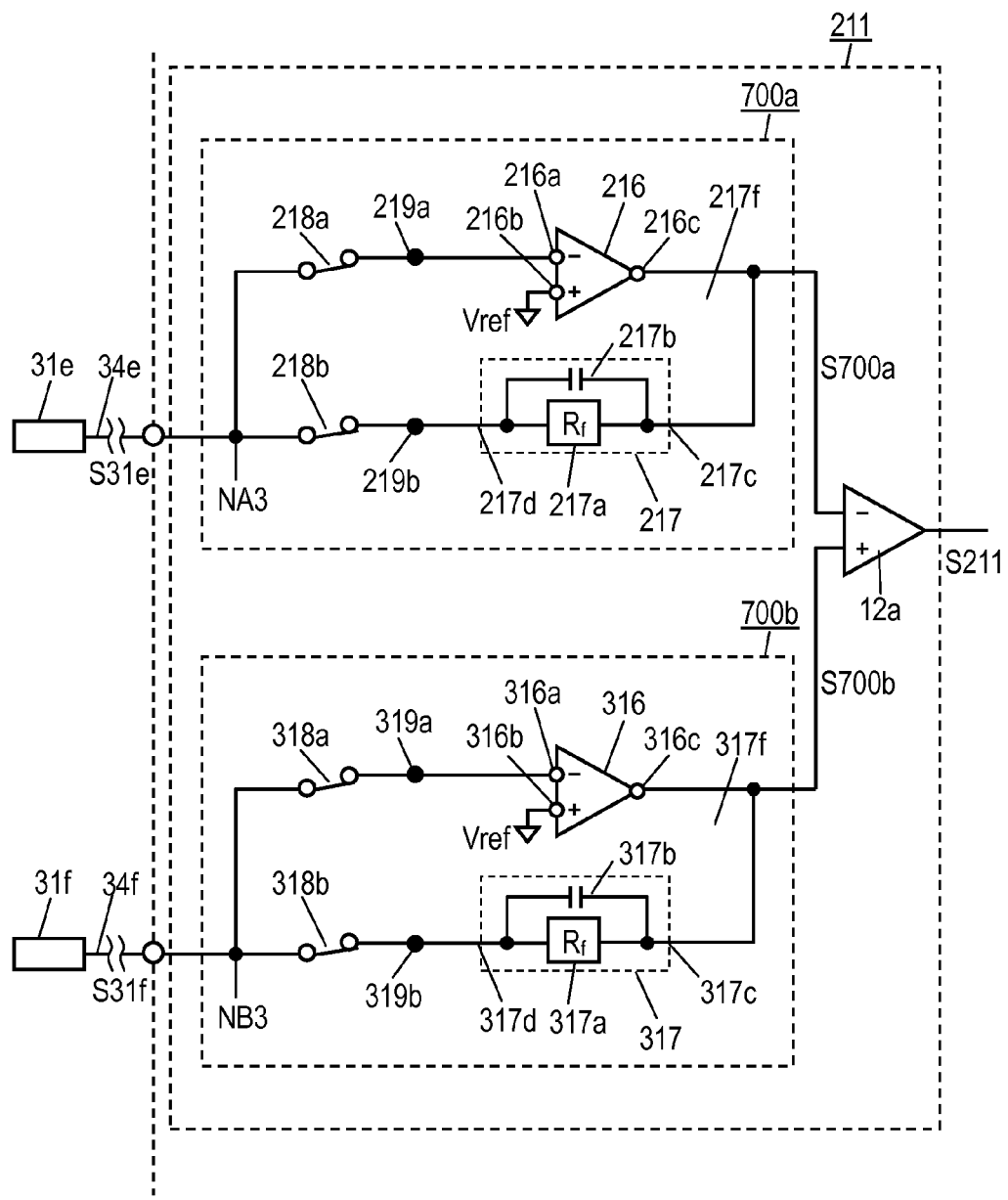
FIG. 31 is a circuit block diagram of a monitor-signal amplifier of the inertia sensor in accordance with Embodiment 4.

FIG. 31 is a circuit block diagram of monitor-signal amplifier 211 and illustrates a detail of monitor-signal amplifier circuits 700a and 700b.

Monitor-signal amplifier circuit 700a includes amplifier 216 which amplifies monitor signal S31e output from monitor part 31e, feedback circuit unit 217 connected in parallel to amplifier 216, switching element 218a provided between monitor part 31e and amplifier 216, and switching element 218b provided between monitor part 31e and feedback circuit unit 217. Switching elements 218a and 218b are always turned on. Feedback circuit unit 217 is connected between input port 216a of amplifier 216 and output port 216c via switching elements 218a and 218b, thereby constituting feedback loop 217f.

Amplifier 216 has input port 216a which is an inverting input terminal, input port 216b which is a non-inverting input terminal, and output port 216c. Amplifier 216 amplifies monitor signal S31e, and outputs the amplified signal as a monitor signal S700a from output port 216c. Input port 216a is connected to monitor part 31e via switching element 218a and is connected to switching element 218a at node 219a. Input port 216b is connected to a reference potential Vref.

Feedback circuit unit 217 is connected to monitor part 31e via switching element 218b. Feedback circuit unit 217 has end 217c connected to output port 216c of amplifier 216 and has end 217d connected to switching element 218b at node 219b.

Feedback circuit unit 217 includes feedback resistor 217a connected between end 217c and end 217d and feedback capacitor 217b connected in parallel to feedback resistor 217a. End 217c of feedback circuit unit 217 is connected to output port 216c of amplifier 216. End 217d of feedback circuit unit 217 is connected to input port 216a of amplifier 216 via switching elements 218a and 218b. Feedback circuit unit 217 is thus connected in parallel to amplifier 216.

Monitor part 31e is connected to switching elements 218a and 218b at node NA3. That is, switching element 218a is connected between nodes 219a and NA3, and switching element 218b is connected between nodes 219b and NA3.

Monitor-signal amplifier circuit 700b includes amplifier 316 which amplifies monitor signal S31f output from monitor part 31f, feedback circuit unit 317 connected in parallel to amplifier 316, switching element 318a provided between monitor part 31f and amplifier 316, and switching element 318b provided between monitor part 31f and feedback circuit unit 317. Switching elements 318a and 318b are always turned on. Feedback circuit unit 317 is connected between input port 316a of amplifier 316 and output port 316c via switching elements 318a and 318b, thereby constituting feedback loop 317f.

Amplifier 316 has input port 316a which is an inverting input terminal, input port 316b which is a non-inverting input terminal, and output port 316c. Amplifier 316 amplifies monitor signal S31f and outputs the amplified signal as a monitor signal S700b from output port 316c. Input port 316a is connected to monitor part 31f via switching element 318a and is connected to switching element 318a at node 319a. Input port 316b is connected to reference potential Vref.

Feedback circuit unit 317 is connected to monitor part 31f via switching element 318b. Feedback circuit unit 317 has end 317c connected to output port 316c of amplifier 316, and end 317d connected to switching element 318a at node 319b.

Feedback circuit unit 317 includes feedback resistor 317a connected between end 317c and end 317d and feedback capacitor 317b connected in parallel to feedback resistor 317a. End 317c of feedback circuit unit 317 is connected to output port 316c of amplifier 316. End 317d of feedback circuit unit 317 is connected to input port 316a of amplifier 316 via switching elements 318a and 318b. Feedback circuit unit 317 is thus connected in parallel to amplifier 316.

Monitor part 31f is connected to switching elements 318a and 318b at node NB3. That is, switching element 318a is connected between nodes 319a and NB3, and switching element 318b is connected to nodes 319b and NB3.

Differential amplifier 12a amplifies the difference between the monitor signals S700a and S700b input from respective monitor-signal amplifier circuits 700a and 700b, thereby outputting monitor signal S211. In accordance with Embodiment 4, monitor signal S700a is input to the inverting input terminal of differential amplifier 12a, and monitor signal S700b is input to the non-inverting input terminal of differential amplifier 12a. The monitor signals S700a and S700b have phases opposite to each other. By obtaining the difference between the signals, the phase shifts are averaged, and monitor signal S211 having large amplitude is obtained. AGC amplifier 12b amplifies monitor signal S211 to output monitor signal S12b. Phase shifter 12e shifts the phase of monitor signal S211 by 90 degrees and outputs the signal with the shifted phase to detection circuit 15 as monitor signal S12e. Detection circuit 15c detects sensing signal S15a from amplifier circuit 15a synchronously to monitor signal S12e. Specifically, detection circuit 15c synchronously detects sensing signal S15a from amplifier circuit 15a by using monitor signal S211, thereby outputting detection signal S15c.

Sensing signal S15a output from amplifier circuit 15a may have a slight phase shift due to switching elements 18a to 18d. Amplifiers 216 and 316, feedback circuit units 217 and 317, and switching elements 218a, 218b, 318a, and 318b of monitor-signal amplifier 211 have the same characteristics as amplifier 16, feedback circuit unit 17, and switching elements 18a to 18d of amplifier circuit 15a, respectively. In other words, monitor-signal amplifier circuits 700a and 700b are substantially the same circuit as amplifier circuit 15a. Therefore, the same amounts of phase shifts as phase shifts generated in sensing signal S15a due to switching elements 18a to 18d are generated in the monitor signals S211 and S12e. Detection circuit 15c detects sensing signal S15a synchronously with monitor signal S12e having the same amount of phase shift as sensing signal S15a, hence reducing generation of noise in the detection signal S15c output from detection circuit 15c caused by the phase shifts in sensing signal S15a and monitor signal S12e.

Figure 32:
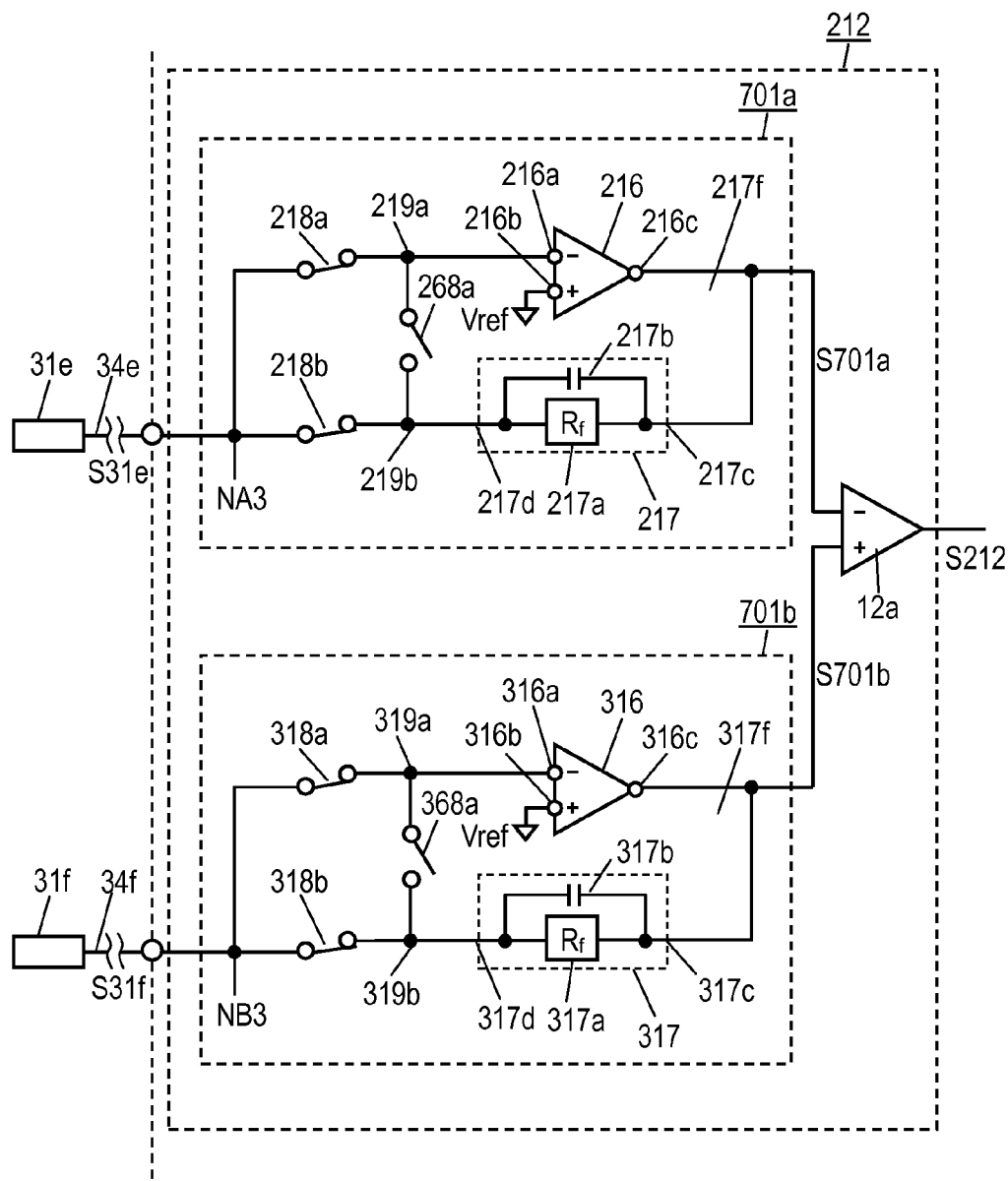
FIG. 32 is a circuit block diagram of another monitor-signal amplifier of the inertia sensor in accordance with Embodiment 4.

FIG. 32 is a circuit block diagram of another monitor-signal amplifier 212 in accordance with Embodiment 4. In FIG. 32, components identical to those of monitor-signal amplifier 211 shown in FIG. 31 are denoted by the same reference numerals. Monitor-signal amplifier 212 includes monitor-signal amplifier circuits 701a and 701b instead of monitor-signal amplifier circuits 700a and 700b of monitor-signal amplifier 211 shown in FIG. 31.

Monitor-signal amplifier circuit 701a further includes switching element 268a connected between nodes 219a and 219b of monitor-signal amplifier circuit 700a shown in FIG. 31. Monitor-signal amplifier circuit 701b further includes switching element 368a connected between nodes 319a and 319b of monitor-signal amplifier circuit 700b shown in FIG. 31. Switching elements 268a and 368a are always turned off. Amplifiers 216 and 316 of monitor-signal amplifier circuits 701a and 701b output the monitor signals S701a and S701b, respectively.

Differential amplifier 12a amplifies the difference between the monitor signals S701a and S701b input from respective monitor-signal amplifier circuits 701a and 701b, thereby outputting monitor signal S212. In the case that amplifier circuit 15a of inertia sensor 210 shown in FIG. 30 is amplifier circuit 60 including switching element 68a in accordance with Embodiment 1 shown in FIG. 4, monitor-signal amplifier 212 shown in FIG. 32 is provided, instead of monitor-signal amplifier 211 shown in FIG. 31, in inertia sensor 210 shown in FIG. 30. Switching elements 268a and 368a of monitor-signal amplifier 212 shown in FIG. 32 have the same characteristics as switching element 68a of amplifier circuit 60 shown in FIG. 4. In other words, monitor-signal amplifier circuits 701a and 701b are substantially the same circuit as amplifier circuit 60. Therefore, the same amount of phase shifts as the phase shift generated in sensing signal S15a due to switching elements 18a to 18d and 68a are generated in monitor signals S211 and S12e. Detection circuit 15c detects sensing signal S15a synchronously with monitor signal S12e having the same amount of phase shift as sensing signal S15a, and can reduce the generation of noise, in detection signal S15c output from detection circuit 15c caused by the phase shifts in sensing signal S15a and monitor signal S12e.

Figure 33:
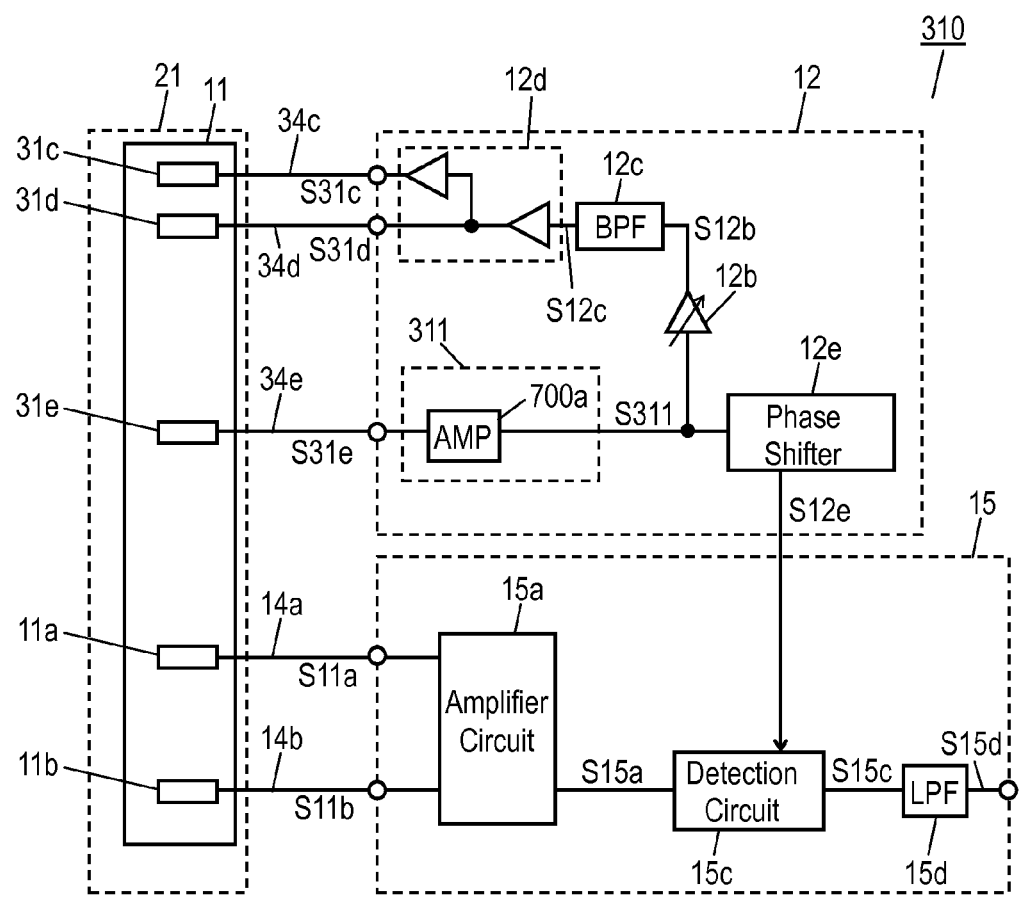
FIG. 33 is a configuration diagram of another inertia sensor in accordance with Embodiment 4.

FIG. 33 is a schematic diagram of another inertia sensor 310 in accordance with Embodiment 4. In FIG. 33, components identical to those of inertia sensor 210 shown in FIG. 30 are denoted by the same reference numerals. Drive circuit 12 of inertia sensor 210 further includes monitor-signal amplifier 311 which amplifies monitor signal S31e input from monitor part 31e via signal wiring 34e and outputs a monitor signal S311, instead of monitor-signal amplifier 211 of inertia sensor 310 shown in FIG. 30. Monitor-signal amplifier 311 includes monitor-signal amplifier circuit 700a which amplifies monitor signal S31e, but does not include differential amplifier 12a or monitor-signal amplifier circuit 700b. Inertia sensor 210 shown in FIG. 30 generates drive signals S31c and 31d and monitor signal S12e based on the difference between monitor signals S31e and S31f output from monitor parts 31e and 31f. Inertia sensor 310 shown in FIG. 33 generates drive signals S31c and S31d and monitor signal S12e based on monitor signal S31e from monitor part 31e, without using monitor signal S31f from monitor part 31f.

Figure 34:
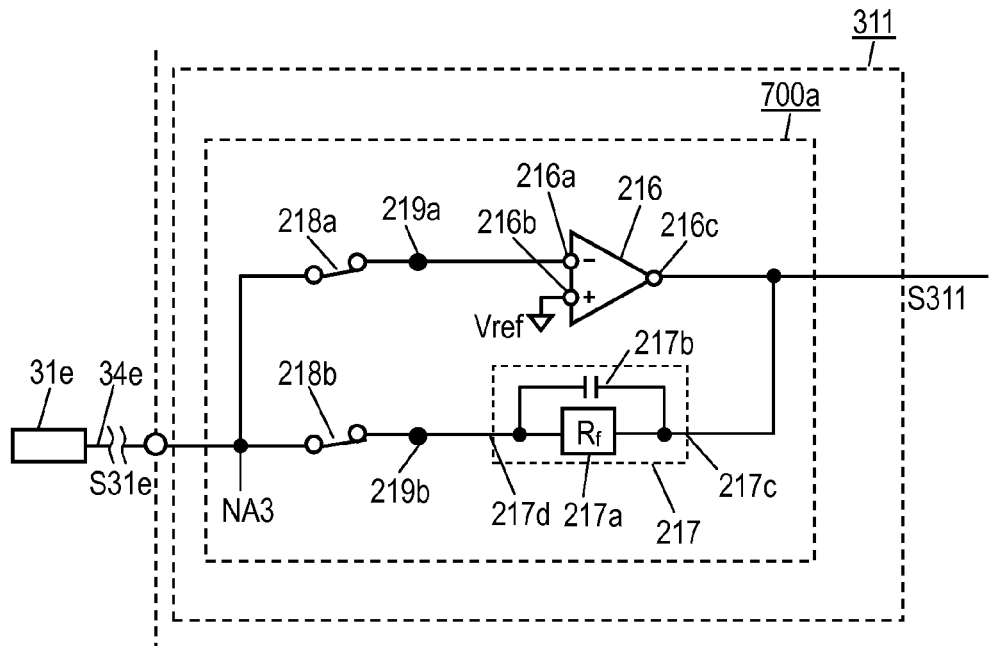
FIG. 34 is a circuit block diagram of a monitor-signal amplifier of the inertia sensor shown in FIG. 33.

FIG. 34 is a circuit block diagram of monitor-signal amplifier 311. In FIG. 34, components identical to those of monitor-signal amplifier 211 shown in FIG. 31 are denoted by the same reference numerals. Amplifier 216 of monitor-signal amplifier circuit 700a outputs monitor signal S311 from output port 216c. AGC amplifier 12b amplifies monitor signal S211 to output monitor signal S12b. Phase shifter 12e shifts the phase of monitor signal S211 by 90 degrees and outputs the signal with the shifted phase to detection circuit 15 as monitor signal S12e.

Inertia sensor 310 can reduce the generation of noise in the detection signal S15c output from detection circuit 15c, similarly to inertia sensor 210 shown in FIG. 30.

Figure 35:
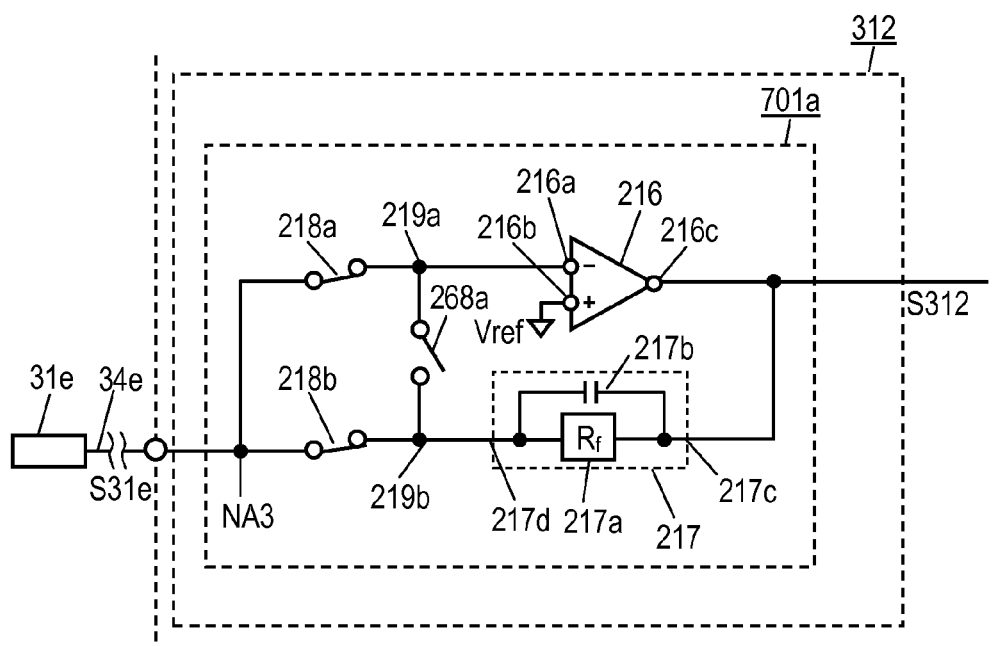
FIG. 35 is a circuit block diagram of another monitor-signal amplifier of the inertia sensor shown in FIG. 33.

FIG. 35 is a circuit block diagram of another monitor-signal amplifier 312 of inertia sensor 310. In FIG. 35, components identical to those of monitor-signal amplifier 311 shown in FIG. 34 and monitor-signal amplifier 212 shown in FIG. 32 are denoted by the same reference numerals. Monitor-signal amplifier 312 includes monitor-signal amplifier circuit 701a of monitor-signal amplifier 212 shown in FIG. 32, instead of monitor-signal amplifier 311 shown in FIG. 34. In the case that amplifier circuit 15a of inertia sensor 310 shown in FIG. 33 is the amplifier circuit 60 including switching element 68a in accordance with Embodiment 1 shown in FIG. 4, monitor-signal amplifier 312 is connected to monitor part 31e. Amplifier 216 of monitor-signal amplifier circuit 701a outputs monitor signal S312 from output port 216c. AGC amplifier 12b amplifies monitor signal S312 to output monitor signal S12b. Phase shifter 12e shifts the phase of monitor signal S312 by 90 degrees and outputs the signal with the shifted phase to detection circuit 15 as monitor signal S12e.

Inertia sensor 310 including amplifier circuit 60 and monitor-signal amplifier 312 can reduce the generation of noise in detection signal S15c output from detection circuit 15c, similarly to inertia sensor 210 shown in FIG. 30.

INDUSTRIAL APPLICABILITY

An inertia sensor according to the present disclosure can improve an S/N ratio and is therefore useful for automobiles, aircrafts, ships, robots, and other various kinds of electronic equipment.

REFERENCE MARKS IN THE DRAWINGS

11 Vibrator
11a Sensing part (first sensing part)
11b Sensing part (second sensing part)
11c Sensing part (third sensing part)
12 Drive circuit
15 Detection circuit
15a, 60, 61, 70, 71, 100, 200, 300, 301, 400, 500, 501 amplifier circuit
15c detection circuit
16 amplifier (first amplifier)
16a input port
16c output port
17 first feedback circuit unit
17a feedback resistor
17b feedback capacitor
17c end (first end)
17d end (first end)
18a switching element (first switching element)

18b switching element (second switching element)
18c switching element (third switching element)
18d switching element (fourth switching element)
18e switching element (fifth switching element)
18f switching element (sixth switching element)
19a node (first node)
19b node (second node)
21 sensor element
31e monitor part
31f monitor part
68a switching element (fifth switching element, seventh switching element)
68b variable resistor
216 amplifier (second amplifier)
216a input port
216c output port
217 feedback circuit unit (second feedback circuit unit)
217c end (first end)
217d end (second end)
218a switching element (fifth switching element)
218b switching element (sixth switching element)
219a node (third node)
219b node (fourth node)
268a switching element (eighth switching element)
401 amplifier (first amplifier)
S11a sensing signal (first sensing signal)
S11b sensing signal (second sensing signal)
S11c sensing signal (third sensing signal)

The invention claimed is:

1. An inertia sensor comprising:
   a sensor element including
      a first sensing part configured to output a first sensing signal corresponding to an inertial force, and
      a second sensing part configured to output a second sensing signal corresponding to the inertial force;
   a first amplifier having an output port and an input port to which the first sensing signal or the second sensing signal is selectively input;
   a first feedback circuit unit configured to be connected between the input port and the output port of the first amplifier to be connected in parallel to the first amplifier;
   a first switching element provided between the first sensing part and the input port of the first amplifier;
   a second switching element provided between the first sensing part and the first feedback circuit unit;
   a third switching element provided between the second sensing part and the input port of the first amplifier; and
   a fourth switching element provided between the second sensing part and the first feedback circuit unit.

2. The inertia sensor of claim 1, further comprising
   a fifth switching element connected between the first amplifier and the first feedback circuit unit,
   wherein the first switching element and the third switching element are connected at a first node to the input port of the first amplifier,
   wherein the first feedback circuit unit includes:
      a first end connected to the output port of the first amplifier; and
      a second end connected at a second node to the second switching element and the fourth switching element, and
   wherein the fifth switching element is connected between the first node and the second node.

3. The inertia sensor of claim 2,
   wherein the first sensing signal out of the first sensing signal and the second sensing signal is selectively input to the input port of the first amplifier while the first switching element and the second switching element are turned on and the third switching element, the fourth switching element, and the fifth switching element are turned off, and
   wherein a state in which the first sensing signal out of the first sensing signal and the second sensing signal is selectively input to the input port of the first amplifier is switched to a state in which the second sensing signal is selectively input to the input port of the first amplifier by (i) turning on the fifth switching element which has been turned off, then, (ii) turning off the first switching element and the second switching element which have been turned on and turning on the third switching element and the fourth switching element which have been turned off, and then, (iii) turning off the fifth switching element which has been turned on.

4. The inertia sensor of claim 3, wherein a state in which the first sensing signal out of the first sensing signal and the second sensing signal is selectively input to the input port of the first amplifier is switched to a state in which the second sensing signal is selectively input to the input port of the first amplifier by (i) turning on the fifth switching element which has been turned off, then, (ii) turning on the third switching element and the fourth switching element which have been turned off, then (iii) turning off the first switching element and the second switching element which have been turned on, and then (iv) turning off the fifth switching element which has been turned on.

5. The inertia sensor of claim 1, further comprising
   a variable resistor connected between the first amplifier and the first feedback circuit unit,
   wherein the first switching element and the third switching element are connected at a first node to the input port of the first amplifier,
   wherein the first feedback circuit unit includes:
      a first end connected to the output port of the first amplifier; and
      a second end connected at a second node to the fourth switching element and the second switching element, and
   wherein the variable resistor is connected between the first node and the second node.

6. The inertia sensor of claim 5,
   wherein the first sensing signal out of the first sensing signal and the second sensing signal is selectively input to the input port of the first amplifier by (i) turning on the first switching element and the second switching element, (ii) turning off the third switching element and the fourth switching element, and (iii) allowing a resistance value of the variable resistor to become a high resistance value, and
   wherein a state in which the first sensing signal out of the first sensing signal and the second sensing signal is selectively input to the input port of the first amplifier is switched to a state in which the second sensing signal is selectively input to the input port of the first amplifier by (i) switching the resistance value of the variable resistor from the high resistance value to a low resistance value lower than the high resistance value, then (ii) turning off the first switching element and the second switching element which have been turned on and turning off the third switching element and the fourth switching element which have been turned off, and then (switching the resistance value of the variable resistor from the low resistance value to the high resistance value.

7. The inertia sensor of claim 6, wherein a state in which the first sensing signal out of the first sensing signal and the second sensing signal is selectively input to the input port of the first amplifier is switched to a state in which the second sensing signal is selectively input to the input port of the first amplifier by (i) switching the resistance value of the variable resistor from the high resistance value to the low resistance value, then (ii) turning on the third switching element and the fourth switching element which have been turned off, then (iii) turning off the first switching element and the second switching element which have been turned on, and then (iv) switching the resistance value of the variable resistor from the low resistance value to the high resistance value.

8. The inertia sensor of claim 1, further comprising:
a third sensing part configured to detect the inertial force and to output a third sensing signal;
a fifth switching element provided between the third sensing part and the input port of the first amplifier; and
a sixth switching element provided between the third sensing part and the first feedback circuit unit.

9. The inertia sensor of claim 8, further comprising
a seventh switching element connected between the first amplifier and the first feedback circuit unit,
wherein the first switching element, the third switching element, and the fifth switching element are connected at a first node to the input port of the first amplifier,
wherein the first feedback circuit unit includes:
a first end connected to the output port of the first amplifier; and
a second end connected at a second node to the second switching element, the fourth switching element, and the sixth switching element, and
wherein the seventh switching element is connected between the first node and the second node.

10. The inertia sensor of claim 9,
wherein the first sensing signal out of the first sensing signal, the second sensing signal, and the third sensing signal is selectively input to the input port of the first amplifier by turning on the first switching element and the second switching element, and by turning off the third switching element, the fourth switching element, the fifth switching element, the sixth switching element, and the seventh switching element, and
wherein a state in which the first sensing signal out of the first sensing signal, the second sensing signal, and the third sensing signal is selectively input to the input port of the first amplifier is switched to a state in which third sensing signal out of the first sensing signal, the second sensing signal, and the third sensing signal is selectively input to the input port of the first amplifier by (i) turning on the seventh switching element which has been turned off, then (ii) turning off the first switching element and the second switching element which have been turned on and turning on the fifth switching element and the sixth switching element which have been turned off, and then (iii) turning off the seventh switching element which has been turned on.

11. The inertia sensor of claim 10, wherein a state in which the first sensing signal out of the first sensing signal, the second sensing signal, and the third sensing signal is selectively input to the input port of the first amplifier is switched to a state in which third sensing signal out of the first sensing signal, the second sensing signal, and the third sensing signal is selectively input to the input port of the first amplifier by (i) turning on the seventh switching element which has been turned off, then (ii) turning off the first switching element and the second switching element which have been turned on, then (iii) turning on the fifth switching element and the sixth switching element which have been turned off, and then (iv) turning off the seventh switching element which has been turned on.

12. The inertia sensor of claim 1, further comprising:
a drive circuit configured to supply a drive signal to the sensor element; and
a detection circuit configured to output a detection signal corresponding to the inertial force from a signal output from the output port of the first amplifier,
wherein the sensor element further includes:
a vibrator configured to vibrate in response to the drive signal; and
a monitor part configured to output a monitor signal corresponding to a vibration of the vibrator,
wherein the first sensing part and the second sensing part are disposed on the vibrator, and are configured to output the first sensing signal and the first second sensing signal corresponding to the inertial force, respectively, when the vibrator vibrates,
wherein the drive circuit includes:
a second amplifier having an output port and an input port to which the monitor signal is input;
a second feedback circuit unit configured to be connected between the input port and the output port of the second amplifier to be connected in parallel to the second amplifier;
a fifth switching element provided between the monitor part and the input port of the second amplifier, the fifth switching element being turned on; and
a sixth switching element provided between the monitor part and the second feedback circuit unit, the sixth switching element being turned on, and
wherein the detection circuit outputs the detection signal by detecting the signal output from the output port of the first amplifier with using a signal output from the second amplifier.

13. The inertia sensor of claim 12, further comprising
a seventh switching element connected between the first amplifier and the first feedback circuit unit,
wherein the first switching element and the third switching element are connected at a first node to the input port of the first amplifier,
wherein the first feedback circuit unit includes:
a first end connected to the output port of the first amplifier; and
a second end connected at a second node to the second switching element and the fourth switching element,
wherein the seventh switching element is connected between the first node and the second node,
wherein the drive circuit further includes an eighth switching element connected between the second amplifier and the second feedback circuit unit, the eighth switching element being turned off,
wherein the fifth switching element is connected at a third node to the input port of the second amplifier,
wherein the second feedback circuit unit has:
a first end connected to the output port of the second amplifier; and
a second end connected at a fourth node to the sixth switching element, and
wherein the eighth switching element is connected between the third node and the fourth node.

14. The inertia sensor of claim 1, wherein the first feedback circuit unit includes a feedback resistor and a feedback capacitor.

15. The inertia sensor of claim 1, wherein the inertial force is a Coriolis force.

16. The inertia sensor of claim 1, wherein the inertial force is an angular velocity.

17. The inertia sensor of claim 1, wherein the first amplifier is a fully-differential amplifier.

* * * * *